US012660264B2

(12) United States Patent
Tung et al.

(10) Patent No.: US 12,660,264 B2
(45) Date of Patent: Jun. 16, 2026

(54) SEMICONDUCTOR STRUCTURE WITH DIELECTRIC WALL STRUCTURE AND METHOD FOR MANUFACTURING THE SAME

(71) Applicant: Taiwan Semiconductor Manufacturing Company, Ltd., Hsinchu (TW)

(72) Inventors: Yu-Lung Tung, Kaohsiung City (TW); Xiaodong Wang, Hsinchu City (TW); Jhon-Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 434 days.

(21) Appl. No.: 18/303,698

(22) Filed: Apr. 20, 2023

(65) Prior Publication Data

US 2024/0355877 A1 Oct. 24, 2024

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 64/01* | (2025.01) |
| *H10D 84/01* | (2026.01) |

(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01);

*H10D 64/017* (2025.01); *H10D 84/0167* (2025.01); *H10D 84/017* (2025.01); *H10D 84/038* (2025.01); *H10D 84/853* (2025.01)

(58) Field of Classification Search
CPC ............. H10D 30/6735; H10D 84/853; H10D 62/121; H10D 30/014; H10D 30/43; H10D 30/6757; H10D 64/017; H10D 84/0167; H10D 84/017; H10D 84/038; H10D 84/83; H10D 84/85
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |

(Continued)

*Primary Examiner* — Moazzam Hossain
(74) *Attorney, Agent, or Firm* — Cooper Legal Group, LLC

(57) ABSTRACT

Semiconductor structures and methods for manufacturing the same are provided. The semiconductor structure includes a first well region and longitudinally oriented along a first direction and a second well region adjoining the first well region in a second direction. The semiconductor structure also includes a dielectric wall structure formed over a boundary between the first well region and the second well region and first channel structures vertically suspended over a first region of the first well region and laterally attached to a first sidewall surface of the dielectric wall structure. The semiconductor structure includes a first gate structure wrapping around the first channel structures and second channel structures vertically suspended over a second region of the first well region and a second gate structure wrapping around the second channel structures. In addition, the first channel structures is smaller than the second channel structures.

20 Claims, 77 Drawing Sheets

(51) Int. Cl.
    *H10D 84/03*          (2025.01)
    *H10D 84/85*          (2025.01)

(56)                    References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2020/0105612 | A1* | 4/2020 | Lin .................. H10W 10/0145 |
| 2021/0343600 | A1* | 11/2021 | Chen ................... H10D 64/017 |

* cited by examiner

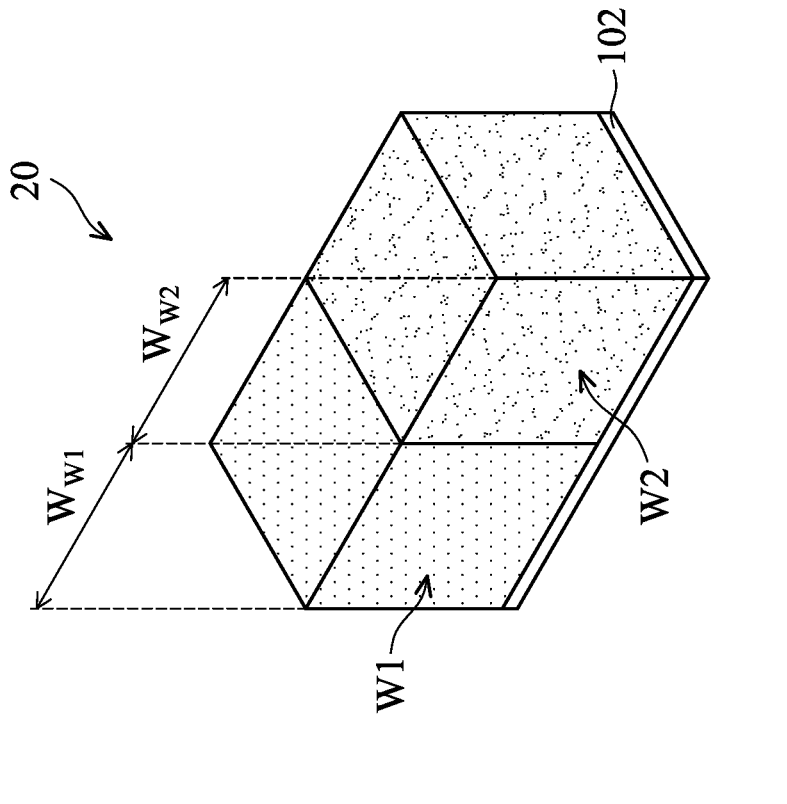
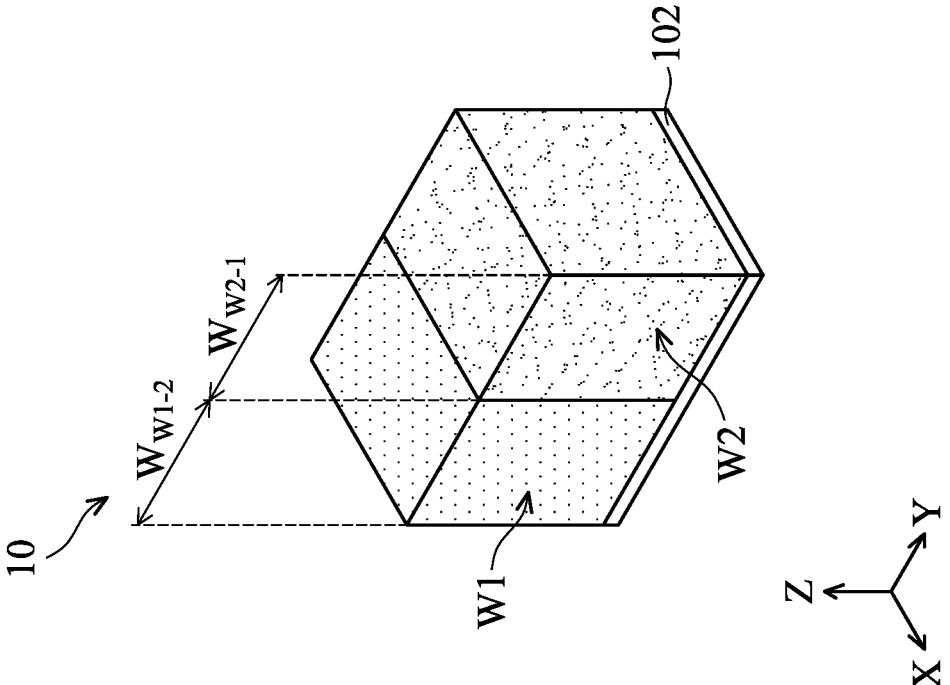
FIG. 1A-2

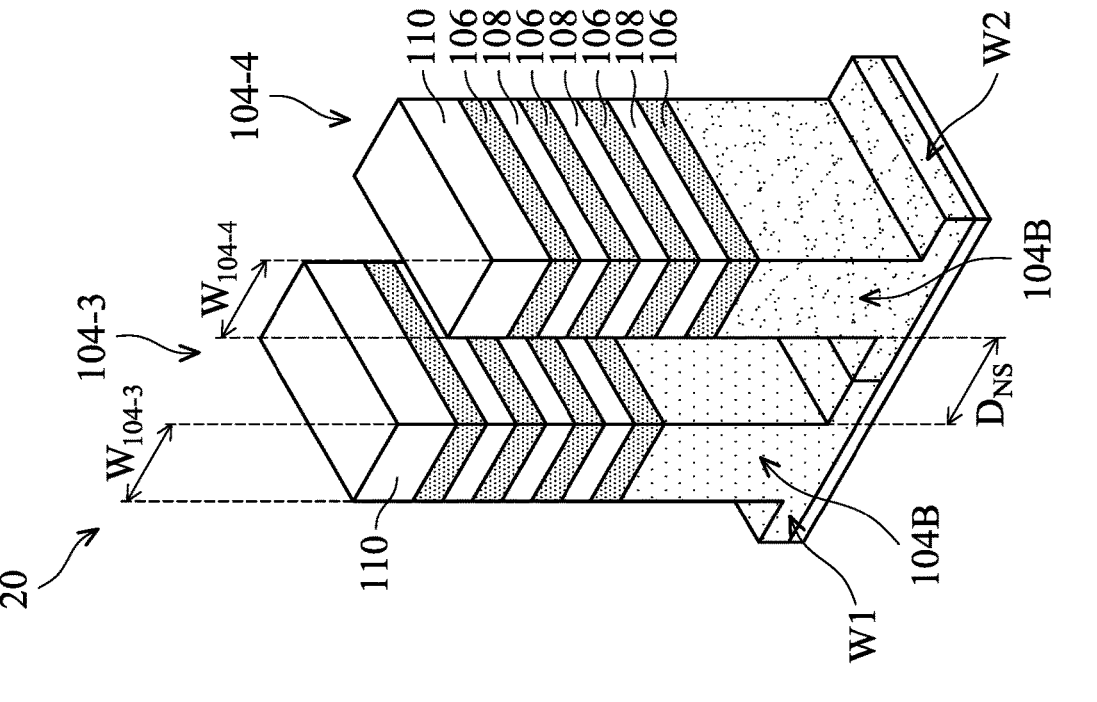
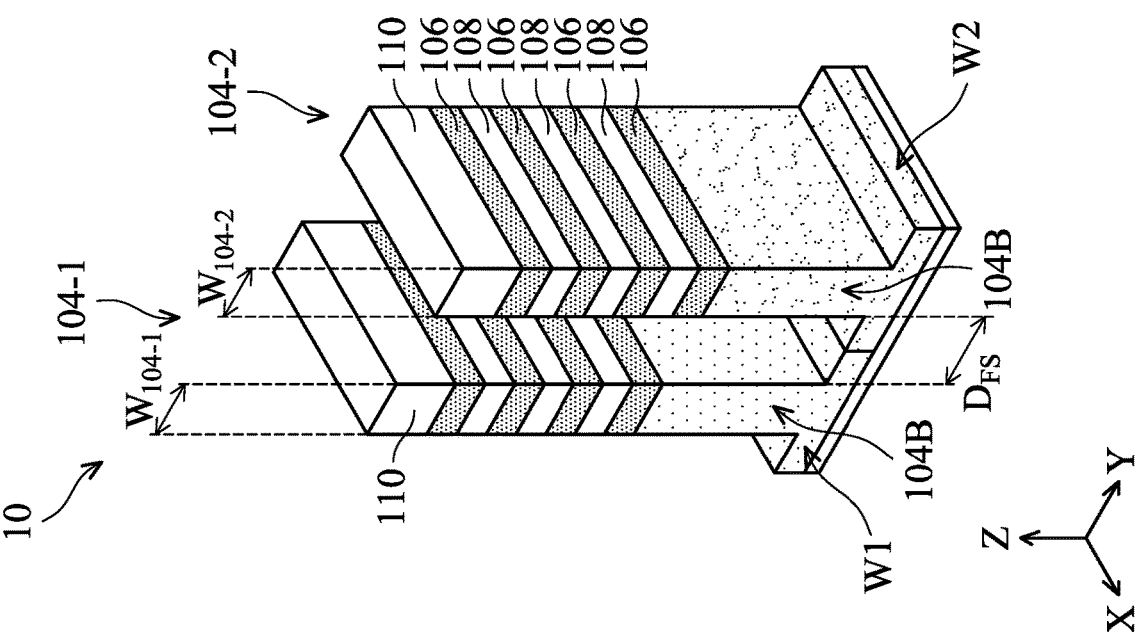
FIG. 1C-2

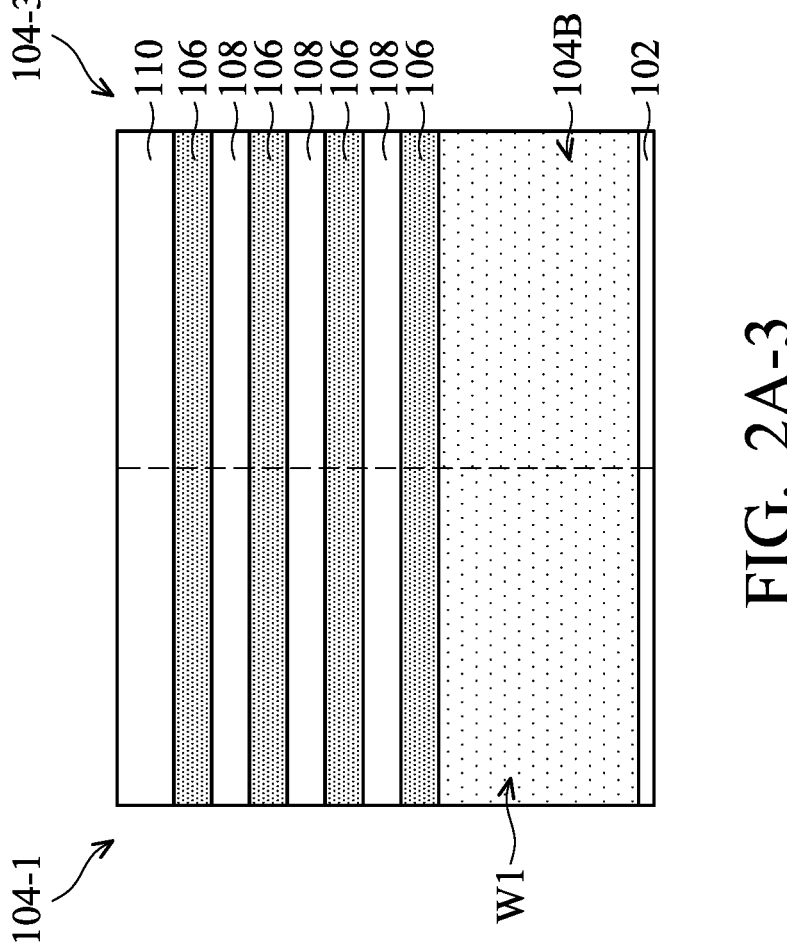
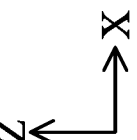
FIG. 2A-3

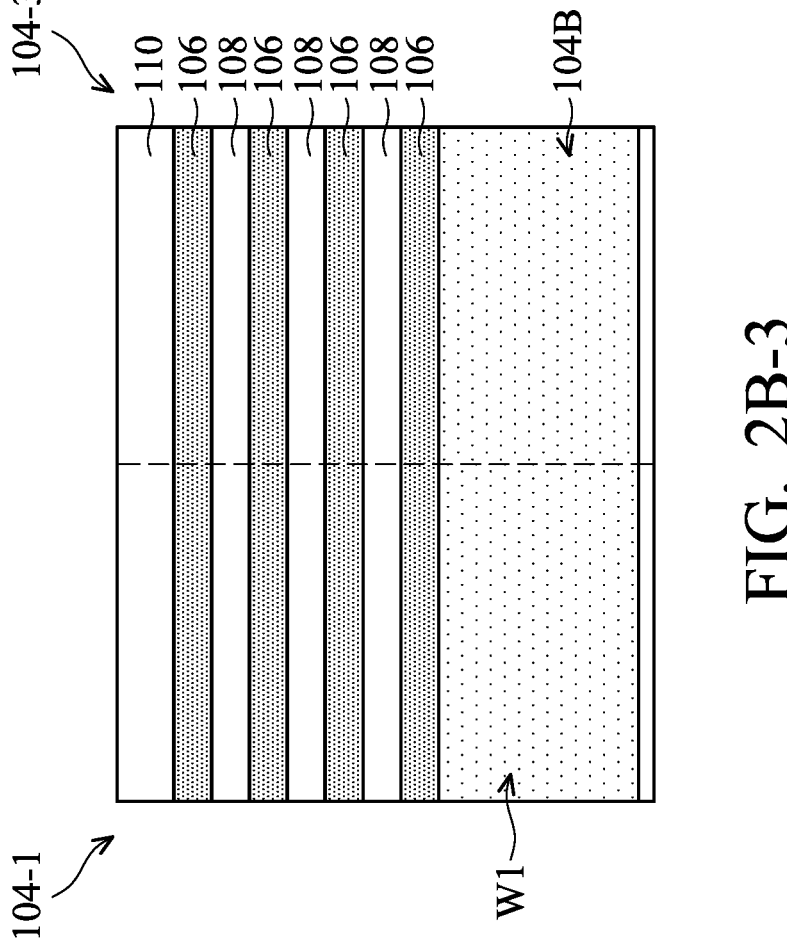
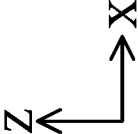
FIG. 2B-3

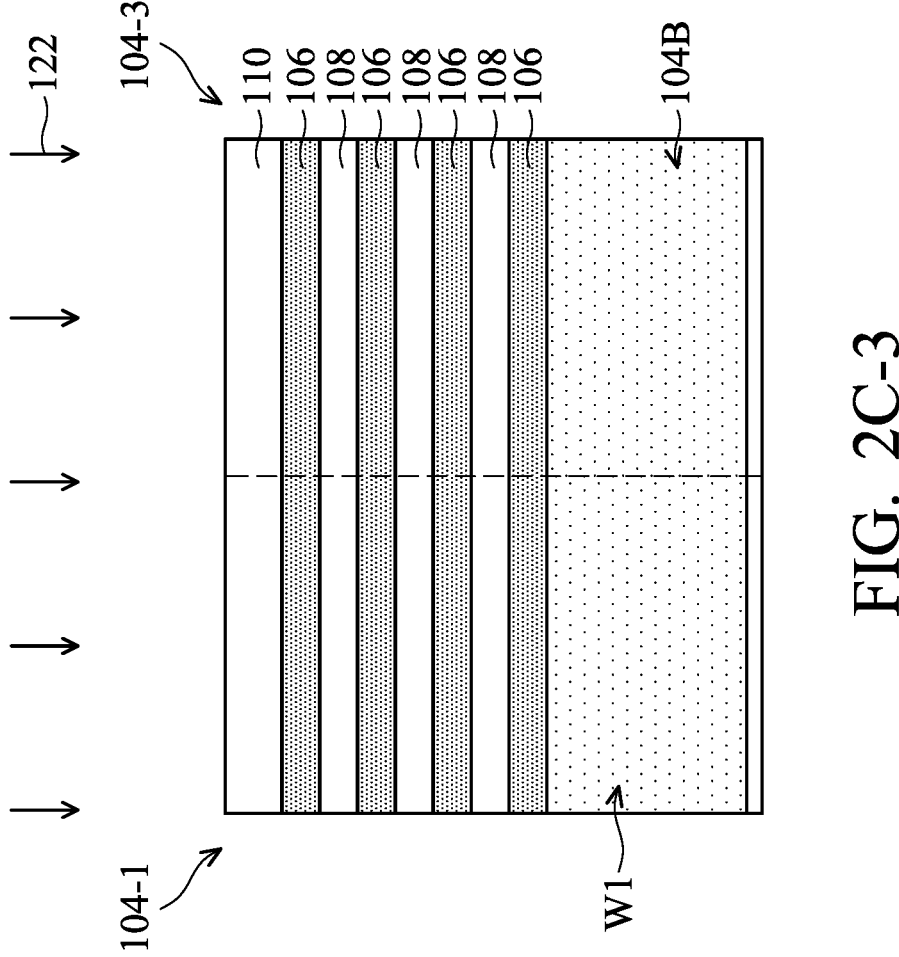
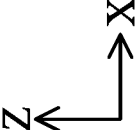
FIG. 2C-3

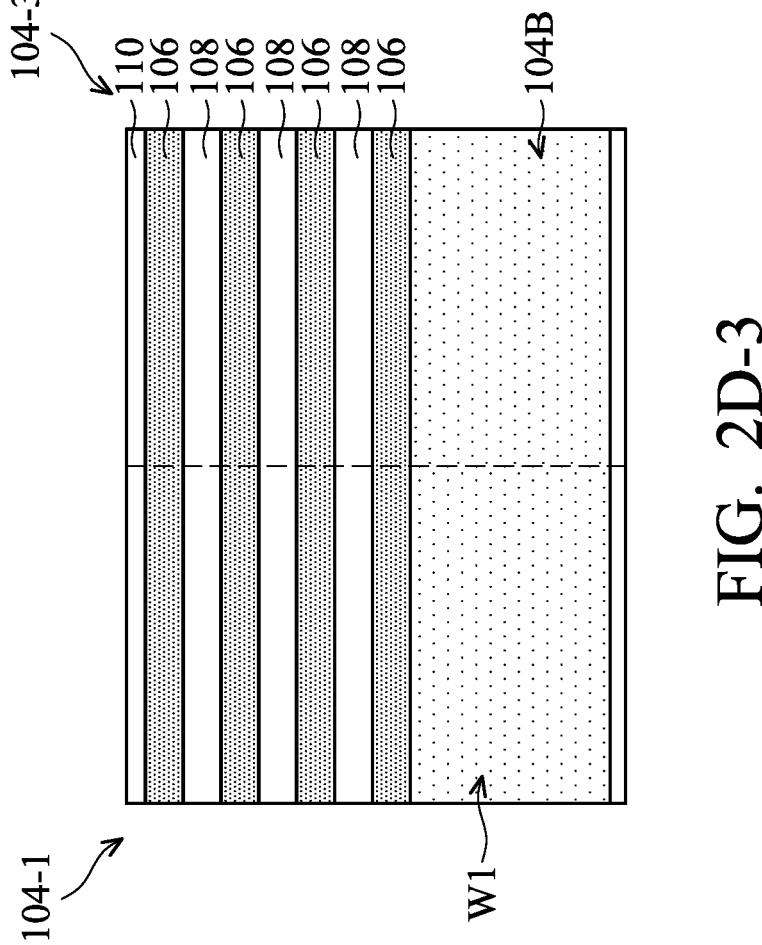
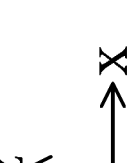
FIG. 2D-3

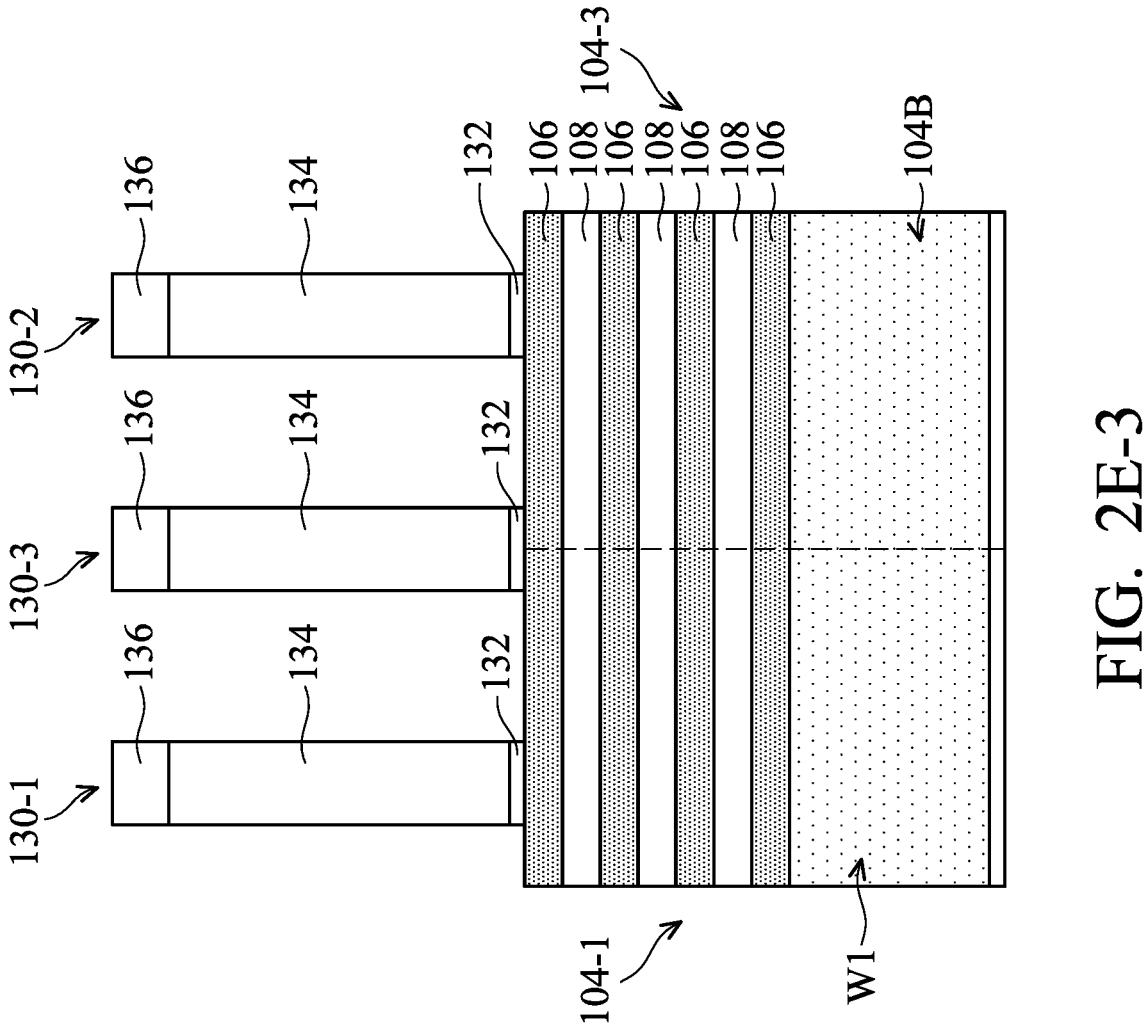
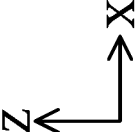
FIG. 2E-3

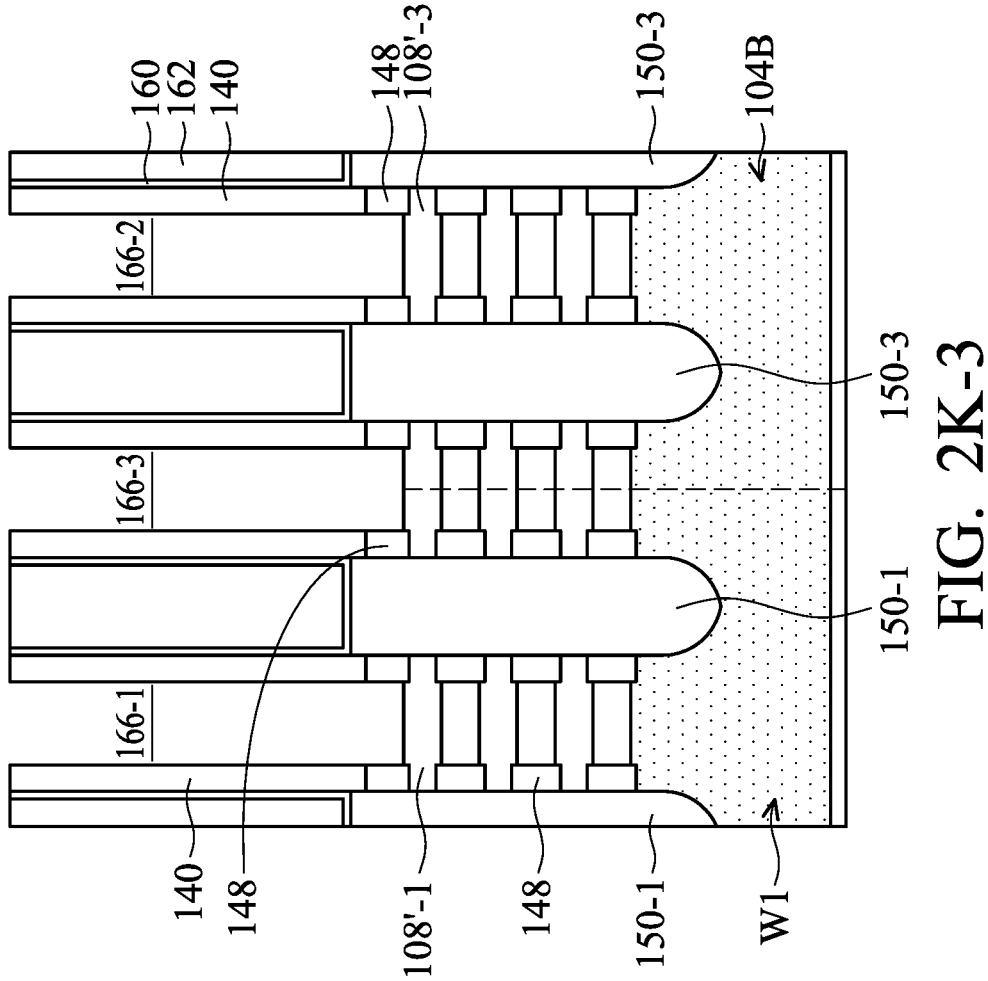
FIG. 2K-3
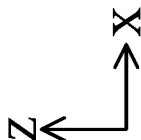

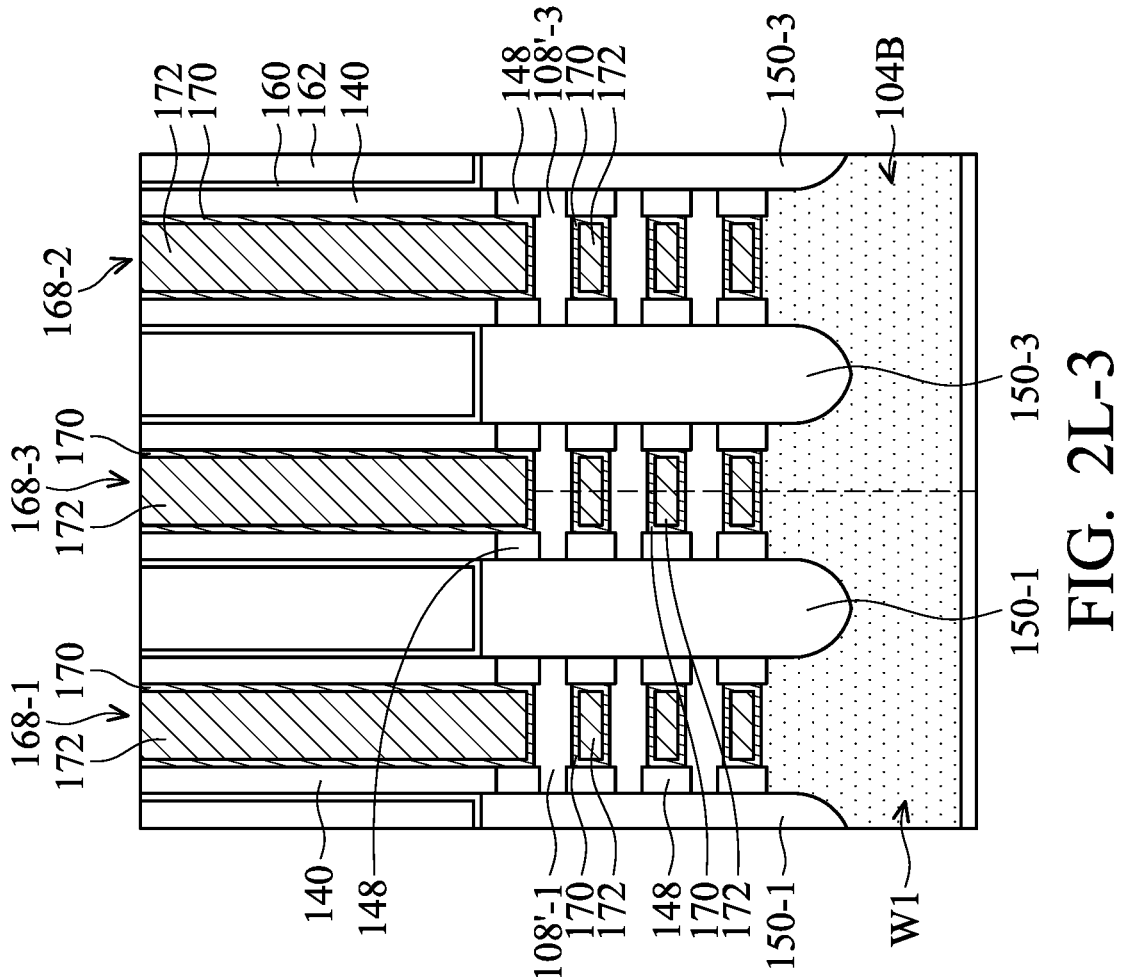
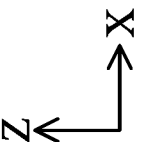
FIG. 2L-3

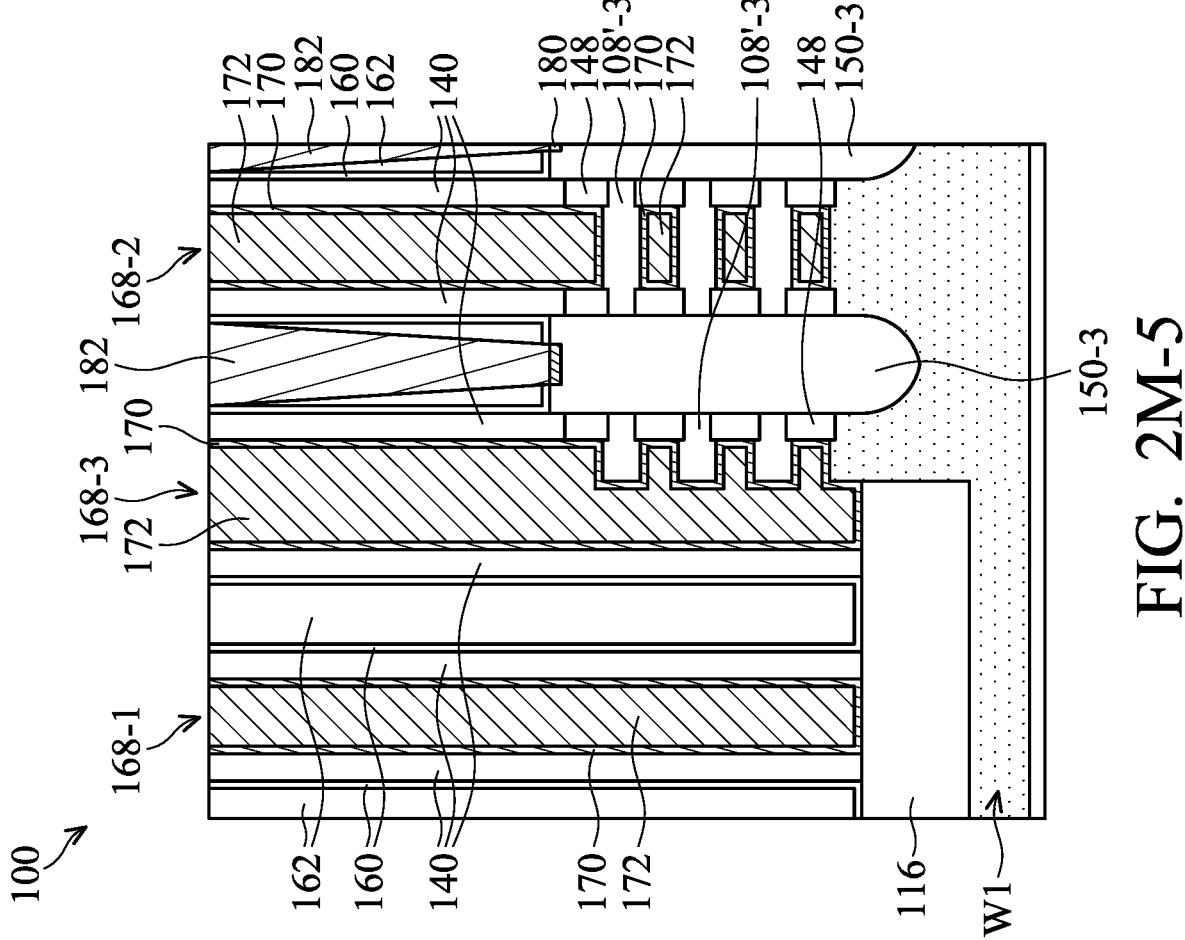
FIG. 2M-5
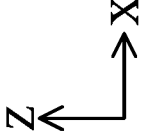

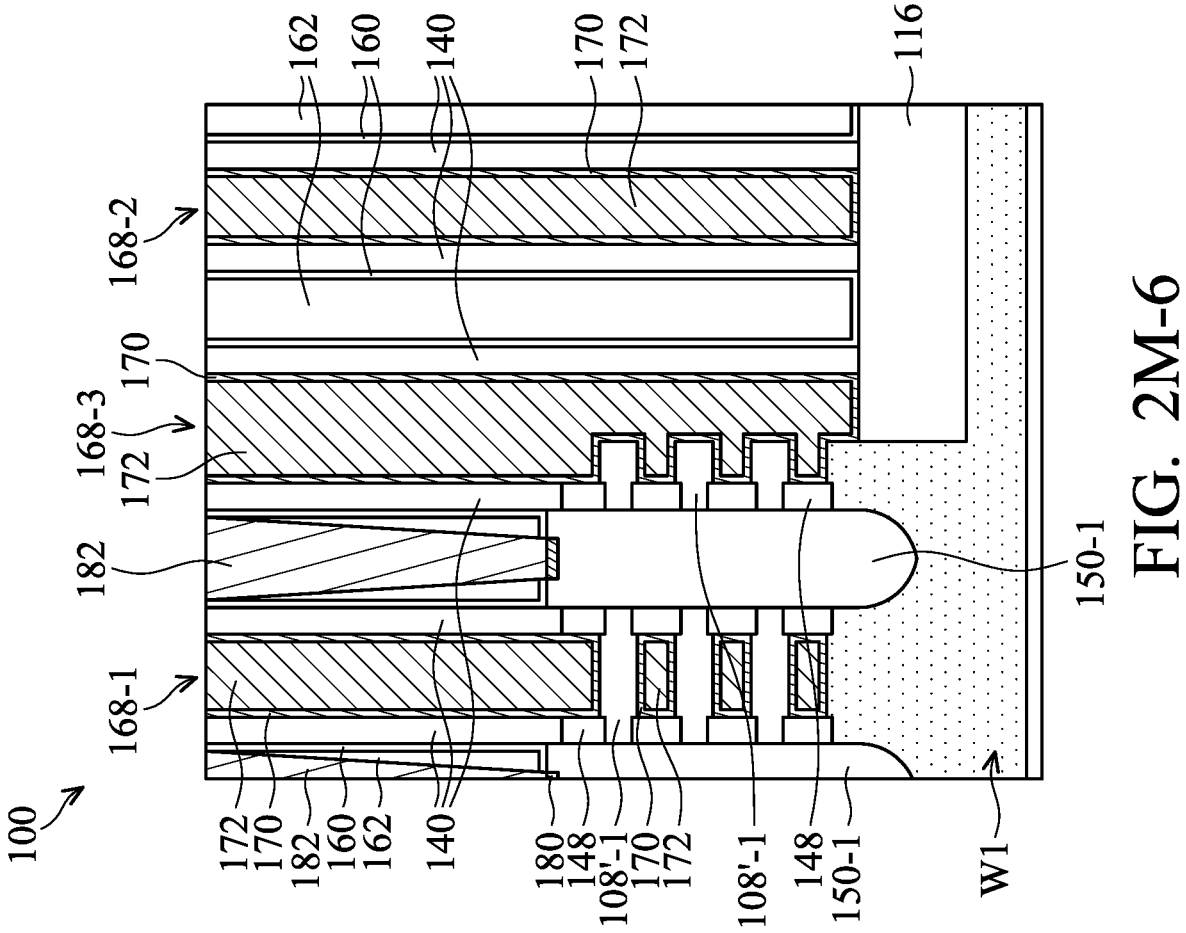
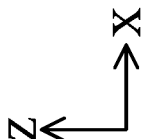
FIG. 2M-6

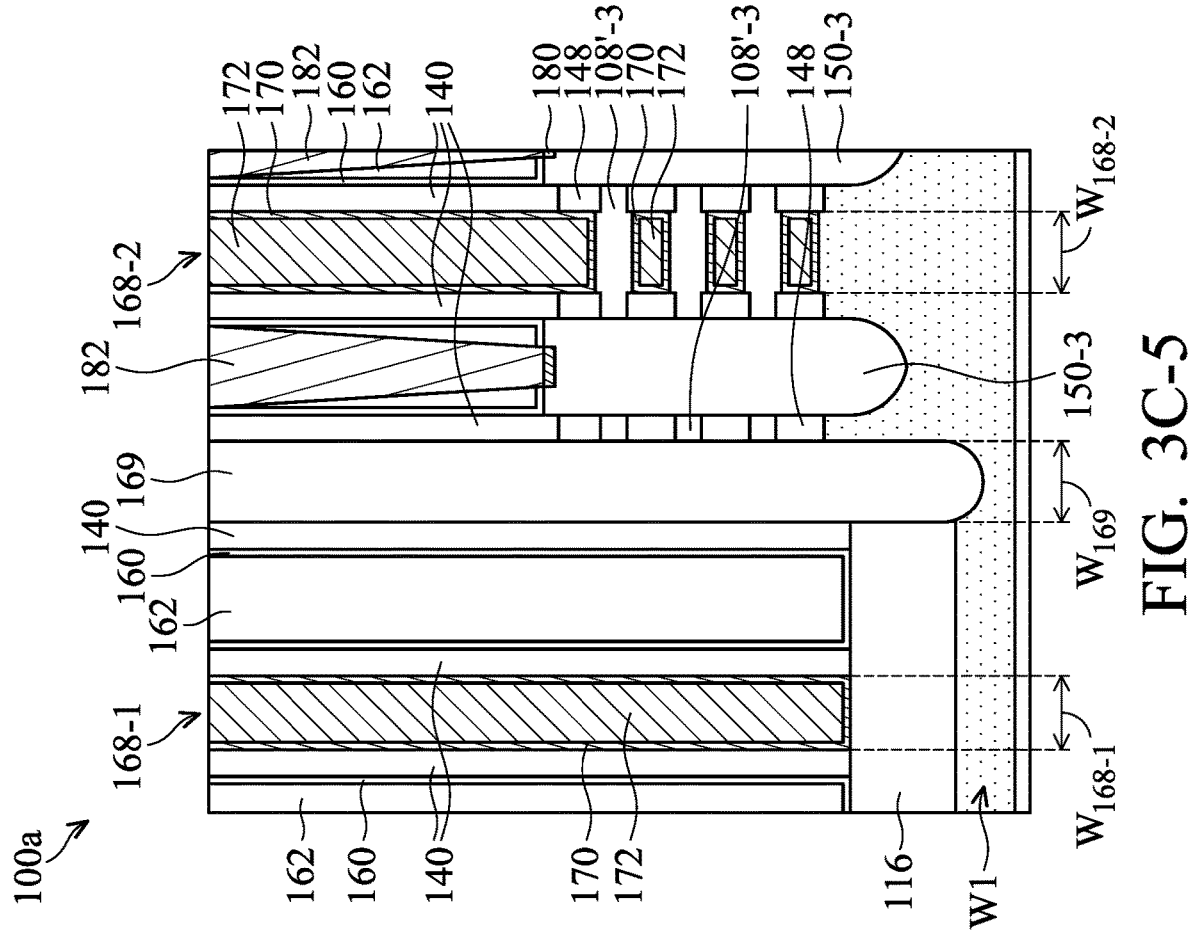
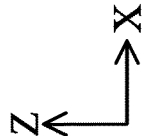
FIG. 3C-5

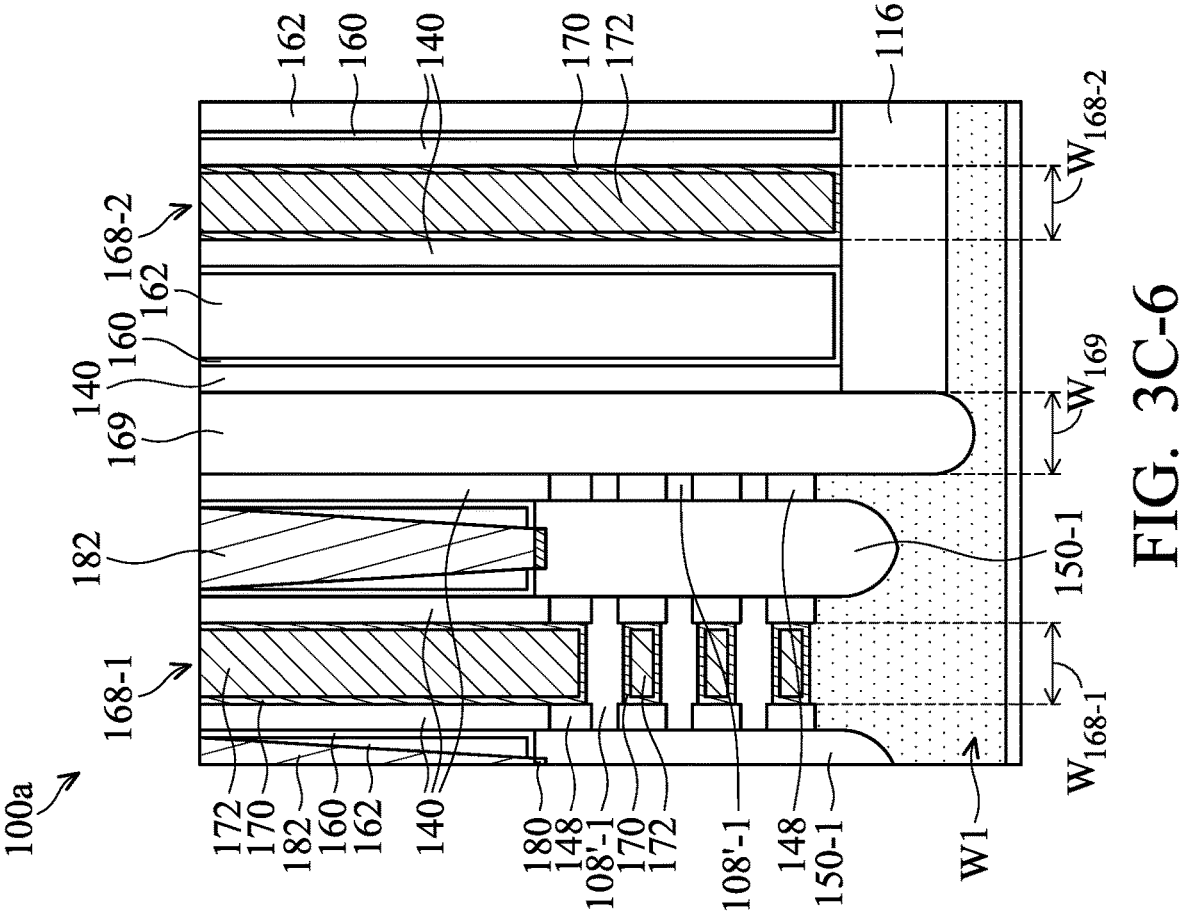
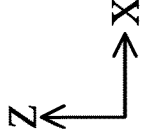
FIG. 3C-6

FIG. 16

SEMICONDUCTOR STRUCTURE WITH DIELECTRIC WALL STRUCTURE AND METHOD FOR MANUFACTURING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1A-2, 1B-2, 1C-2, and 1D-2 illustrate diagrammatic perspective views of the intermediate stages of manufacturing the semiconductor structure shown in blocks B10 and B20 of FIG. 1A-1 in accordance with some embodiments.

FIGS. 2A-1, 2B-1, 2C-1, 2D-1, 2E-1, 2F-1, 2G-1, 2H-1, 2I-1, 2J-1, 2K-1, 2L-1, and 2M-1 illustrate cross-sectional views of the intermediate stages of manufacturing the semiconductor structure shown along lines $Y_{1SD}$-$Y_{1SD}$' and $Y_{2SD}$-$Y_{2SD}$' in FIG. 1D-1 in accordance with some embodiments.

FIGS. 2A-2, 2B-2, 2C-2, 2D-2, 2E-2, 2F-2, 2G-2, 2H-2, 2I-2, 2J-2, 2K-2, 2L-2, and 2M-2 illustrate cross-sectional views of the intermediate stages of manufacturing the semiconductor structure shown along lines $Y_{1MG}$-$Y_{1MG}$' and $Y_{2MG}$-$Y_{2MG}$' in FIG. 1D-1 in accordance with some embodiments.

FIGS. 2A-3, 2B-3, 2C-3, 2D-3, 2E-3, 2F-3, 2G-3, 2H-3, 2I-3, 2J-3, 2K-3, 2L-3, and 2M-3 illustrate cross-sectional views of the intermediate stages of manufacturing the semiconductor structure shown along line $X_1$-$X_1$' in FIG. 1D-1 in accordance with some embodiments.

FIG. 2D-4 illustrates a top view of the intermediate stages of manufacturing the semiconductor structure in the step shown in FIGS. 2D-1, 2D-2, and 2D-3 in accordance with some embodiments.

FIG. 2E-4 illustrates a top view of the intermediate stages of manufacturing the semiconductor structure in the step shown in FIGS. 2E-1, 2E-2, and 2E-3 in accordance with some embodiments.

FIG. 2K-4 illustrates a top view of the intermediate stages of manufacturing the semiconductor structure in the step shown in FIGS. 2K-1, 2K-2, and 2K-3 in accordance with some embodiments.

FIG. 2L-4 illustrates a top view of the intermediate stages of manufacturing the semiconductor structure in the step shown in FIGS. 2L-1, 2L-2, and 2L-3 in accordance with some embodiments.

FIG. 2M-4 illustrates a top view of the semiconductor structure in accordance with some embodiments.

FIG. 2M-5 illustrates a cross-sectional view of the semiconductor structure 100 shown along line $X_2$-$X_2$' in FIG. 2M-4 in accordance with some embodiments.

FIG. 2M-6 illustrates a cross-sectional view of the semiconductor structure shown along line $X_3$-$X_3$' in FIG. 2M-4 in accordance with some embodiments.

FIGS. 3A-1, 3B-1, 3C-1, 3A-2, 3B-2, 3C-2, 3A-3, 3B-3, and 3C-3 illustrate cross-sectional views of intermediate stages of manufacturing a semiconductor structure in accordance with some embodiments.

FIGS. 3A-4, 3B-4, and 3C-4 illustrate top views of the intermediate stages of manufacturing the semiconductor structure in accordance with some embodiments.

FIG. 3C-5 illustrates a cross-sectional view of the semiconductor structure shown along line $X_{2a}$-$X_{2a}$' in FIG. 3C-4 in accordance with some embodiments.

FIG. 3C-6 illustrates a cross-sectional view of the semiconductor structure shown along line $X_{3a}$-$X_{3a}$' in FIG. 3C-4 in accordance with some embodiments.

FIG. 5 illustrates a top view of an arrangement of the first well regions and the second well regions in a substrate in accordance with some embodiments.

FIG. 16 illustrates a top view of a semiconductor structure formed over the substrate in accordance with some embodiments.

DETAILED DFSCRIPTION

Figures 1, 1A:
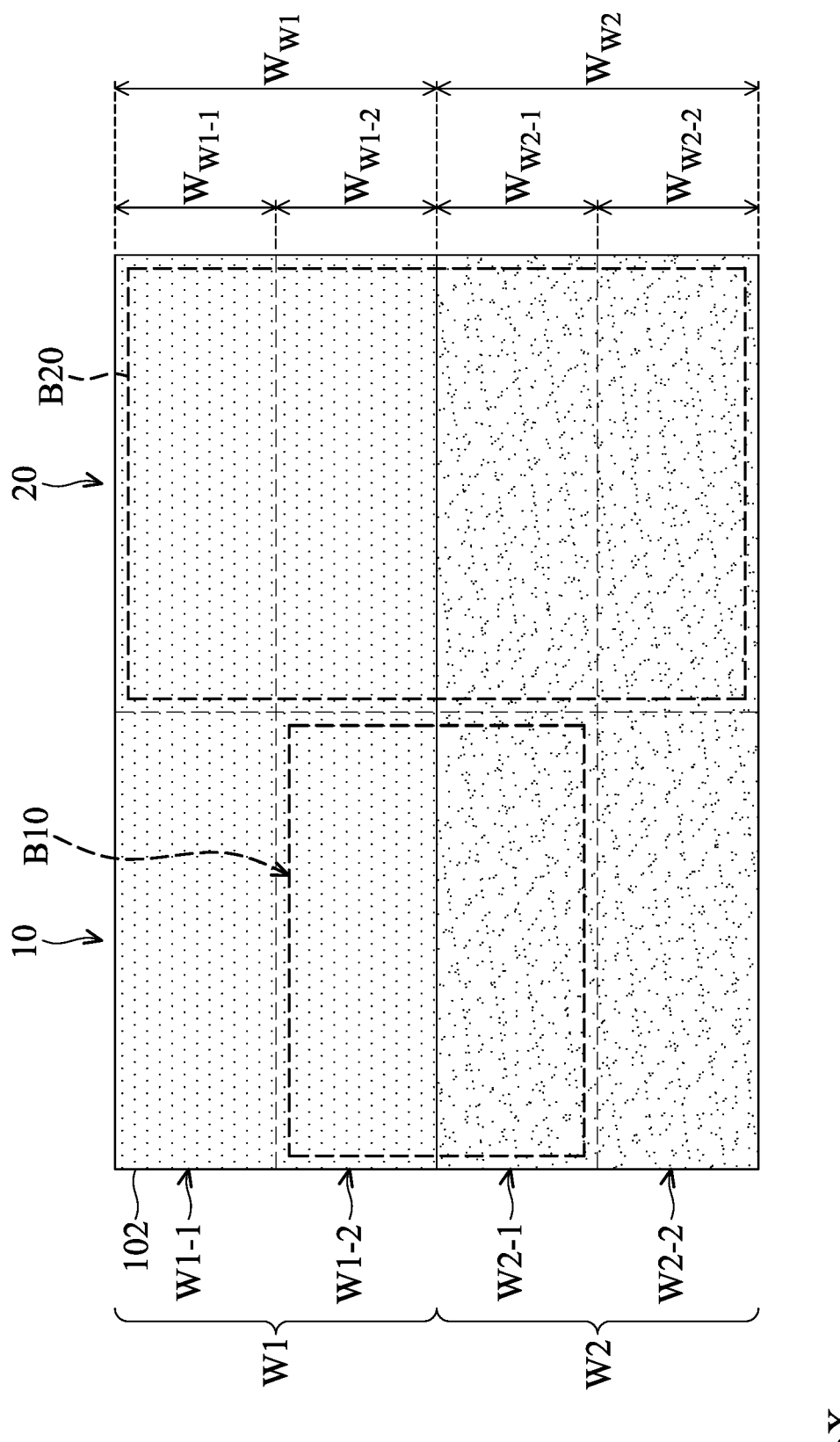
FIGS. 1A-1, 1B-1, 1C-1, and 1D-1 illustrate diagrammatic top views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nanoribbon FET, forksheet structures, and gate all around (GAA) transistors) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments of semiconductor structures and methods for forming the same are provided. The semiconductor structures may include different types of channel structures (e.g. nanostructures) formed over a substrate. For example, a first type of channel structures (e.g. forksheet structures) may be attached to dielectric wall structures and may be narrower than a second type of channel structures (e.g. nanosheet structures). Since the first type of channel structures may be attached to the dielectric wall structure, the distance between the first type of channel structures may be relatively small, and the numbers of the transistors formed in a certain area may be increased. Meanwhile, the widths of the first type of channel structures cannot the too wide, or the formation of the first type of channel structures may be challenging (details will be described later).

On the other hand, the second type of channel structures may not have dielectric wall structures sandwiched therebetween, and therefore the formation of the second type of channel structures may be easier and the second type of channel structures may have greater widths, resulting in a higher performance. Accordingly, by forming both the first type and the second type of channel structures in the same substrate, the number of the transistors may be increased due to the formation of the first type of channel structures and the performance of some of the transistors may be improved by forming the second type of channel structures.

Figures 1, 1B:
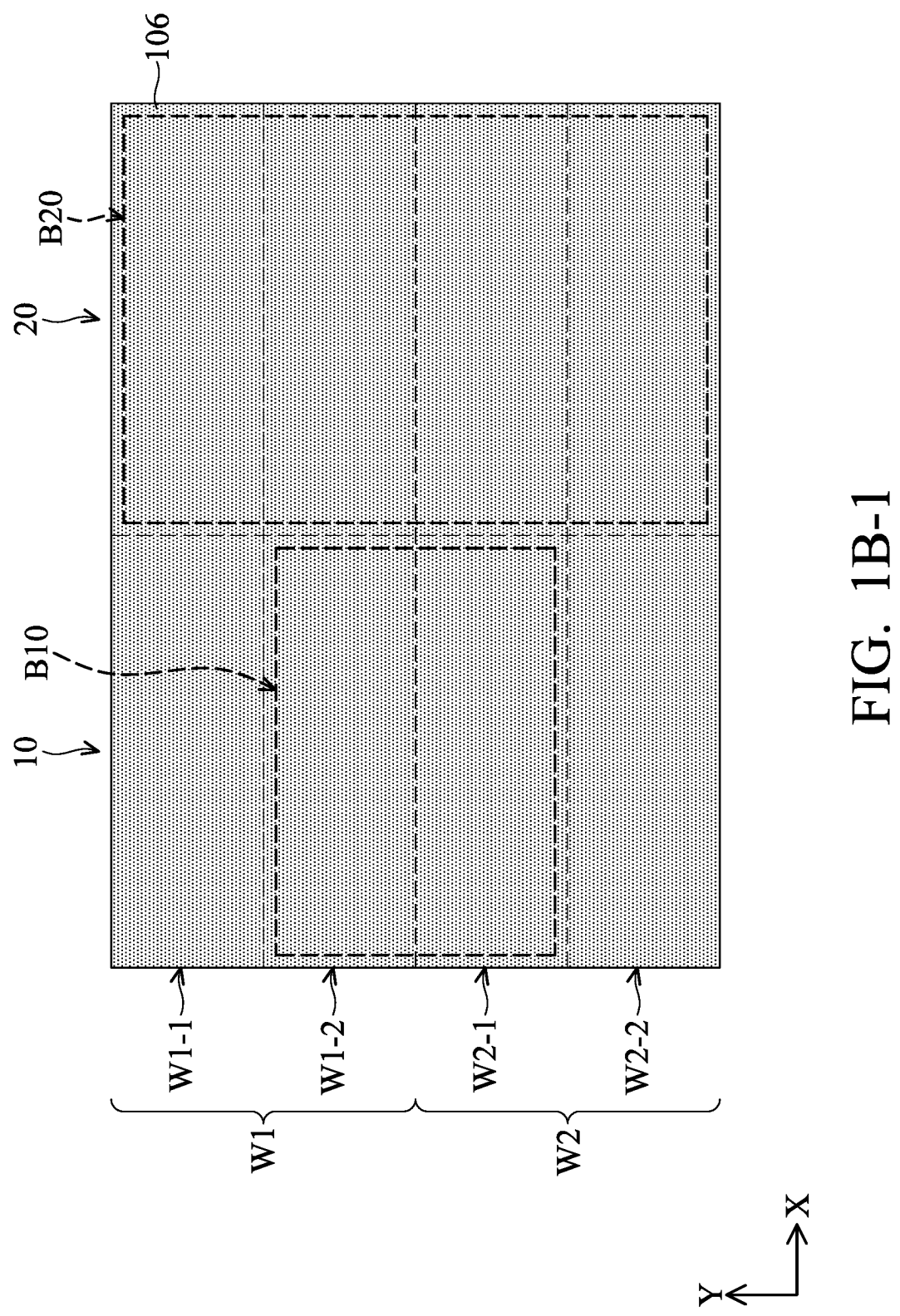
Figures 1, 1B, 2:
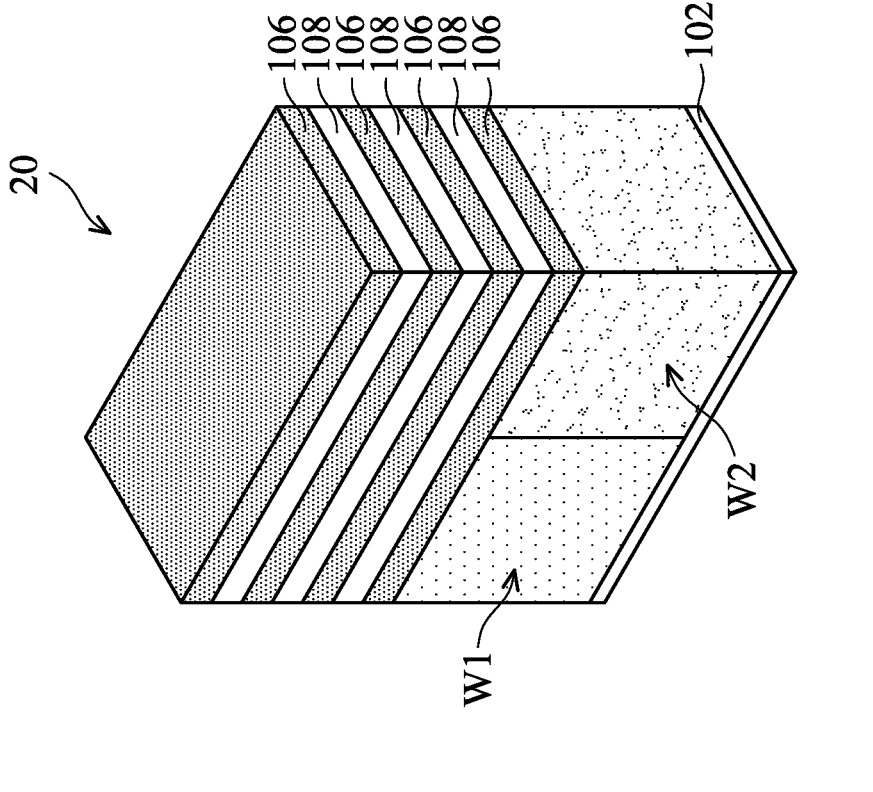
Figures 1, 1C:
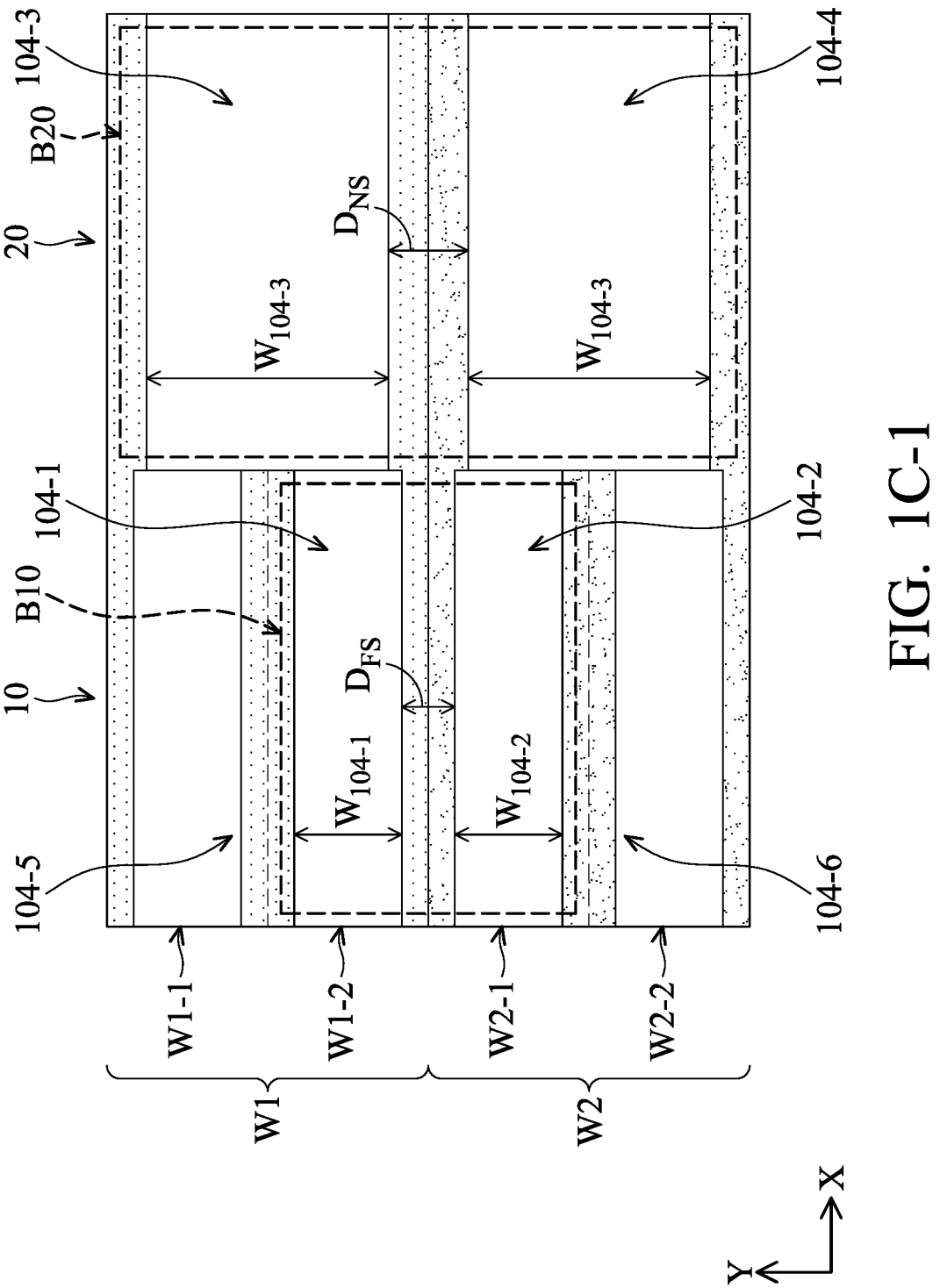
Figures 1, 1D:
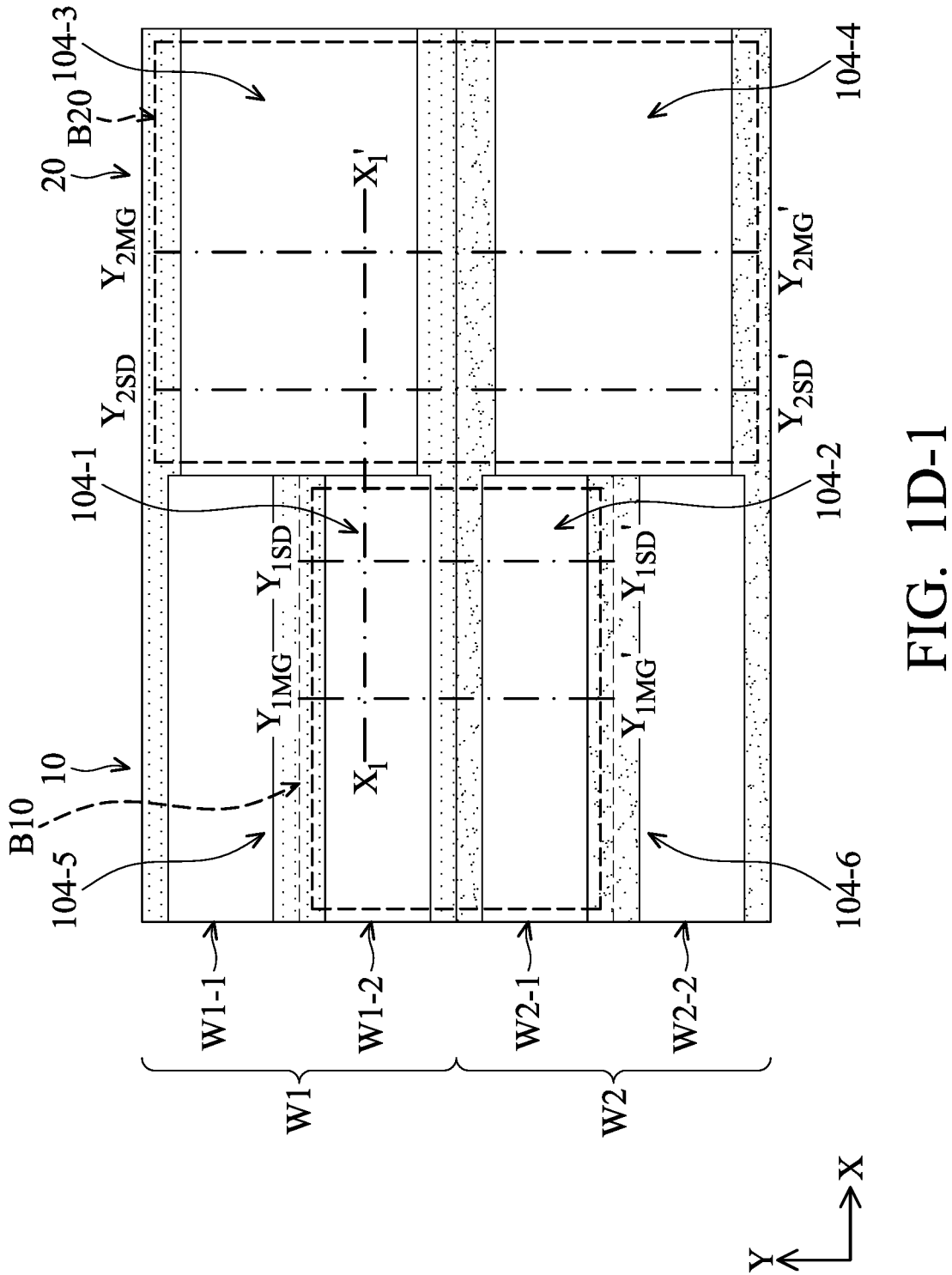
Figures 1, 1D, 2:
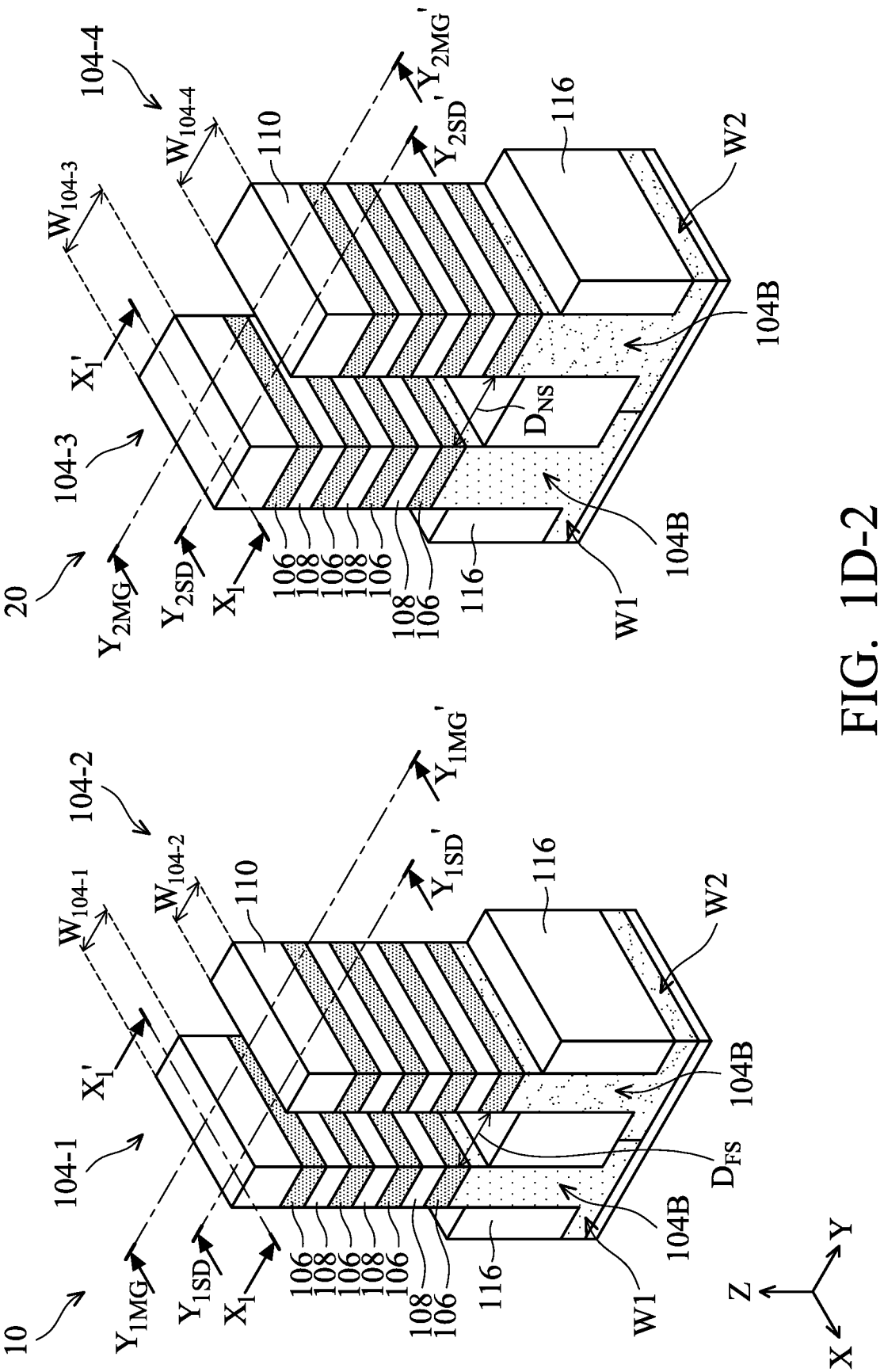
Figures 1, 2, 2A:
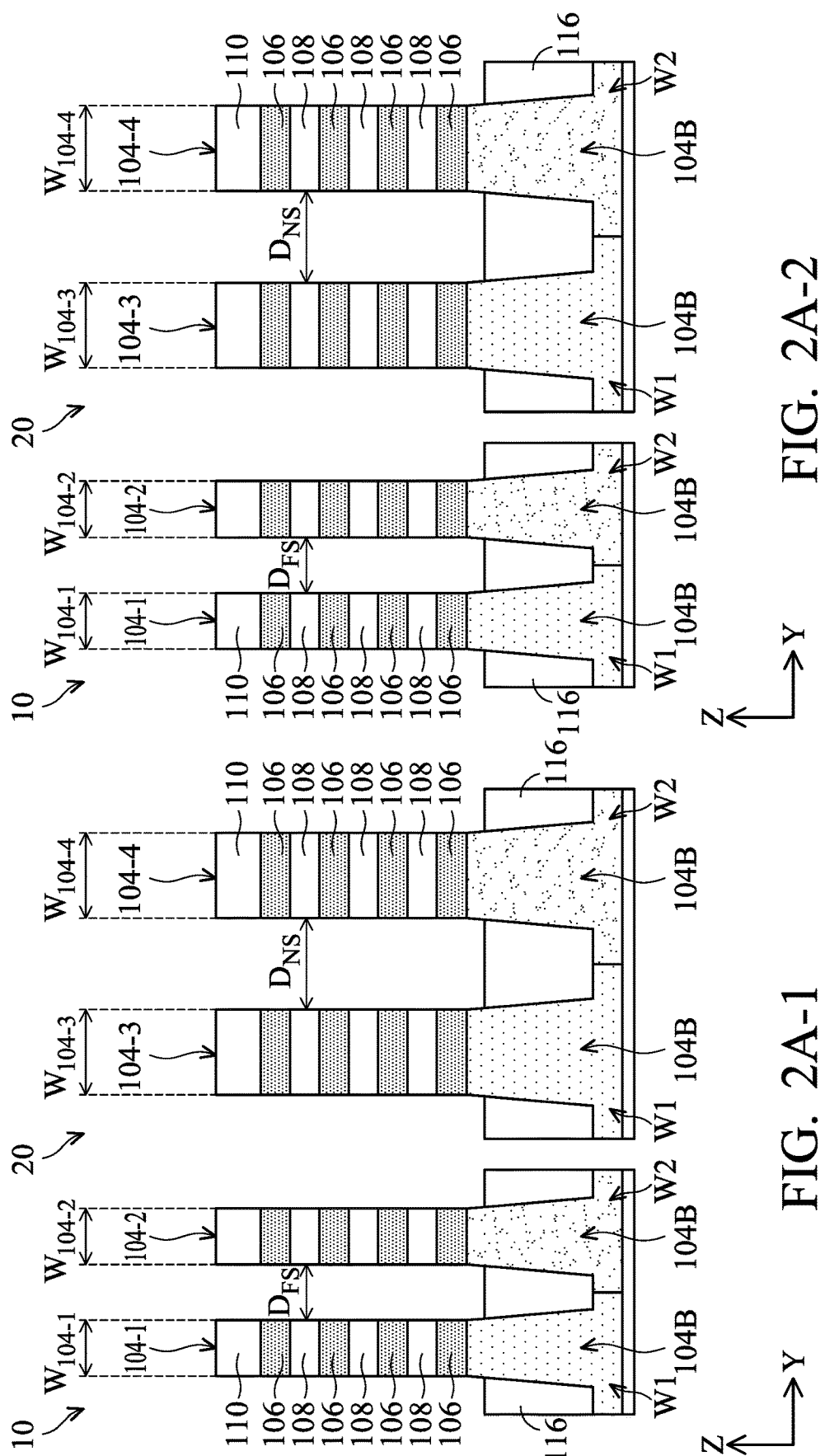
Figures 1, 2, 2B:
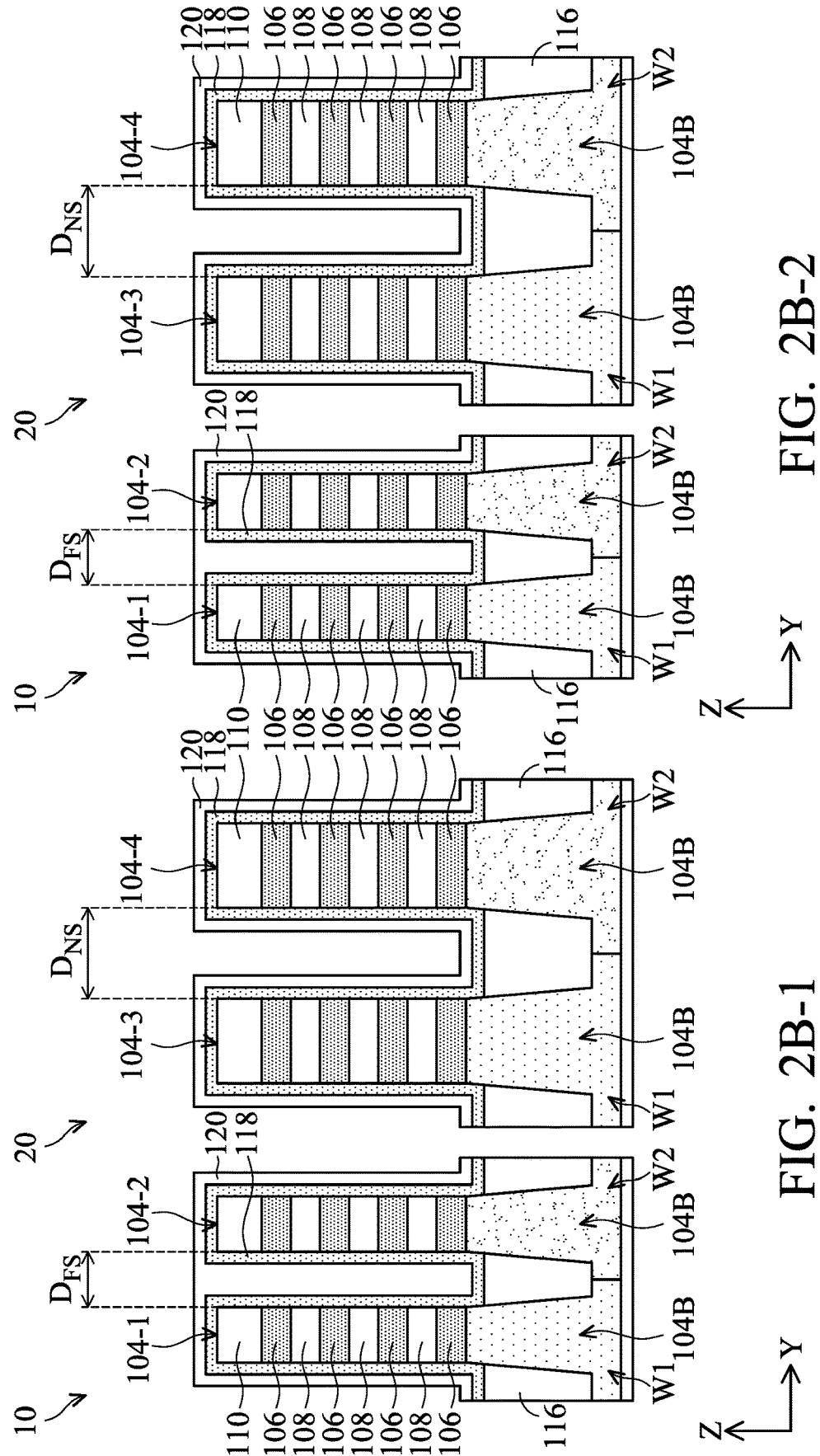
Figures 1, 2, 2C:
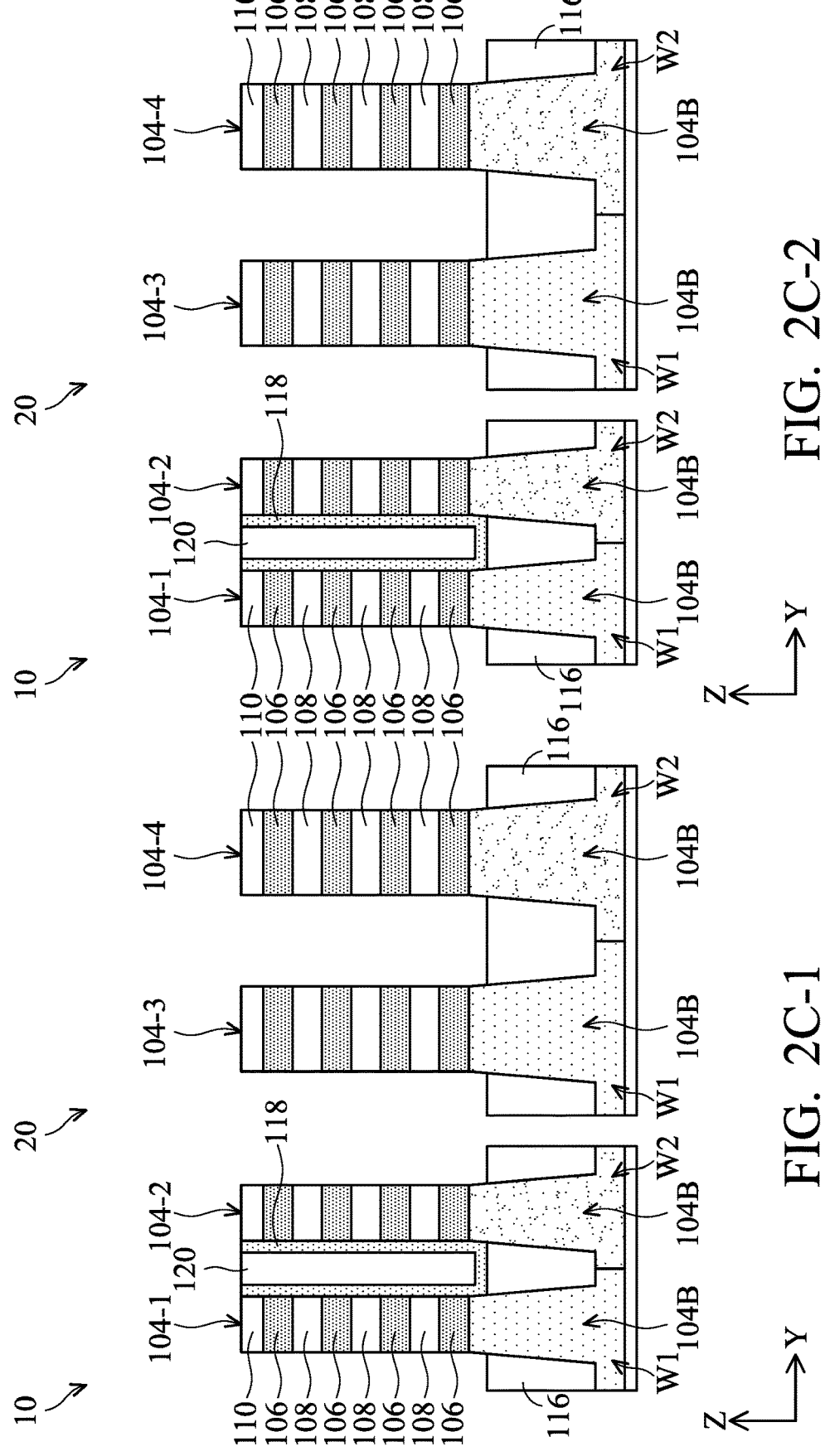

FIGS. 1A-1 to 1D-1 illustrate diagrammatic top views of intermediate stages of manufacturing a semiconductor structure 100 in accordance with some embodiments. FIGS. 1A-2 to 1D-2 illustrate the diagrammatic perspective views of the intermediate stages of manufacturing the semiconductor structure 100 shown in blocks B10 and B20 of FIG. 1A-1 in accordance with some embodiments. FIGS. 2A-1, 2A-2, and 2A-3 illustrate the cross-sectional views of the intermediate stage of the semiconductor structure 100 shown in FIGS. 1D-1 and 1D-2, and FIGS. 2B-1 to 2M-1, 2B-2 to 2M-2, 2B-3 to 2M-3 illustrate the cross-sectional views of the intermediate stages of manufacturing the semiconductor structure 100 afterwards in accordance with some embodiments. More specifically, FIGS. 2A-1 to 2M-1 illustrate the cross-sectional views of the intermediate stages of manufacturing the semiconductor structure 100 shown along lines $Y_{1SD}$-$Y_{1SD}'$ (i.e. in the Y direction) and $Y_{2SD}$-$Y_{2SD}'$ (i.e. in the Y direction) in FIG. 1D-1 in accordance with some embodiments. FIGS. 2A-2 to 2M-2 illustrate the cross-sectional views of the intermediate stages of manufacturing the semiconductor structure 100 shown along lines $Y_{1MG}$-$Y_{1MG}'$ (i.e. in the Y direction) and $Y_{2MG}$-$Y_{2MG}'$ (i.e. in the Y direction) in FIG. 1D-1 in accordance with some embodiments. FIGS. 2A-3 to 2M-3 illustrate the cross-sectional views of the intermediate stages of manufacturing the semiconductor structure 100 shown along lines $X_1$-$X_1'$ (i.e. in the X direction) in FIG. 1D-1 in accordance with some embodiments.

The semiconductor structure 100 may include multi-gate devices and may be included in a microprocessor, a memory, or other IC devices. For example, the semiconductor structure 100 may be a portion of an IC chip that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

First, a substrate 102 including a first region 10 and a second region 20 is formed in accordance with some embodiments. For a better understanding of the semiconductor structure 100, the X-Y-Z coordinate reference is provided in the figures. The X-axis and the Y-axis are generally orientated along the lateral (or horizontal) directions that are parallel to the main surface of the substrate 102. The Y-axis is transverse (e.g., substantially perpendicular/orthogonal) to the X-axis. The Z-axis is generally oriented along the vertical direction that is perpendicular to the main surface of the substrate 102 (or the X-Y plane).

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

A first well region W1 and a second well region W2 are formed in the substrate 102, as shown in FIGS. 1A-1 and 1A-2 in accordance with some embodiments. In some embodiments, the first well region W1 and the second well region W2 include different types of dopants. In some embodiments, the first well region W1 is an N-type well region doped with N-type dopants, and the second well region W2 is a P-type well region doped with P-type dopants. In some embodiments, the first well region W1 is a P-type well region doped P-type dopants, and the second well region W2 is an N-type well region doped N-type dopants. In some embodiments, the N-type dopants include phosphorus, arsenic, other n-type dopants, or a combination thereof. In some embodiments, the P-type dopants include boron, indium, other p-type dopants, or a combination thereof. The P-type well region may be configured to have N-type transistors formed on it, and the N-type well region may be configured to have P-type transistors formed on it. In some embodiments, the first well region W1 and the second well region W2 are formed by performing ion implantation processes, diffusion processes, and/or other suitable doping processes.

As shown in FIG. 1A-1, the first well region W1 and the second well region W2 are formed adjacent to each other in the Y direction and are both longitudinally oriented in the X direction in accordance with some embodiments. In some embodiments, the width $W_{W1}$ of the first well region W1 is substantially equal to the width $W_{W2}$ of the second well region W2. The first well region W1 may be divided into regions W1-1 and W1-2, and the second well region W2 may be divided into regions W2-1 and W2-2, although they are shown for further explanation for the structure and no real interfaces are formed between the regions. In some embodiments, the widths $W_{W1-1}$ and $W_{W1-2}$ of the regions W1-1 and W1-2 are substantially half of the width $W_{W1}$ of the first well region W1. In some embodiments, the widths $W_{W2-1}$ and $W_{W2-2}$ of the regions W2-1 and W2-2 are substantially half of the width $W_{W2}$ of the second well region W2.

After the first well region W1 and the second well region W2 are formed, a semiconductor stack including first semiconductor material layers 106 and second semiconductor material layers 108 is formed over both the first region 10 and the second region 20 of the substrate 102, as shown in FIGS. 1B-1 and 1B-2 in accordance with some embodiments.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although four first semiconductor material layers 106 and three second semiconductor material layers 108 are shown in FIG. 1B-2, the semiconductor stack may include less or more of the first semiconductor material layers 106 and the second semiconductor material layers 108 alternately stacked. For example, the semiconductor stack may include two to five of the first semiconductor material layers 106 and two to five of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor stack over the substrate 102, the semiconductor stack and the substrate 102 are patterned to form fin structures 104-1, 104-2, 104-3, 104-4, 104-5, and 104-6, as shown in FIGS. 1C-1 and 1C-2 in accordance with some embodiments. The formation of the fin structures 104-5 and 104-6 and the elements around the fin structures 104-5 and 104-6 may be similar to, or the same as, those for forming the fin structures 104-1 and 104-2 and therefore are not repeated herein.

The fin structures 104-1, 104-2, 104-3, and 104-4 may extend lengthwise along the X direction. More specifically, the fin structures 104-1 and 104-2 are formed in the first region 10, and the fin structures 104-3 and 104-4 are formed in the second region 20 in accordance with some embodiments. In addition, the fin structures 104-1 and 104-3 are formed in the first well region W1, and the fin structures 104-2 and 104-4 are formed in the second well region W2 in accordance with some embodiments. In some embodiments, the fin structure 104-1 is formed within the region W1-2 of the first well region W1, and the fin structure 104-2 is formed within the region W2-1 of the second well region W2. On the other hand, the fin structure 104-3 partially overlaps both the regions W1-1 and W1-2 of the first well region W1, and the fin structure 104-4 partially overlaps both the regions W2-1 and W2-2 of the second well region W2 in accordance with some embodiments.

In some embodiments, the width $W_{104-1}$ of the fin structure 104-1 in the Y direction is substantially equal to the width $W_{104-2}$ of the fin structure 104-2 in the Y direction, and the width $W_{104-3}$ of the fin structure 104-3 in the Y direction is substantially equal to the width $W_{104-4}$ of the fin structure 104-4 in the Y direction. In some embodiments, the width $W_{104-1}$ of the fin structure 104-1 is smaller than the width $W_{104-3}$ of the fin structure 104-3. In some embodiments, the width $W_{104-3}$ of the fin structure 104-3 is greater than two times of the width $W_{104-1}$ of the fin structure 104-1. In some embodiments, the width $W_{104-1}$ of the fin structure 104-1 is in a range from about 1 nm to about 50 nm. In some embodiments, the distance Drs between the fin structures 104-1 and 104-2 in the Y direction is smaller than the distance $D_{NS}$ between the fin structures 104-3 and 104-4 in the Y direction.

In some embodiments, the patterning process for forming the fin structures 104-1, 104-2, 104-3, and 104-4 includes forming a mask structure 110 over the semiconductor material stack, and etching the semiconductor material stack and the underlying substrate 102 through the mask structure 110. In some embodiments, the mask structure 110 is a multilayer structure including a pad oxide layer and a nitride layer formed over the pad oxide layer. The pad oxide layer may be made of silicon oxide, which is formed by thermal oxidation or CVD, and the nitride layer may be made of silicon nitride, which is formed by CVD, such as LPCVD or plasma-enhanced CVD (PECVD). In some embodiments, the fin structures 104-1, 104-2, 104-3, and 104-4 include base fin structures 104B and the semiconductor stacks, including the first semiconductor material layers 106 and the second semiconductor material layers 108 formed over the base fin structures 104B.

After the fin structures 104-1, 104-2, 104-3, and 104-4 are formed, an isolation structure 116 is formed around the fin structures 104-1, 104-2, 104-3, and 104-4, as shown in FIGS. 1D-1, 1D-2, 2A-1, 2A-2, and 2A-3 in accordance with some embodiments. The isolation structure 116 is configured to electrically isolate active regions (e.g. the fin structures 104-1, 104-2, 104-3, and 104-4) of the semiconductor structure and is also referred to as shallow trench isolation (STI) feature in accordance with some embodiments. In some embodiments, the top surface of the portion of the isolation structure 116 between the fin structures 104-1 and 104-2 (i.e. $D_{FS}$) is narrower than the top surface of the portion of the isolation structure 116 between the fin structures 104-3 and 104-4 (i.e. $D_{NS}$) in the Y direction.

More specifically, an insulating layer may be formed around and covering the fin structures 104-1, 104-2, 104-3, and 104-4, and the insulating layer may be recessed to form the isolation structure 116 with the fin structures 104-1, 104-2, 104-3, and 104-4 protruding from the top surface of the isolation structure 116. In some embodiments, the insulating layer is made of silicon oxide, silicon nitride, silicon oxynitride (SiON), another suitable insulating material, or a combination thereof. In addition, liner layers (not shown) may be formed before forming the insulating layer, and the liner layers may also be recessed with the insulating layer to form the isolation structure 116. In some embodiments, the liner layers include multiple dielectric material layers.

After the isolation structure 116 is formed, dielectric wall structures may be formed. More specifically, a dielectric shell layer 118 is conformally formed to cover the fin structures 104-1, 104-2, 104-3, and 104-4 and the isolation structure 116, and a core portion 120 is formed over the dielectric shell layer 118, as shown in FIGS. 2B-1, 2B-2, and 2B-3 in accordance with some embodiments.

The dielectric shell layer 118 is configured to protect the dielectric wall structure in subsequent etching process. In some embodiments, the dielectric shell layer 118 covers the sidewalls and the top surfaces of the fin structures 104-1, 104-2, 104-3, and 104-4 and the top surface of the isolation structure 116. In some embodiments, the dielectric shell layer 118 is made of a nitride base dielectric materials such as SiN. In some embodiments, the dielectric shell layer 118 has a thickness in a range from about 3 nm to about 5 nm.

In some embodiments, the core portion 120 is made of a low k dielectric material, so that the capacitance of the resulting semiconductor device may be reduced. In some embodiments, the core portion 120 is made of an oxide base dielectric material, an oxynitride base dielectric material, or a flowable base dielectric material, such as $SiO_2$. In some embodiments, the core portion 120 and the isolation structure 116 are made of the same material. The dielectric shell layer 118 and the core portion 120 may be deposited using CVD, PVD, ALD, HDPCVD, MOCVD, RPCVD, PECVD, LPCVD, ALCVD, APCVD, other applicable methods, or combinations thereof.

In some embodiments, since the distance $D_{FS}$ is smaller than the distance $D_{NS}$, the space between the fin structures 104-1 and 104-2 is substantially filled with the dielectric shell layer 118 and the core portion 120, while the space between the fin structures 104-3 and 104-4 is not completely filled with the dielectric shell layer 118 and the core portion 120 in accordance with some embodiments.

Next, an etching process 122 is performed, as shown in FIGS. 2C-1, 2C-2, and 2C-3 in accordance with some embodiments. In some embodiments, the etching process 122 is performed without using a mask structure. During the etching process 122, the removal of the core portion 120 and the dielectric shell layer 118 in the space between the fin structures 104-1 and 104-2 may be much slower than that in other places, since the space between the fin structures 104-1 and 104-2 is completely filled by the core portion 120 and the dielectric shell layer 118 while the top and sidewall surfaces of the core portion 120 in other regions are largely exposed. In other words, the removal of the core portion 120 and the dielectric shell layer 118 in other regions (e.g. in the spaces between the fin structures 104-3 and 104-4) is faster than the removal of the core portion 120 and the dielectric shell layer 118 in the space between the fin structures 104-1 and 104-2. Therefore, the core portion 120 and the dielectric shell layer 118 formed in the wider space are completely removed, and the core portion 120 and the dielectric shell layer 118 formed in the space between the fin structures 104-1 and 104-2 are only partially removed during the etching process in accordance with some embodiments. The remaining core portion 120 and the dielectric shell layer 118 form the bottom portion of the dielectric wall structure in accordance with some embodiments. In some other embodiments, the core portion 120 and the dielectric shell layer 118 are also partially etched during the etching process 122. In some embodiments, the mask structures 110 formed over the fin structures 104-1, 104-2, 104-3, and 104-4 are also partially etched during the etching process 122. Accordingly, the heights of the mask structures 110 are reduced after the etching process 122 is performed in accordance with some embodiments.

Next, the dielectric shell layer 118 and the core portion 120 are recessed to form a recess, and a cap layer 124 is formed in the recess, as shown in FIGS. 2D-1, 2D-2, and 2D-3 in accordance with some embodiments. In some embodiments, the dielectric shell layer 118 and the core portion 120 are recessed by performing an etching process. In some embodiments, the etching process is an isotropic etching such as dry chemical etching, remote plasma etching, wet chemical etching, other applicable technique, and/or a combination thereof. In some embodiments, the cap layer 124 is made of a high k dielectric material, such as $HfO_2$, $ZrO_2$, $HfAlO_x$, $HfSiO_x$, $Al_2O_3$, or the like.

In some embodiments, the bottom surface of the cap layer 124 is lower than the topmost surface of the second semiconductor material layers 108 and is higher than the bottom surface of the topmost layer of the second semiconductor material layers 108. In some other embodiments, the bottom surface of the cap layer 124 is substantially level with the topmost surface of the second semiconductor material layers 108. In some other embodiments, the bottom surface of the cap layer 124 is higher than the topmost surface of the second semiconductor material layers 108 and is lower than the topmost surface of the first semiconductor material layers 106.

Figures 1, 2, 2D:
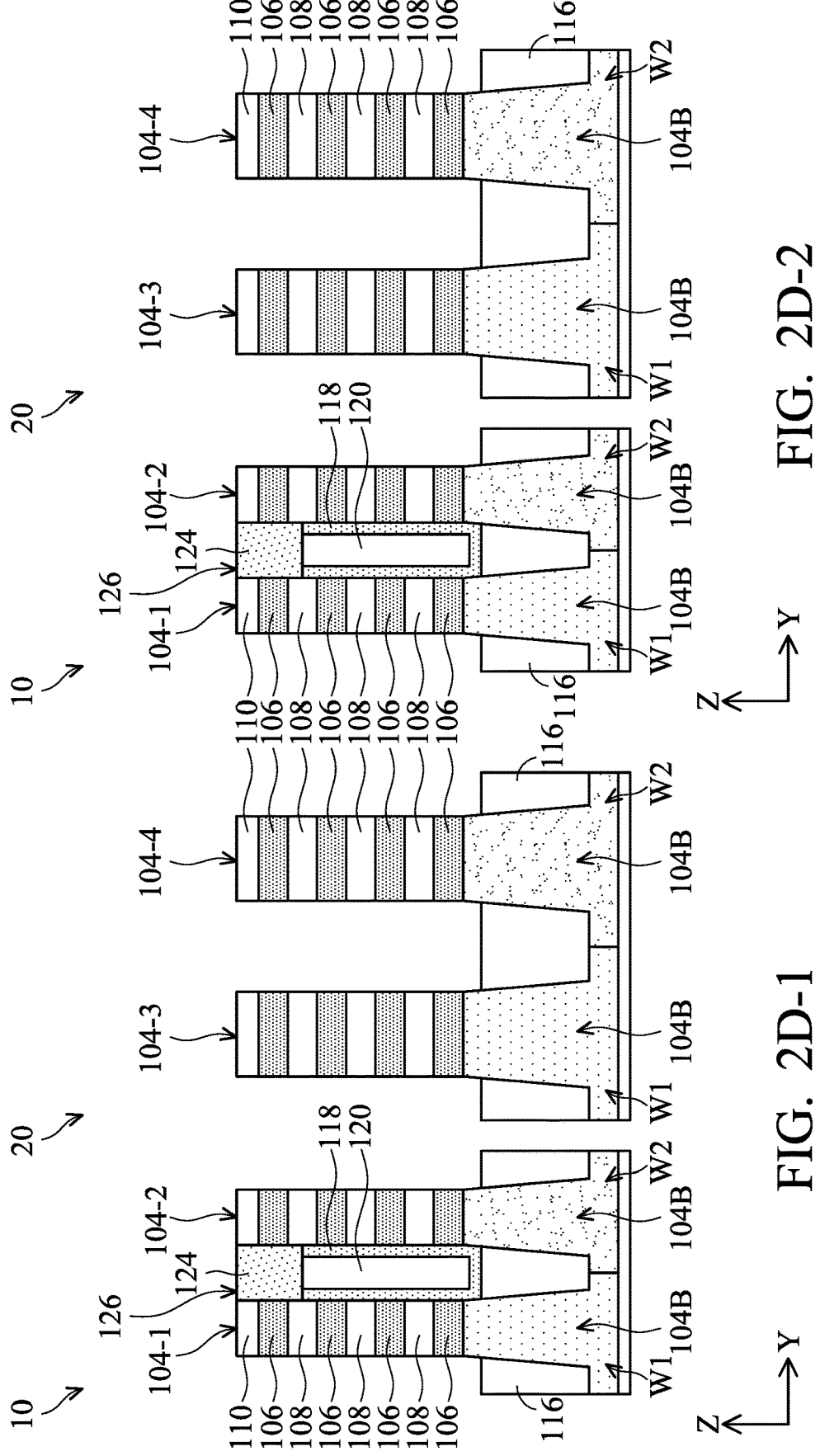

A dielectric wall structure 126, including the dielectric shell layer 118, the core portion 120, and the cap layer 124, is formed between the fin structures 104-1 and 104-2, as shown in FIGS. 2D-1 and 2D-2 in accordance with some embodiments. More specifically, the dielectric wall structure 126 is sandwiched between the fin structures 104-1 and 104-2 over the isolation structure 116 and is longitudinally oriented along the X direction in accordance with some embodiments.

FIG. 2D-4 illustrates a top view of the intermediate stage of manufacturing the semiconductor structure 100 in the step shown in FIGS. 2D-1, 2D-2, and 2D-3 in accordance with some embodiments. As shown in FIGS. 2D-4, the fin structures 104-1 and 104-2 are attached to the opposite sides of the dielectric wall structure 126 in accordance with some embodiments. That is, the fin structures 104-1 and 104-2 are separated by the dielectric wall structure 126, and therefore the distance Drs between the fin structures 104-1 and 104-2 may be relatively small. In some embodiments, the dielectric wall structure 126 is formed on the boundary between the first well region W1 and the second well region W2 and partially overlaps both the first well region W1 and the second well region W2. In some embodiments, a numbers of dielectric wall structures 126 are formed at opposite sides of the boundaries of the first well region W1 and the second well region W2, as shown in FIG. 2D-4 in accordance with some embodiments.

Afterwards, the remaining mask structures 110 are removed, and dummy gate structures 130-1, 130-2, and 130-3 are formed, as shown in FIGS. 2E-1, 2E-2, and 2E-3 in accordance with some embodiments. FIG. 2E-4 illustrates a top view of the intermediate stage of manufacturing the semiconductor structure 100 in the step shown in FIGS. 2E-1, 2E-2, and 2E-3 in accordance with some embodiments. More specifically, the dummy gate structure 130-1 is formed across the fin structures 104-1 and 104-2 and the dielectric wall structure 126, the dummy gate structure 130-2 is formed across the fin structures 104-3 and 104-4, and the dummy gate structure 130-3 is formed across the fin structures 104-1, 104-2, 104-3, and 104-4 and the dielectric wall structure 126, as shown in FIG. 2E-4 in accordance with some embodiments. The dummy gate structures 130-1, 130-2, and 130-3 may be used to define the channel regions of the transistors in the resulting semiconductor structure 100.

In some embodiments, each of the dummy gate structures 130-1, 130-2, and 130-3 includes a dummy gate dielectric layer 132 and a dummy gate electrode layer 134. In some embodiments, the dummy gate dielectric layer 132 is made of one or more dielectric materials, such as silicon oxide, silicon nitride, silicon oxynitride (SiON), $HfO_2$, HfZrO, HfSiO, HfTIO, HfAlO, or a combination thereof. In some embodiments, the dummy gate dielectric layer 132 is formed using thermal oxidation, CVD, ALD, physical vapor deposition (PVD), another suitable method, or a combination thereof.

In some embodiments, the dummy gate electrode layer 134 is made of conductive material includes polycrystalline-silicon (poly-Si), poly-crystalline silicon-germanium (poly-SiGe), or a combination thereof. In some embodiments, the dummy gate electrode layer 134 is formed using CVD, PVD, or a combination thereof.

In some embodiments, a hard mask layer 136 is formed over the dummy gate electrode layer 134. In some embodiments, the hard mask layer 136 includes multiple layers, such as an oxide layer and a nitride layer. In some embodiments, the oxide layer is silicon oxide, and the nitride layer is silicon nitride.

The formation of the dummy gate structures 130-1, 130-2, and 130-3 may include conformally forming a dielectric material as the dummy gate dielectric layers 132. Afterwards, a conductive material may be formed over the dielectric material as the dummy gate electrode layers 134, and the hard mask layer 136 may be formed over the conductive material. Next, the dielectric material and the conductive material may be patterned through the hard mask layer 136 to form the dummy gate structures 130-1, 130-2, and 130-3.

After the dummy gate structures 130-1, 130-2, and 130-3 are formed, a spacer layer is formed to cover the top surfaces and the sidewalls of the dummy gate structures 130-1, 130-2, and 130-3 and the fin structures 104-1, 104-2, 104-3, and 104-4 in accordance with some embodiments. Next, an etching process is performed to form gate spacers 140 and fin spacers 142 with the spacer layer and to form source/drain recesses 144 in the fin structures 104-1, 104-2, 104-3, and 104-4, as shown in FIGS. 2F-1, 2F-2, and 2F-3 in accordance with some embodiments. The gate spacers 140 may be configured to separate source/drain structures (formed afterwards) from the dummy gate structures 130-1, 130-2, and 130-3, and the fin spacers 142 may be configured to confine the growth of the source/drain structures formed therein.

In some embodiments, the spacer layer is made one or more dielectric materials. The dielectric materials may include silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. After the spacer layer is formed, the spacer layer is etched to form the gate spacers 140 on opposite sidewall surfaces of the dummy gate structures 130-1, 130-2, and 130-3, and fin spacers 142 are formed on the opposite sidewall surfaces of the fin structures 104-1, 104-2, 104-3, and 104-4 by performing an etching process in accordance with some embodiments. In addition, the fin structures 104-1, 104-2, 104-3, and 104-4 not covered by the dummy gate structures 130-1, 130-2, and 130-3 and the gate spacers 140 are further etched to form the source/drain recesses 144, as shown in FIGS. 2F-1 and 2F-3 in accordance with some embodiments. The etching process may be an anisotropic etching process, such as dry plasma etching, and the dummy gate structures 130-1, 130-2, and 130-3 and the gate spacers 140 may be used as etching masks during the etching process. In some embodiments, the isolation structure 116 is also slightly etched during the etching process.

Figures 2, 2D, 3, 4:
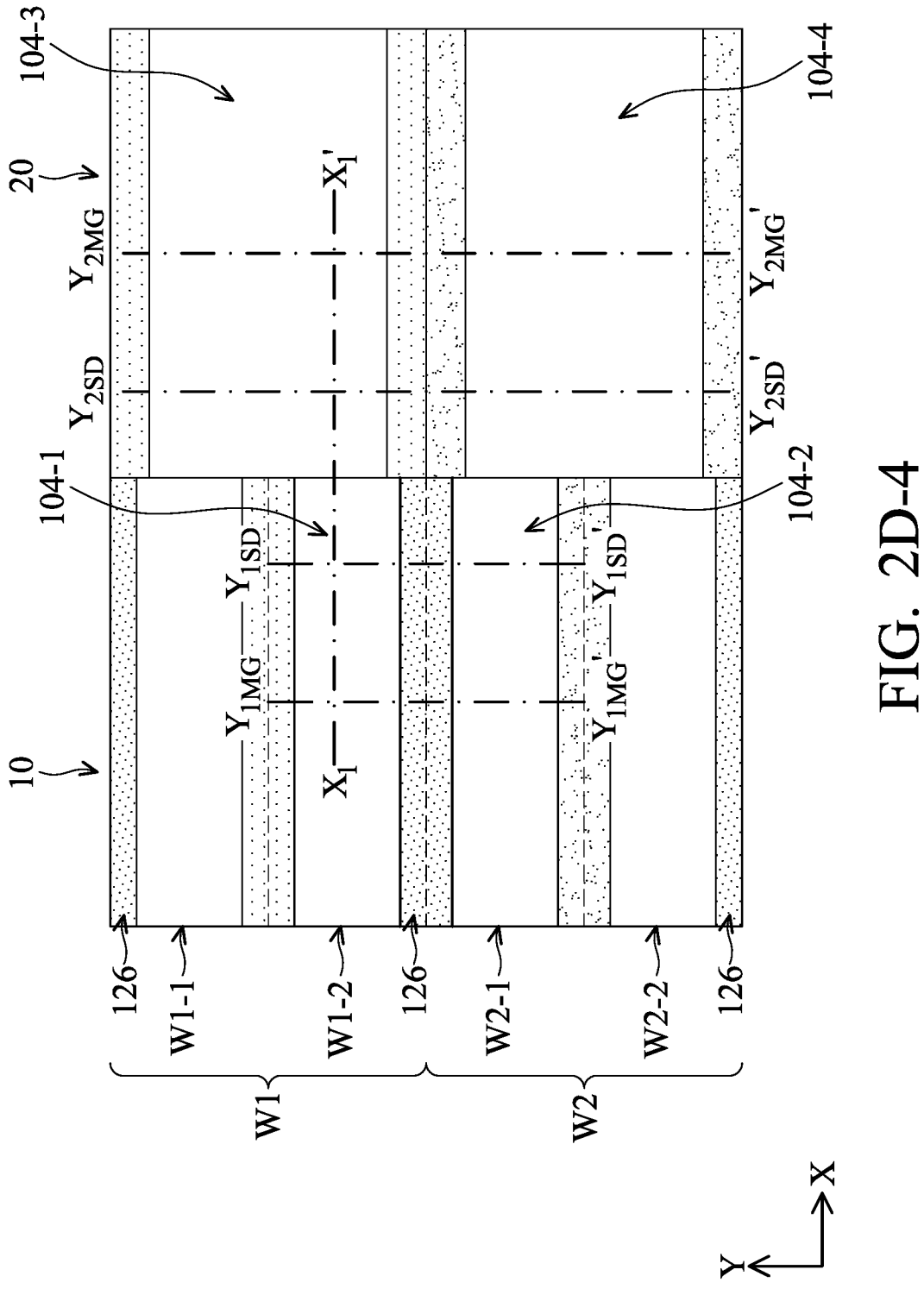
Figures 1, 2, 2E:
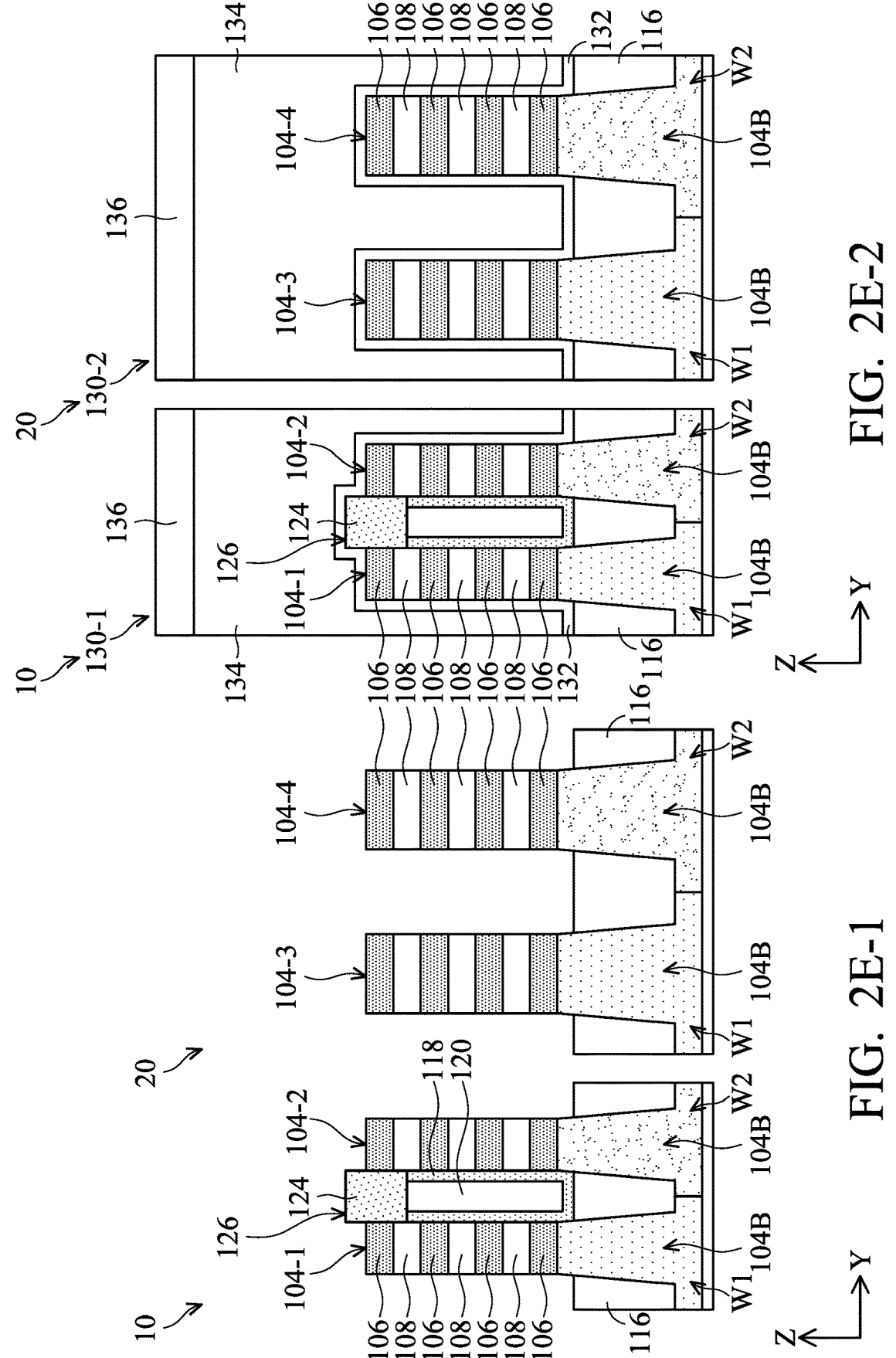
Figures 2, 2E, 3, 4:
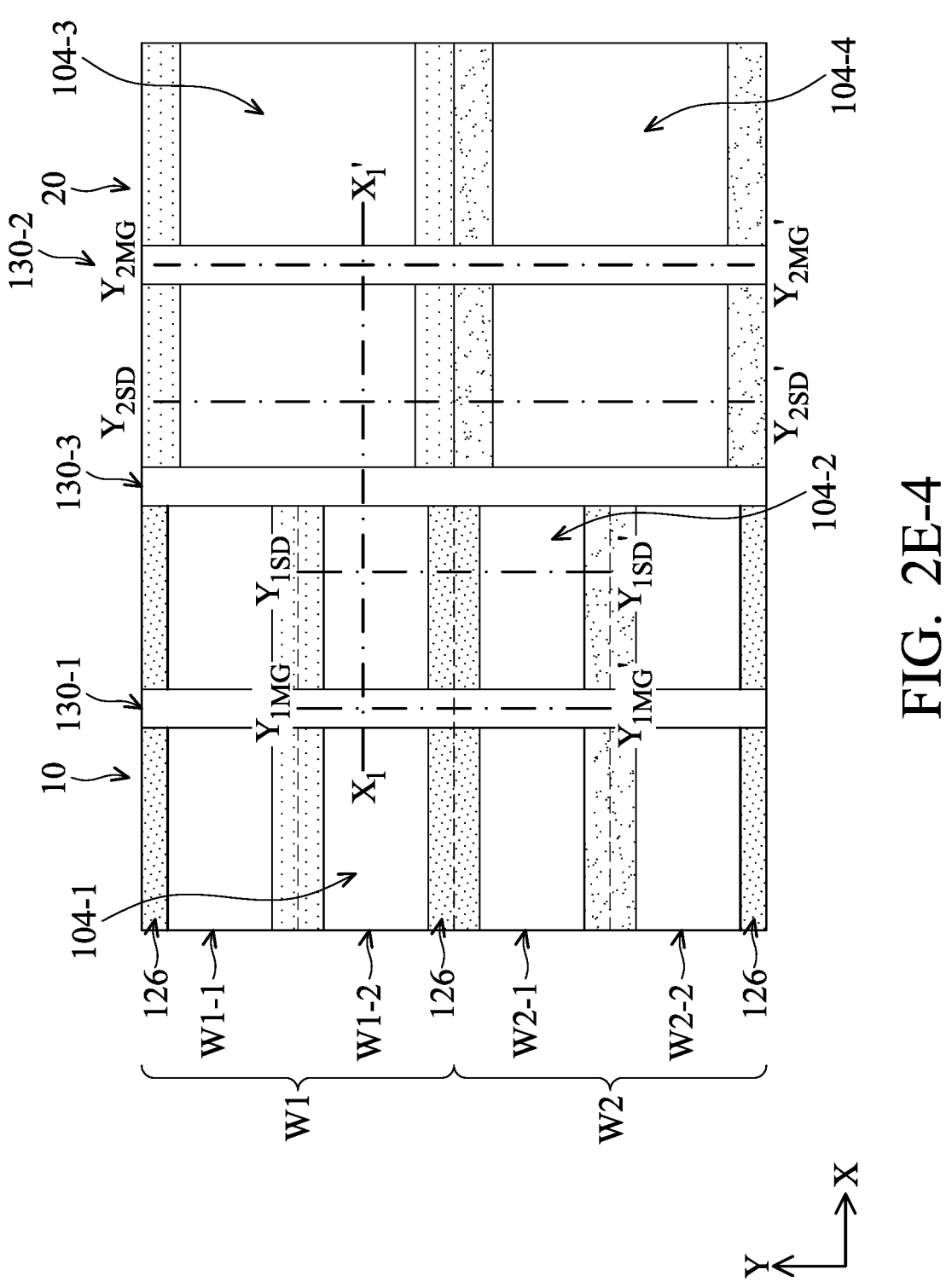
Figures 1, 2, 2F:
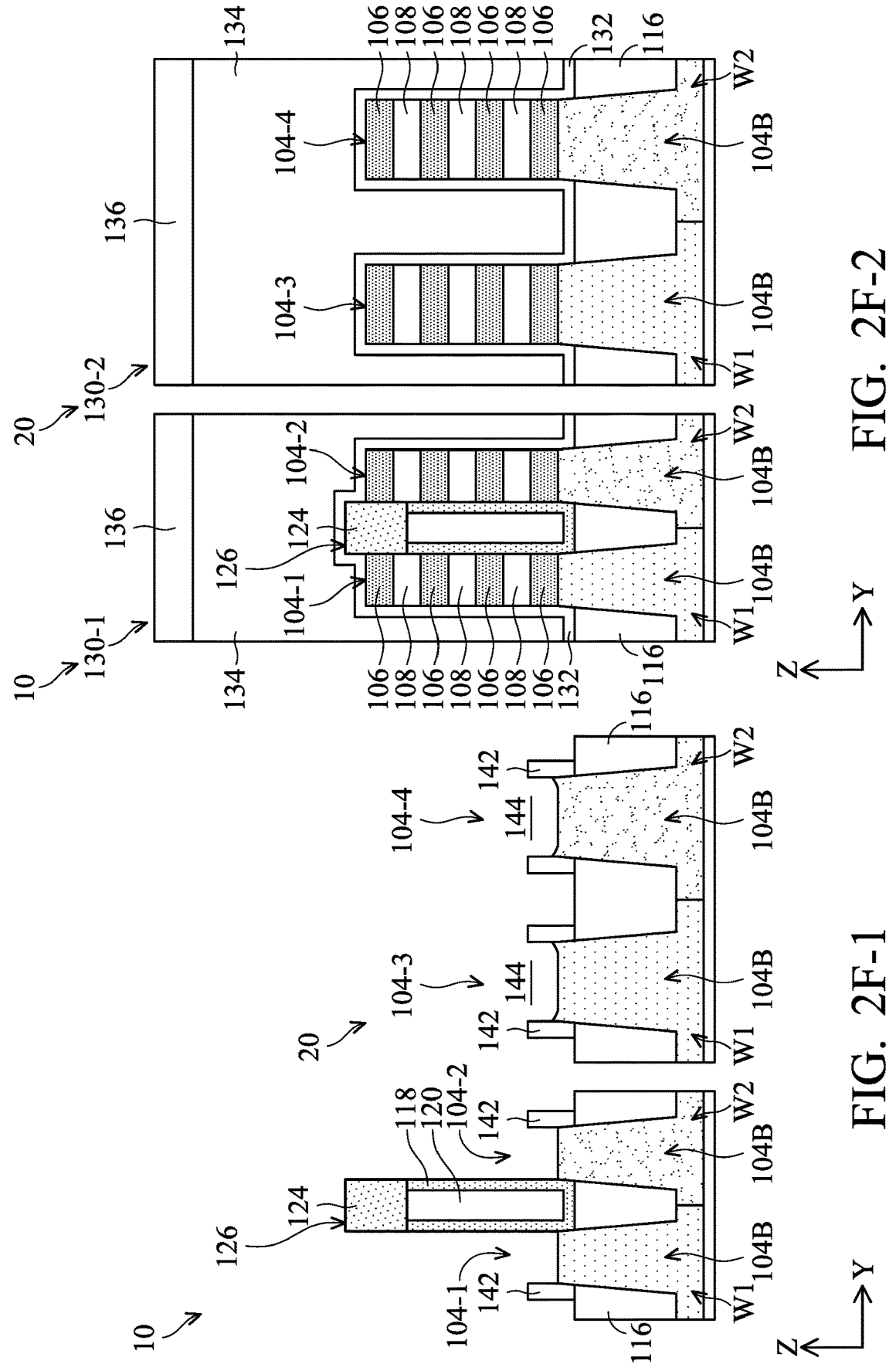
Figures 2, 2F, 3:
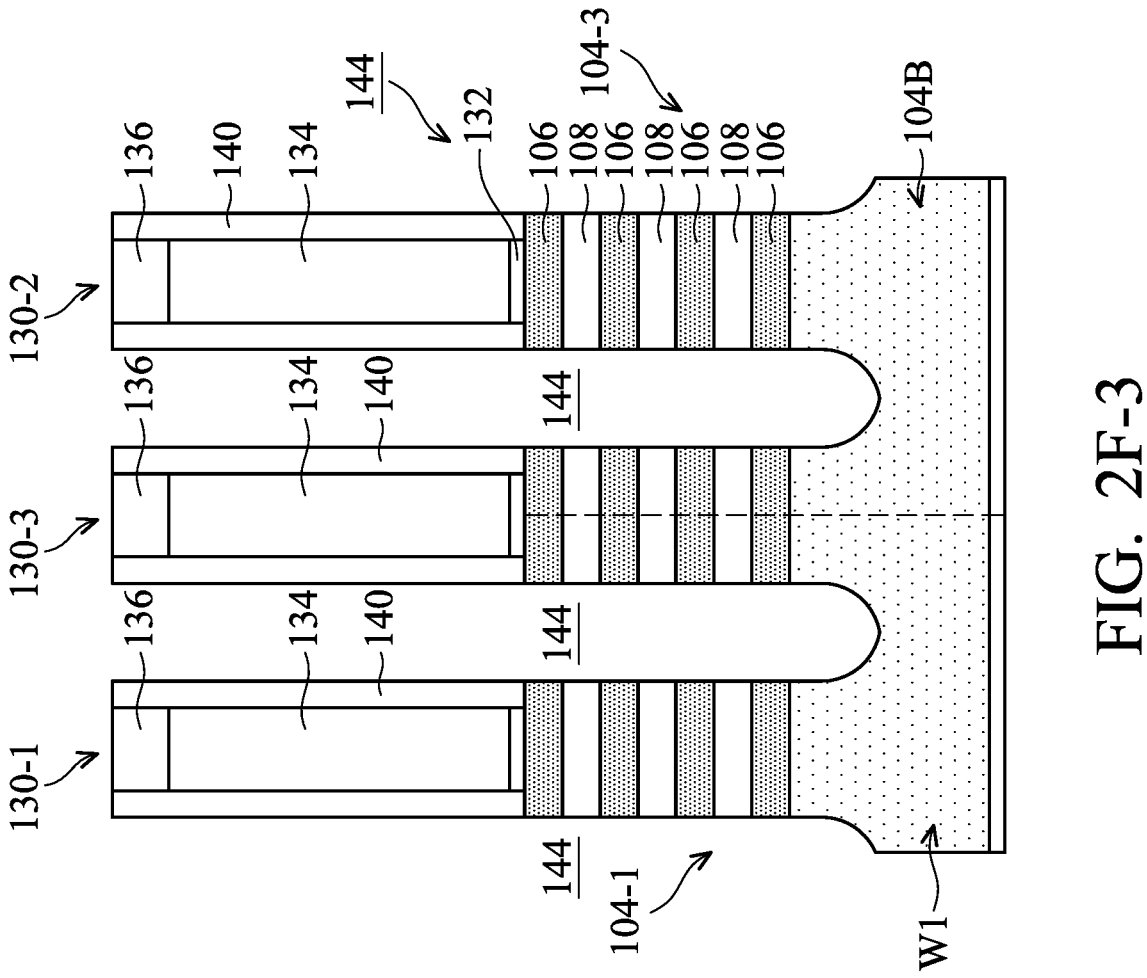
Figures 1, 2, 2G:
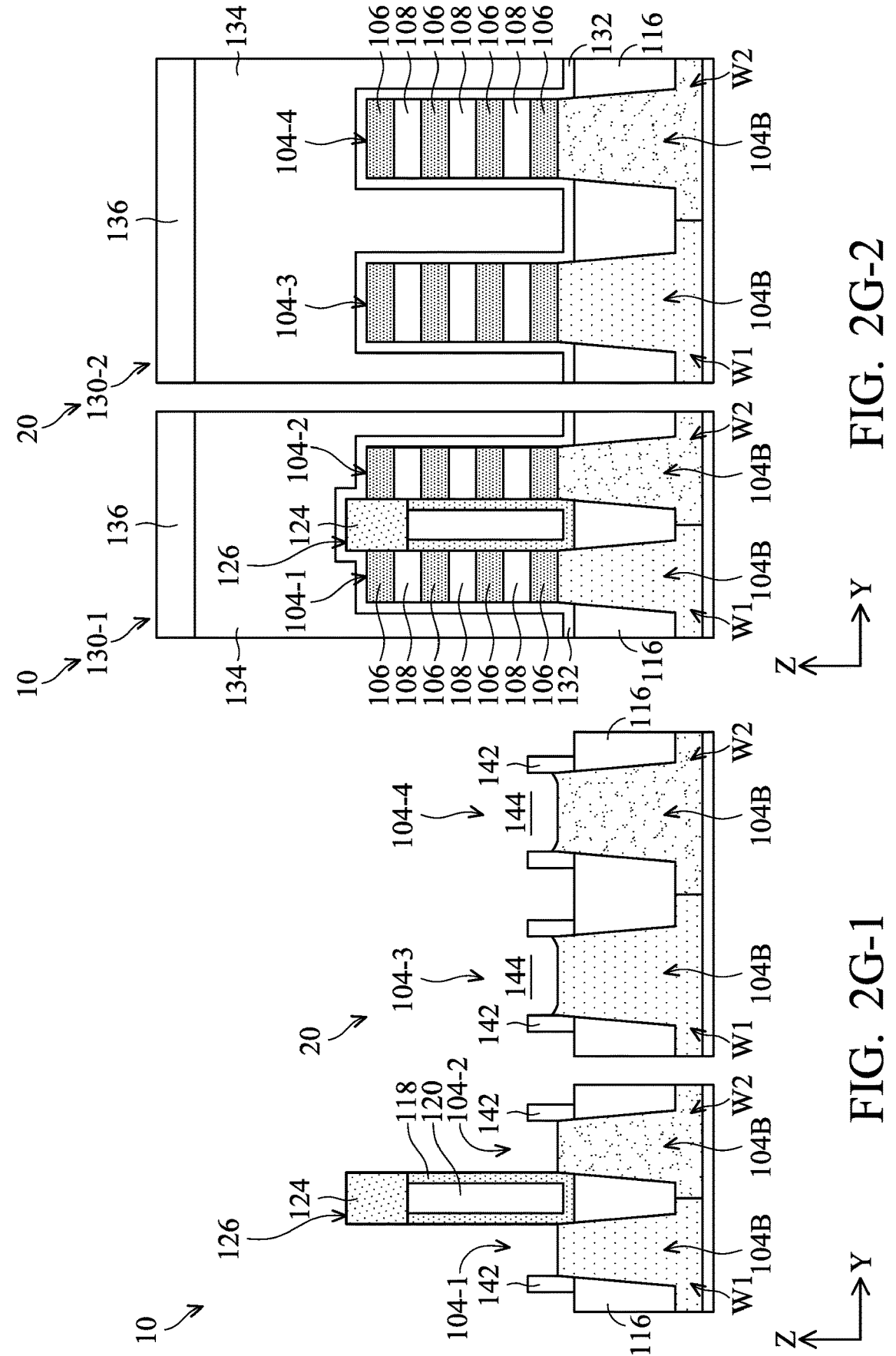
Figures 2, 2G, 3:
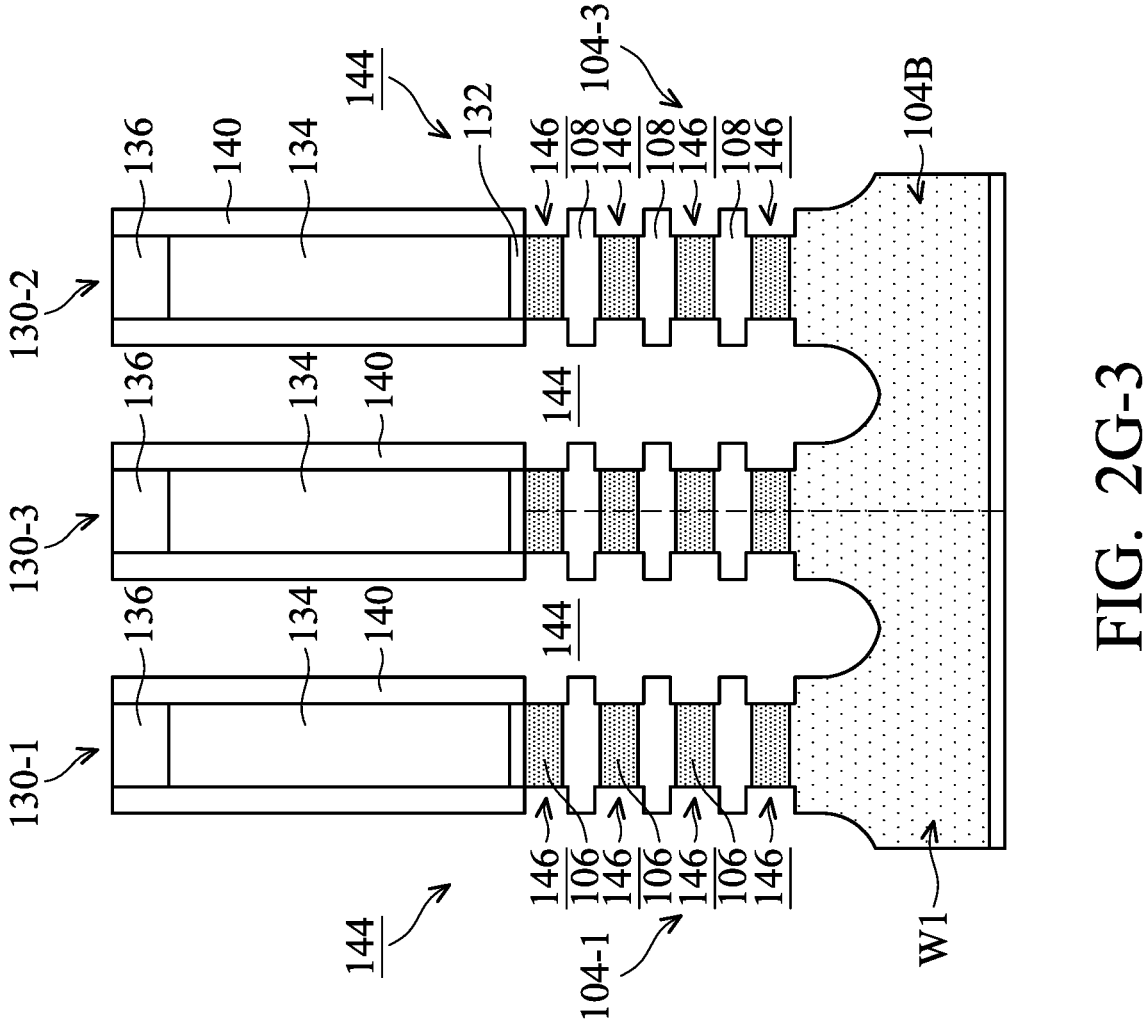
Figures 1, 2, 2H:
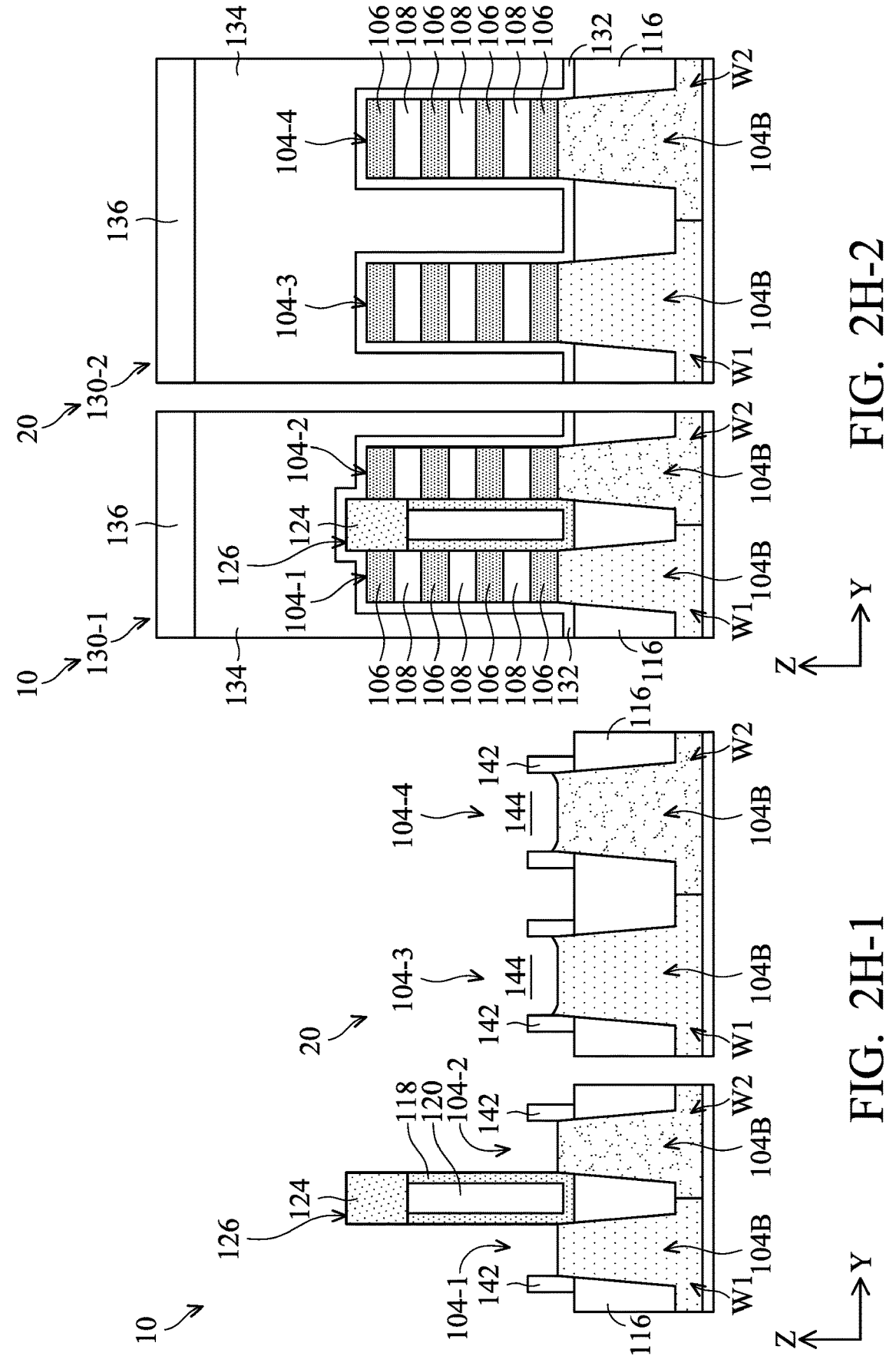
Figures 2, 2H, 3:
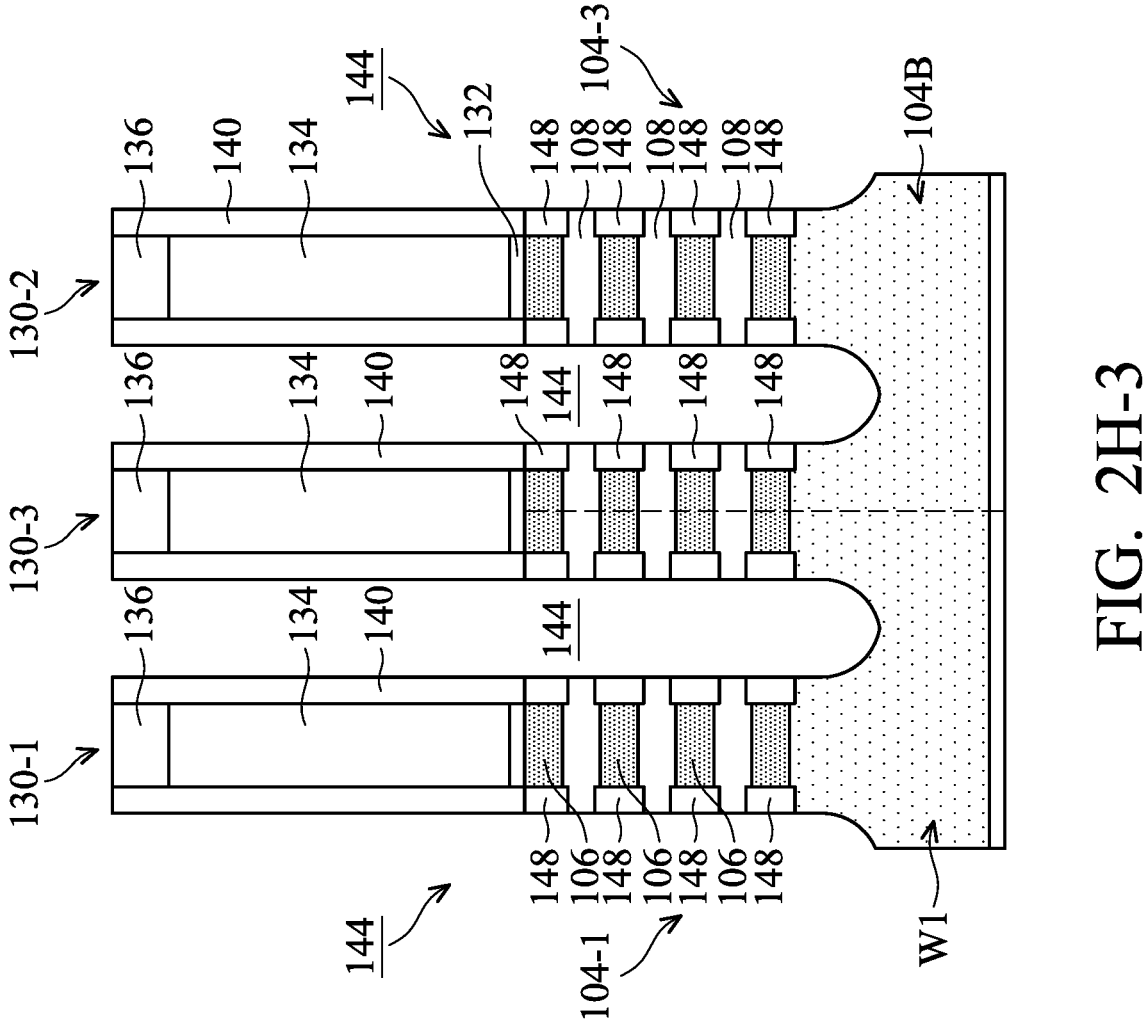
Figures 1, 2, 2I:
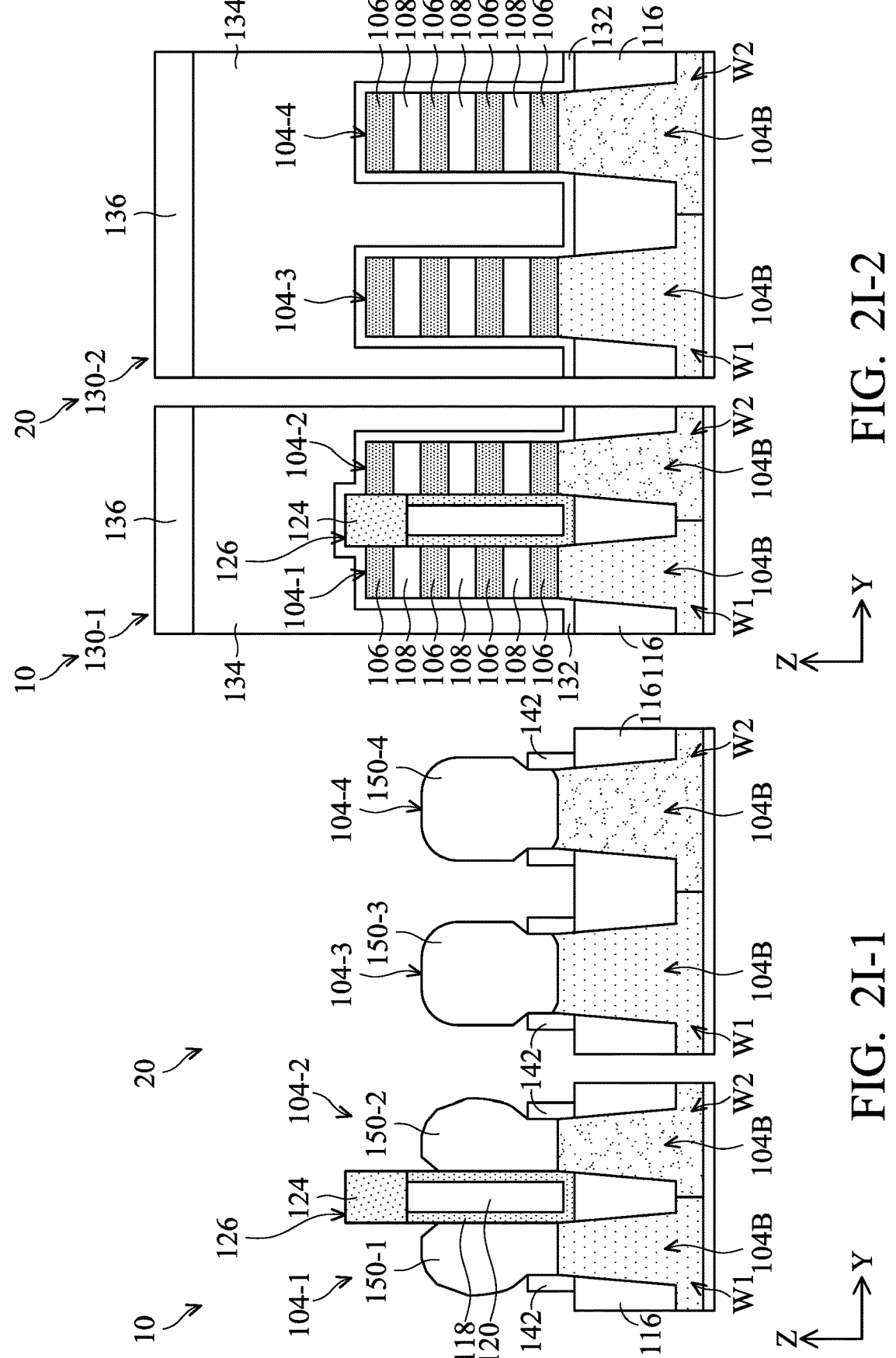
Figures 2, 2I, 3:
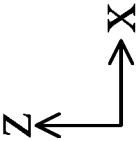

After the source/drain recesses 144 are formed, the first semiconductor material layers 106 exposed by the source/drain recesses 144 are laterally recessed to form notches 146, as shown in FIGS. 2G-1, 2G-2, and 2G-3 in accordance with some embodiments. In some embodiments, an etching process is performed to laterally recess the first semiconductor material layers 106 of the fin structure 104-1, 104-2, 104-3, and 104-4 from the source/drain recesses 144. In some embodiments, during the etching process, the first semiconductor material layers 106 have a greater etching rate (e.g, etching amount) than the second semiconductor material layers 108, thereby forming notches 146 between the adjacent second semiconductor material layers 108. In some embodiments, the second semiconductor material layers 108 are also slightly etched during the etching process, so that the portions of the second semiconductor material layers 108 exposed by the notches 146 become thinner than other portions, as shown in FIG. 2G-3 in accordance with some embodiments. In some embodiments, the etching process is an isotropic etching such as dry chemical etching, remote plasma etching, wet chemical etching, another suitable technique, and/or a combination thereof.

Next, inner spacers 148 are formed in the notches 146 between the second semiconductor material layers 108, as shown in FIGS. 2H-1, 2H-2, and 2H-3 in accordance with some embodiments. The inner spacers 148 may be configured to separate the source/drain structures and the gate structures formed in subsequent manufacturing processes. As described previously, since the second semiconductor material layers 108 are also partially etched when forming the notches 146, the inner spacers 148 formed in the notches 146 are thicker than the thicknesses of the first semiconductor material layers 106 in accordance with some embodiments. In addition, the inner spacers 148 have curve sidewalls in accordance with some embodiments. In some embodiments, the inner spacers 148 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 148 are formed, source/drain structures 150-1, 150-2, 150-3, and 150-4 are formed in the source/drain recesses 144 of the fin structures 104-1, 104-2, 104-3, and 104-4 respectively, as shown in FIGS. 2I-1, 2I-2, and 2I-3 in accordance with some embodiments. The source/drain structures described below may refer to a source or a drain, individually or collectively dependent upon the context.

In some embodiments, the source/drain structures 150-1 and 150-2 and the source/drain structures 150-3 and 150-4 have different shapes. More specifically, the source/drain structures 150-1 and 150-2 are formed over the fin structures 104-1 and 104-2 and are sandwiched between one fin spacer 142 and the dielectric wall structure 126 with the dielectric wall structure 126 being higher than the fin spacer 142 in accordance with some embodiments. Therefore, the source/drain structures 150-1 and 150-2 have asymmetry shapes in the cross-sectional view in the Y direction in accordance with some embodiments. Each of the source/drain structures 150-1 and 150-2 may have a first side and a second side opposite the first side and has a substantially straight sidewall at the second side and a curved sidewall at the first side in accordance with some embodiments. The substantially straight sidewall at the second side may be in direct contact with the dielectric wall structure 126, and the curved sidewall at the first side extends laterally outside the outer sidewalls of the fin spacer 142 in accordance with some embodiments.

On the other hand, the source/drain structures 150-3 and 150-4 are formed over the fin structures 104-3 and 104-4 and are sandwiched between the fin spacers 142 in accordance with some embodiments. Since both sides of the source/drain structures 150-3 and 150-4 are confined by the fin spacers 142, the source/drain structures 150-3 and 150-4 have substantially symmetry shapes in the cross-sectional view along the Y direction in accordance with some embodiments.

In some embodiments, the top surface of the dielectric wall structure 126 is higher than the topmost portions of the source/drain structures 150-1, 150-2, 150-3, and 150-4. In some embodiments, the topmost portions of the source/drain structures 150-3 and 150-4 are higher than the topmost portions of the source/drain structures 150-1 and 150-2. In some embodiments, the source/drain structures 150-1, 150-2, 150-3, and 150-4 are all substantially the same height. In addition, since the fin structures 104-1 and 104-2 are narrower than the fin structures 104-3 and 104-4, the source/drain structures 150-1 and 150-2 are also narrower than the source/drain structures 150-3 and 150-4 in accordance with some embodiments.

In some embodiments, the source/drain structures 150-1, 150-2, 150-3, and 150-4 are formed using an epitaxial growth process, such as MBE, MOCVD, VPE, other applicable epitaxial growth process, or a combination thereof. In some embodiments, the source/drain structures 150-1, 150-2, 150-3, and 150-4 are made of any applicable material, such as Ge, Si, GaAs, AlGaAs, SiGe, GaAsP, SiP, SiC, SiCP, or a combination thereof. In some embodiments, the source/drain structures 150-1, 150-2, 150-3, and 150-4 are in-situ doped during the epitaxial growth process. For example, the source/drain structures 150-1, 150-2, 150-3, and 150-4 may be the epitaxially grown SiGe doped with boron (B). For example, the source/drain structures 150-1, 150-2, 150-3, and 150-4 may be the epitaxially grown Si doped with carbon to form silicon: carbon (Si: C) source/drain features, phosphorous to form silicon: phosphor (Si: P) source/drain features, or both carbon and phosphorous to form silicon carbon phosphor (SiCP) source/drain features. In some embodiments, the source/drain structures 150-1, 150-2, 150-3, and 150-4 are doped in one or more implantation processes after the epitaxial growth process.

After the source/drain structures 150-1, 150-2, 150-3, and 150-4 are formed, a contact etch stop layer (CESL) 160 is conformally formed to cover the source/drain structures 150-1, 150-2, 150-3, and 150-4, and an interlayer dielectric (ILD) layer 162 is formed over the contact etch stop layers 160, as shown in FIGS. 2J-1, 2J-2, and 2J-3 in accordance with some embodiments. In some embodiments, the contact etch stop layer 160 is in direct contact with the sidewalls of the dielectric shell layers 118 and the top surface of the cap layer 124 of the dielectric wall structures 126.

In some embodiments, the contact etch stop layer 160 is made of a dielectric materials, such as silicon nitride, silicon oxide, silicon oxynitride, another suitable dielectric material, or a combination thereof. The dielectric material for the contact etch stop layers 160 may be conformally deposited over the semiconductor structure by performing CVD, ALD, other application methods, or a combination thereof.

The interlayer dielectric layer 162 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 162 may be formed by chemical vapor deposition (CVD), physical vapor deposition, (PVD), atomic layer deposition (ALD), or other applicable processes.

Figures 1, 2, 2J:
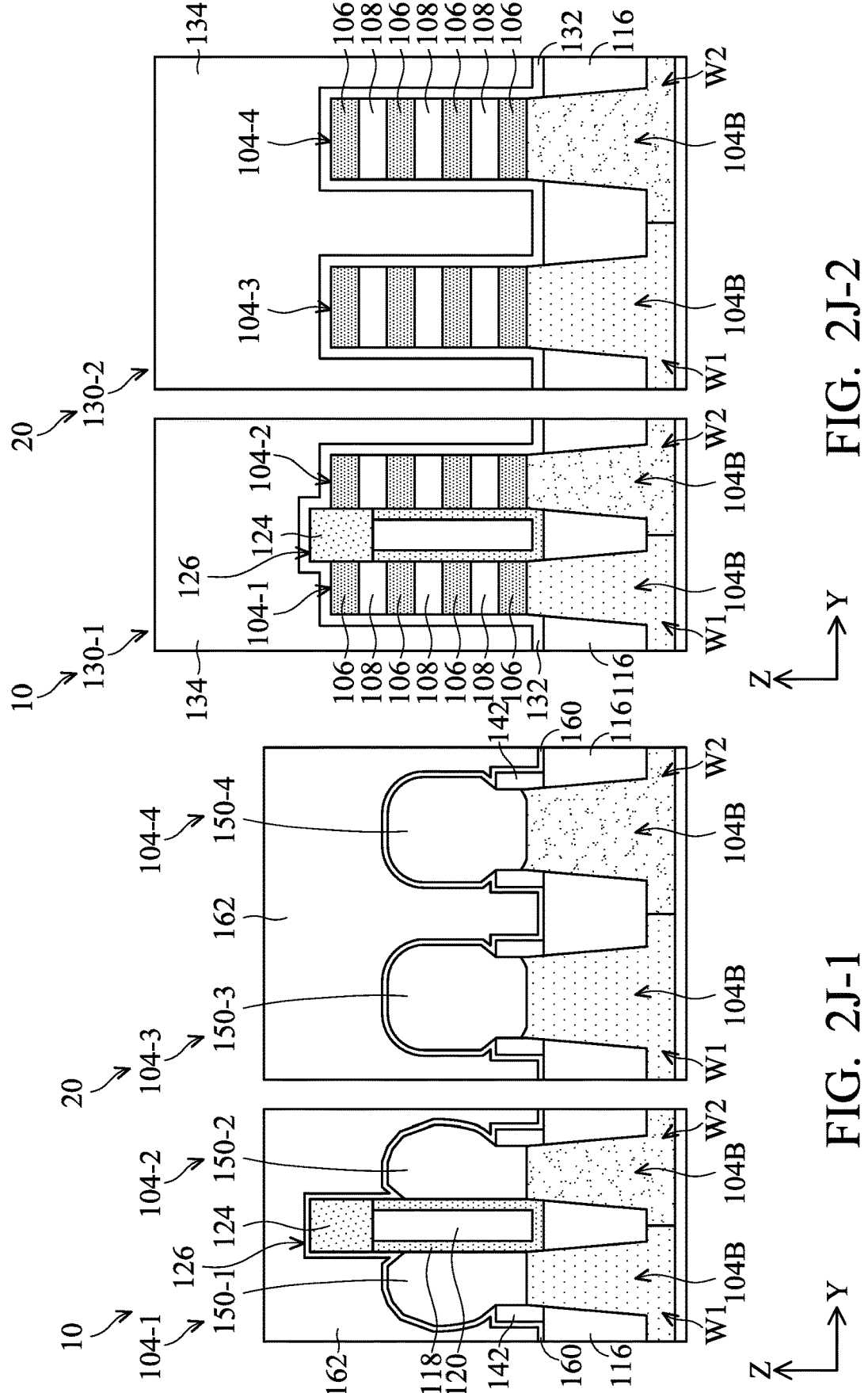
Figures 2, 2J, 3:
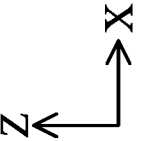

After the contact etch stop layer 160 and the interlayer dielectric layer 162 are deposited, a planarization process such as CMP or an etch-back process is performed until the dummy gate electrode layer 134 is exposed, as shown in FIGS. 2J-2 and 2J-3 in accordance with some embodiments.

Next, the dummy gate structures 130-1, 130-2, and 130-3 and the first semiconductor material layers 106 of the fin structures 104-1, 104-2, 104-3, and 104-4 are removed to form gate trenches 166-1, 166-2, and 166-3, as shown in FIGS. 2K-1, 2K-2, and 2K-3 in accordance with some embodiments. FIG. 2K-4 illustrates a top view of the intermediate stage of manufacturing the semiconductor structure 100 in the step shown in FIGS. 2K-1, 2K-2, and 2K-3 in accordance with some embodiments. More specifically, the dummy gate structures 130-1, 130-2, and 130-3 and the first semiconductor material layers 106 are removed to form channel structures (e.g. nanostructures) 108'-1, 108'-2, 108'-3, and 108'-4 with the second semiconductor material layers 108 of the fin structures 104-1, 104-2, 104-3, and 104-4 respectively in accordance with some embodiments. Although not shown in the figures, the channel structures 108'-1, 108'-2, 108'-3, and 108'-4 and the base fin structures 104B may have rounded corners.

The removal process may include one or more etching processes. For example, when the dummy gate electrode layer 134 is made of polysilicon, a wet etchant such as a tetramethylammonium hydroxide (TMAH) solution may be used to selectively remove the dummy gate electrode layer 134. Afterwards, the dummy gate dielectric layer 132 may be removed using a plasma dry etching, a dry chemical etching, and/or a wet etching. The first semiconductor material layers 106 may then be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

During the removal of the first semiconductor material layers 106, the first semiconductor material layers 106 of the fin structures 104-3 and 104-4 may be removed from both sidewalls of the fin structures 104-3 and 104-4. However, the first semiconductor material layers 106 of the fin structures 104-1 and 104-2 can only be removed from one side of the fin structures 104-1 and 104-2, since another side of the fin structures 104-1 and 104-2 are attached to the dielectric wall structure 126. Therefore, the removal of the first semiconductor material layers 106 for the fin structures 104-1 and 104-2 may be more difficult than that for the fin structures 104-3 and 104-4. Accordingly, the fin structures 104-1 and 104-2 may be relatively narrow, compared to the fin structures 104-3 and 104-4, so that the first semiconductor material layers 106 of the fin structures 104-1 and 104-2 may be fully removed. On the other hand, since the first semiconductor material layers 106 of the fin structures 104-3 and 104-4 may be removed from both sides of the fin structures 104-3 and 104-4, the widths of the fin structures 104-3 and 104-4 may be relatively wide.

Figures 1, 2, 2K:
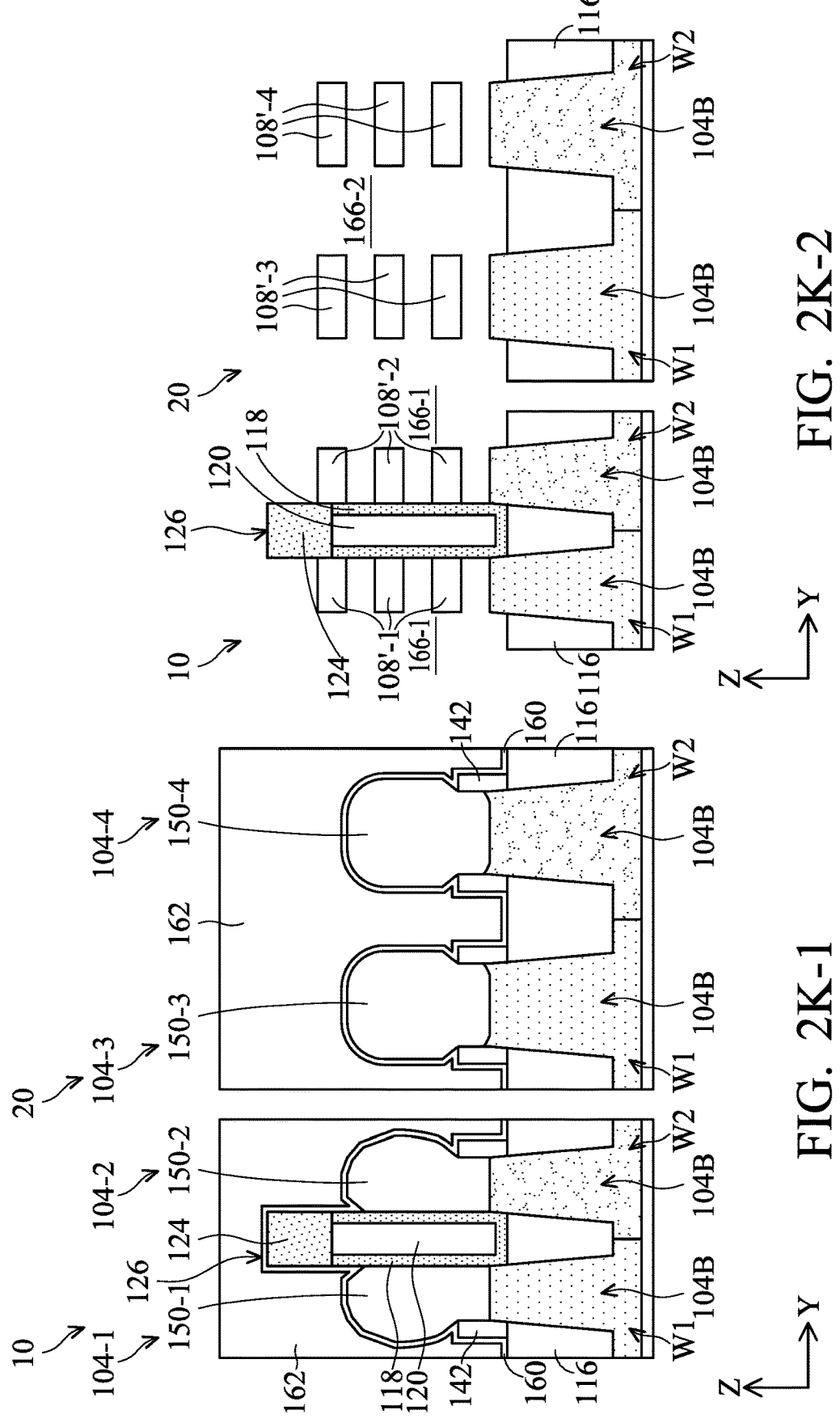
Figures 2, 2K, 3, 4:
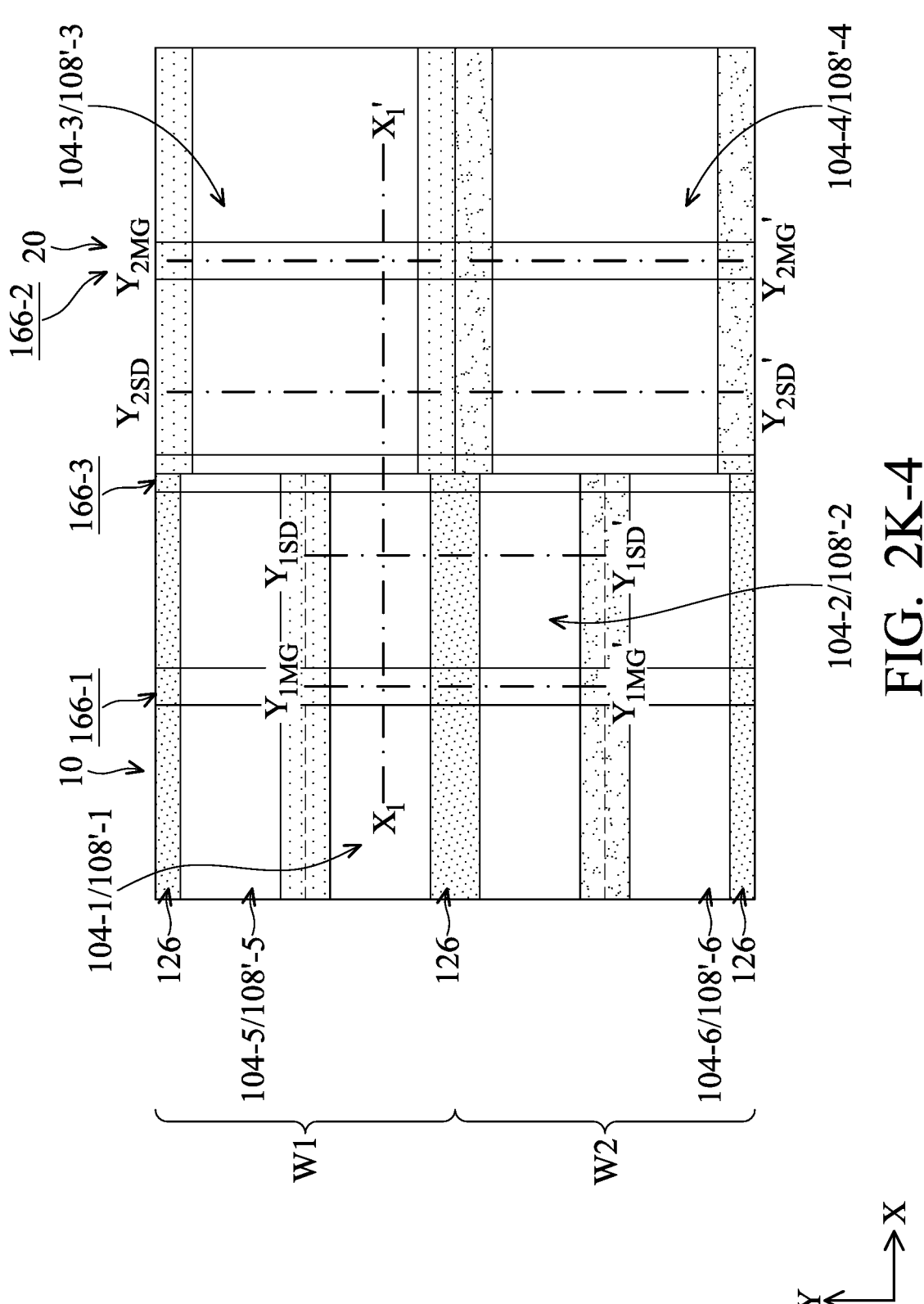
Figures 1, 2, 2L:
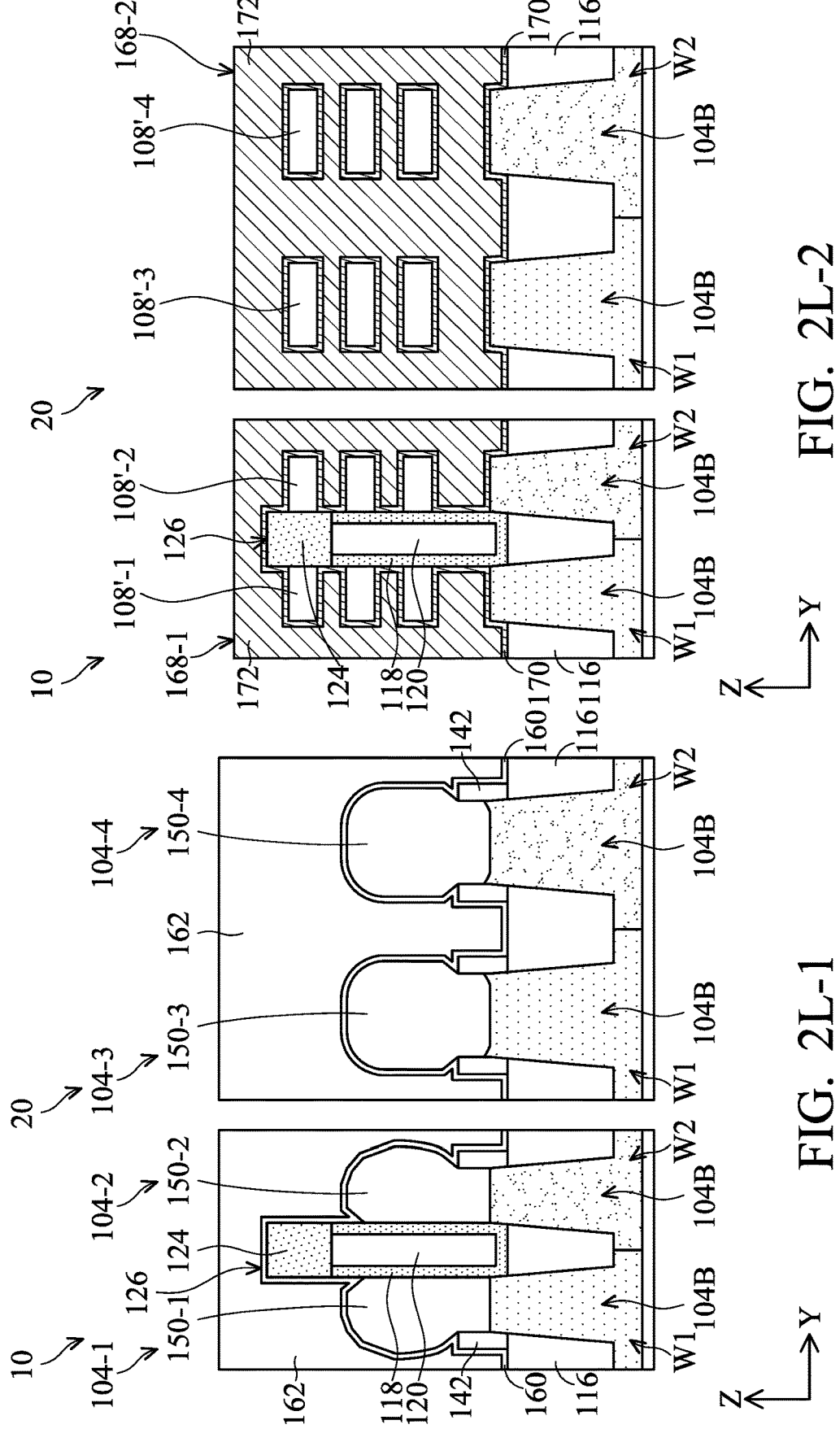
Figures 2, 2L, 3, 4:
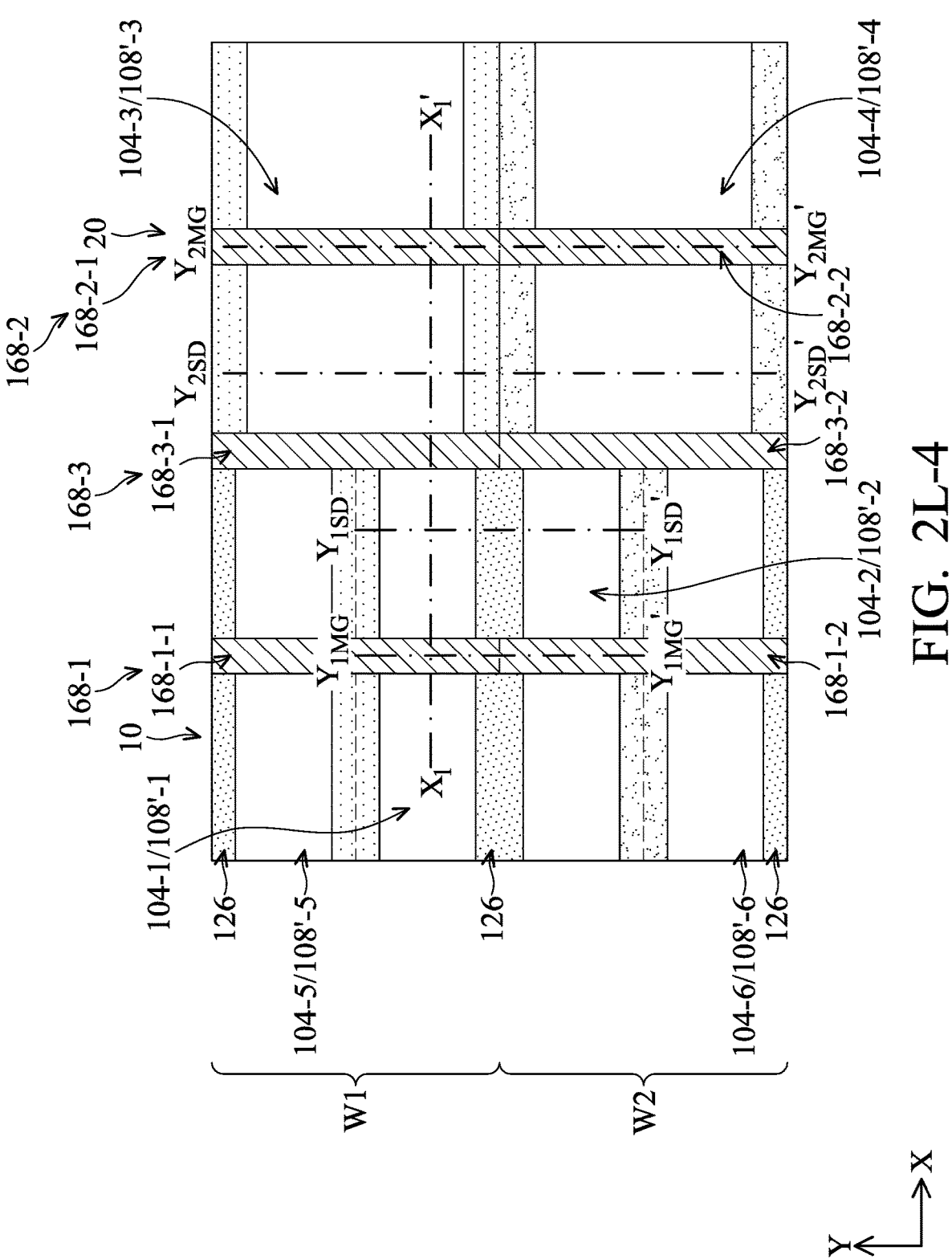
Figures 1, 2, 2M:
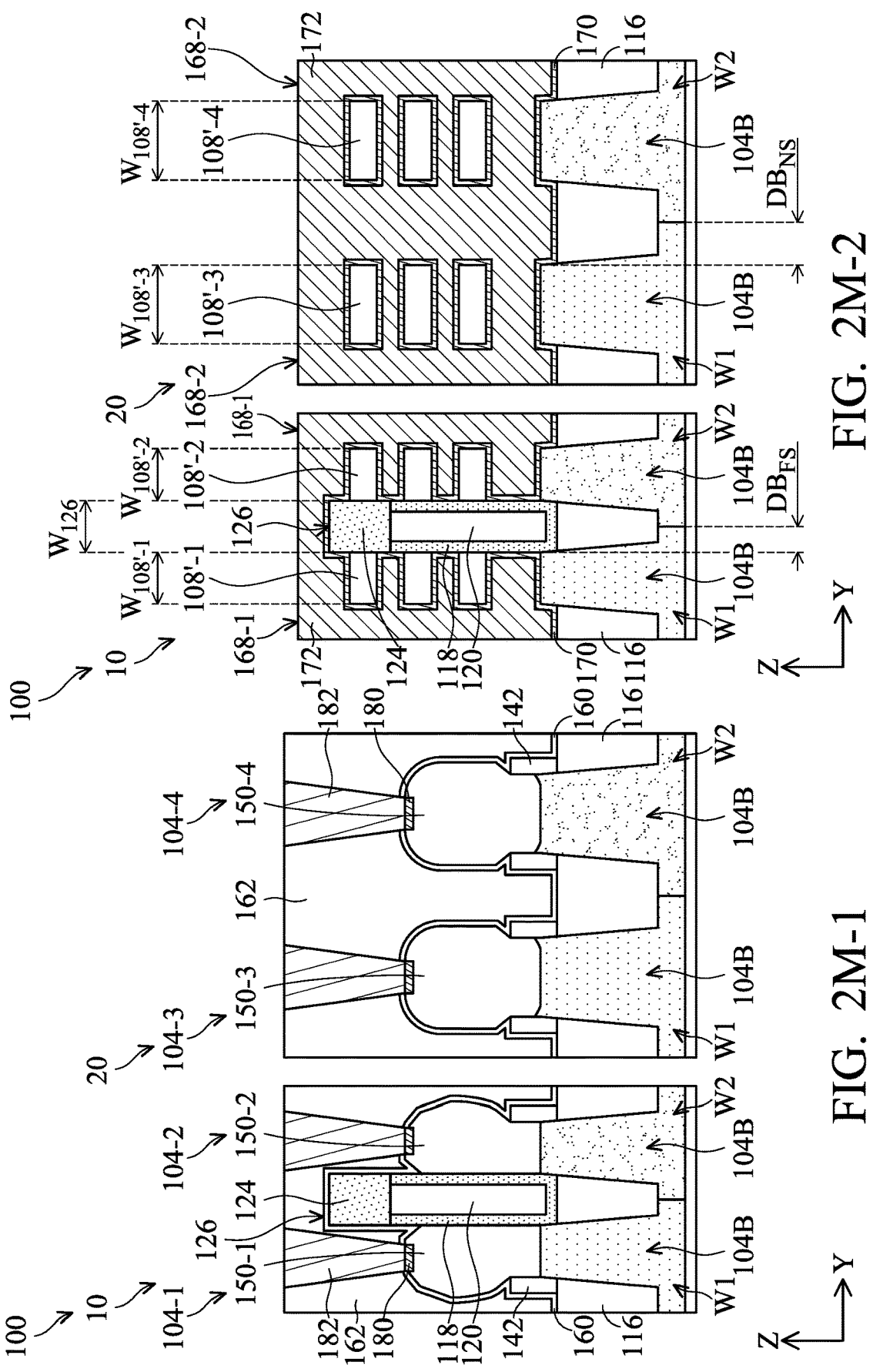
Figures 2, 2M, 3:
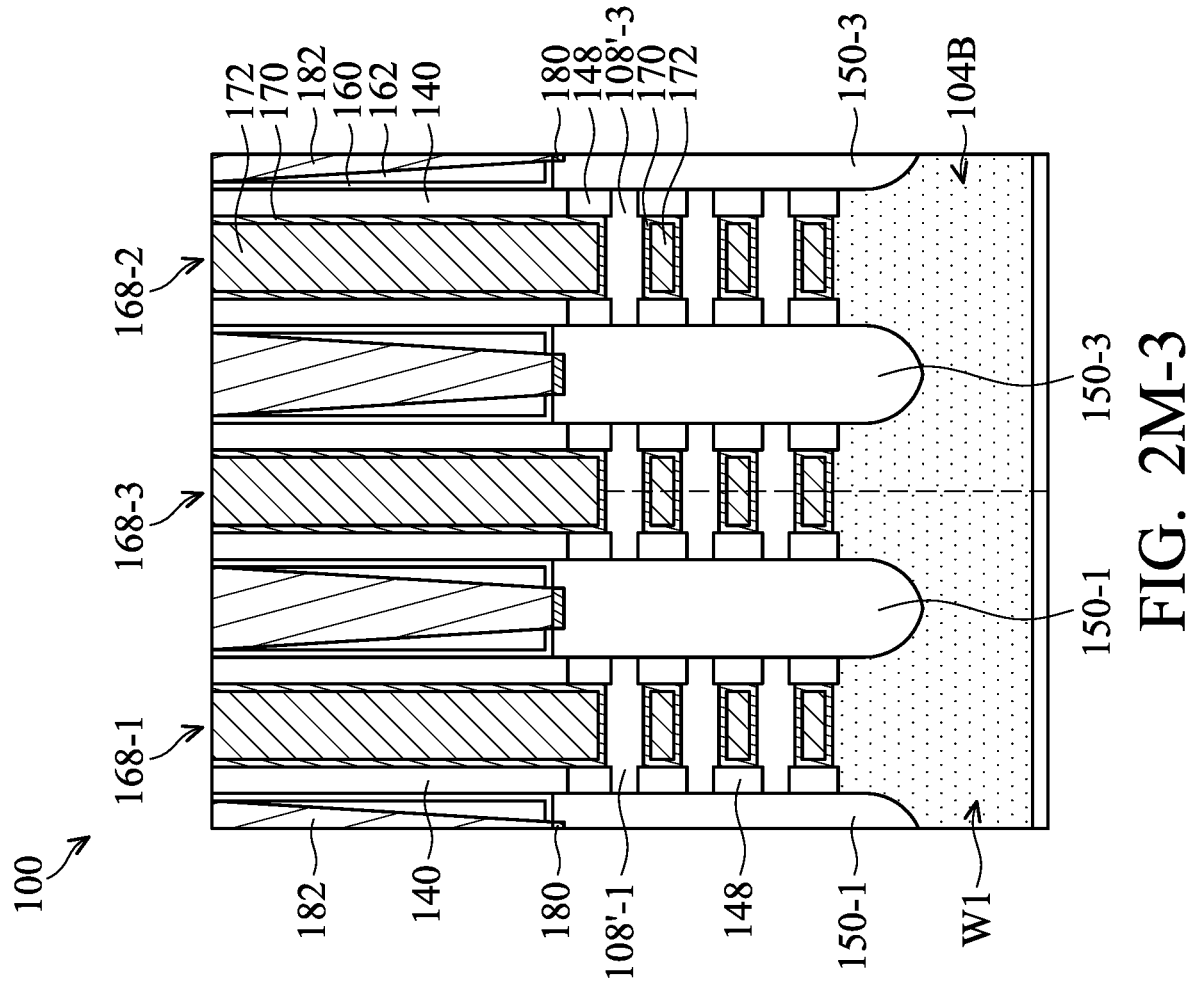
Figures 2, 2M, 3, 4:
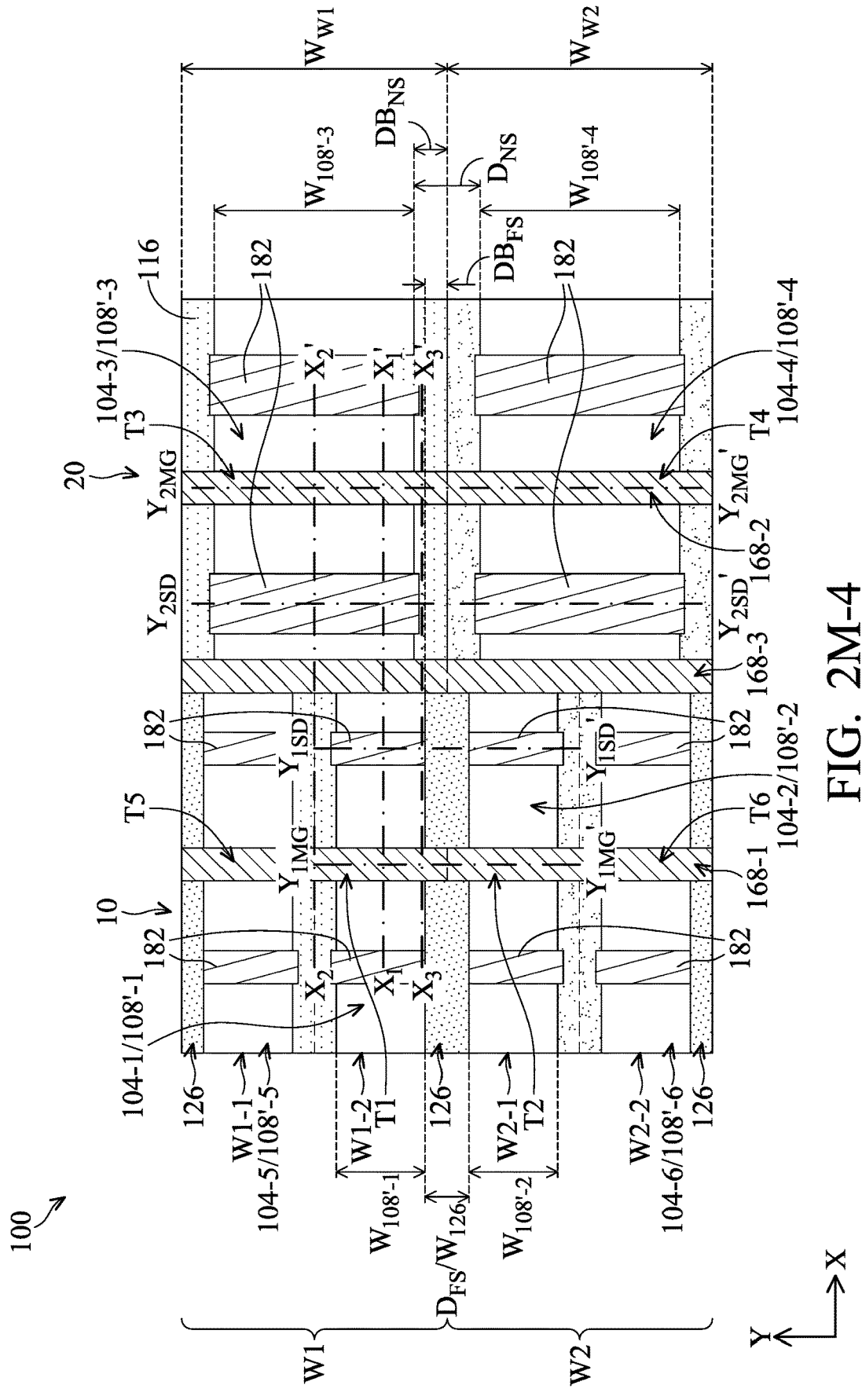

As shown in FIG. 2K-2, the channel structures 108'-1, 108'-2, 108'-3, and 108'-4 are vertically suspended and spaced apart from each other in the Z direction in accordance with some embodiments. In addition, the top surface, the bottom surface, and the two sidewalls of each of the channel structures 108'-3 and 108'-4 in the channel region are fully exposed by the gate trench 166-2 in accordance with some embodiments. On the other hand, although the top surface and the bottom surface of each of the channel structures 108'-1 and 108'-2 are also exposed by the gate trench 166-1, only one sidewall of each of the channel structures 108'-1 and 108'-2 is exposed by the gate trench 166-1 in the cross-sectional view along the Y direction in accordance with some embodiments. More specifically, one sidewall of each of the channel structures 108'-1 and 108'-2 is laterally attached to a sidewall surface of the dielectric wall structure 126 and is not exposed by the gate trench 166-1 in accordance with some embodiments. Meanwhile, the portions of the sidewall of the dielectric wall structure 126 not attached to the channel structures 108'-1 and 108'-2 are exposed by the gate trench 166-1 in accordance with some embodiments. The first semiconductor material layers 106 of the fin structures 104-5 and 104-6 may also be removed to form nanostructures 108'-5 and 108'-6, which may have the same structures with the nanostructures 108'-1 and 108'-2.

Next, gate structures 168-1, 168-2, and 168-3 are formed in the gate trenches 166-1, 166-2, and 166-3, as shown in FIGS. 2L-1, 2L-2, and 2L-3 in accordance with some embodiments. FIG. 2L-4 illustrates a top view of the intermediate stage of manufacturing the semiconductor structure 100 in the step shown in FIGS. 2L-1, 2L-2, and 2L-3 in accordance with some embodiments. The gate structures 168-1, 168-2, and 168-3 are longitudinally oriented along the Y direction.

In some embodiments, each of the gate structures 168-1, 168-2, and 168-3 includes a gate dielectric layer 170 and a gate stack 172. Interfacial layers (not shown) may also be formed around the channel structures 108'-1, 108'-2, 108'-3, and 108'-4 and on the exposed portions of the base fin structure 104B. In some embodiments, the interfacial layers are oxide layers formed by performing a thermal process.

In some embodiments, the gate dielectric layers 170 are conformally formed in the gate trenches 166-1, 166-2, and 166-3. In some embodiments, the gate dielectric layers 170 wrap around the channel structures 108'-1, 108'-2, 108'-3, and 108'-4 and cover the sidewalls of the dielectric shell layer 118 and the top surface of the cap layer 124 of the dielectric wall structure 126 in accordance with some embodiments.

In some embodiments, the gate dielectric layers 170 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layers 170 are formed using CVD, ALD, other applicable methods, or a combination thereof.

In some embodiments, the gate stacks 172 are formed over the gate dielectric layers 170. In some embodiments, the gate stacks 172 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate stacks 172 are formed using CVD, ALD, electroplating, another applicable method, or a combination thereof.

In some embodiments, the gate structures 168-1, 168-2, and 168-3 include different conductive layers in different portions. For example, portions 168-1-1, 168-2-1, and 168-3-1 of the gate structures 168-1, 168-2, and 168-3 over the first well region W1 may include a first type of work function metal layers, and portions 168-1-2, 168-2-2, and 168-3-2 of the gate structures 168-1, 168-2, and 168-3 over the second well region W2 may include a second type of work function metal layers. In some embodiments, the first well region W1 is an N-type well region, the second well region W2 is a P-type well region, the portions 168-1-1, 168-2-1, and 168-3-1 include P-type metal layers, and the portions 168-1-2, 168-2-2, and 168-3-2 include N-type metal layers. In some other embodiments, the first well region W1 is a P-type well region, the second well region W2 is an N-type well region, the portions 168-1-1, 168-2-1, and 168-3-1 include N-type metal layers, and the portions 168-1-2, 168-2-2, and 168-3-2 include P-type metal layers.

For example, a first type of work function metal layers may first be formed in the gate trenches 166-1, 166-2, and 166-3, and then the portions of the first type of work function metal layers formed over the second well region W2 may be removed. Next, a second type of work function metal layers may be formed in the gate trenches 166-1, 166-2, and 166-3, and a gate electrode layers may be formed over the second type of work function metal layers. Afterwards, a planarization process, such as CMP, may be performed until the interlayer dielectric layer 162 is exposed, thereby forming the gate structures 168-1, 168-2, and 168-3. In some other embodiments, the portions of the second type of metal layers over the first well region W1 are removed before forming the gate electrode layer.

After the gate structures 168-1, 168-2, and 168-3 are formed, silicide layers 180 and source/drain contacts 182 are formed over the source/drain structures 150-1, 150-2, 150-3, and 150-4, as shown in FIGS. 2M-1, 2M-2, and 2M-3 in accordance with some embodiments. FIG. 2M-4 illustrates the top view of the semiconductor structure 100 in accordance with some embodiments. FIG. 2M-5 illustrates the cross-sectional view of the semiconductor structure 100 shown along lines $X_2$-$X_2'$ (i.e. in the X direction) in FIG. 2M-4 in accordance with some embodiments. FIG. 2M-6 illustrates the cross-sectional view of the semiconductor structure 100 shown along lines $X_3$-$X_3'$ (i.e. in the X direction) in FIG. 2M-4 in accordance with some embodiments.

More specifically, contact trenches may be formed through the contact etch stop layer 160 and the interlayer dielectric layer 162 to expose the source/drain structures 150-1, 150-2, 150-3, and 150-4. Afterwards, the silicide layers 180 are formed over the exposed portions of the source/drain structures 150-1, 150-2, 150-3, and 150-4, and the source/drain contacts 182 are formed in the contact trenches over the silicide layers 180, as shown in FIGS. 2M-1, 2M-3, 2M-4, 2M-5, and 2M-6 in accordance with some embodiments.

The silicide layers 180 may be formed by forming a metal layer over the top surface of the source/drain structures 150-1, 150-2, 150-3, and 150-4 and annealing the metal layer so the metal layer reacts with the source/drain structures 150-1, 150-2, 150-3, and 150-4 to form the silicide layers 180. The unreacted metal layer may be removed after the silicide layers 180 are formed.

In some embodiments, the source/drain contacts 182 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contacts 182 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described previously, the semiconductor structure 100 includes the first well region W1 and the second well region W2, and the first well region W1 and the second well region W2 are longitudinally oriented along the X direction and are adjoined with each other in the Y direction.

In the first region 10, the channel structures 108'-1 and 108'-5 are formed in the first well region W1 and the channel structures 108'-2 and 108'-6 are formed in the second well region W2 in accordance with some embodiments. In the second region, the channel structures 108'-3 is formed in the first well region W1 and the channel structures 108'-4 is formed in the second well region W2 in accordance with some embodiments. In some embodiments, the channel structures 108'-1, 108'-2, 108'-3, and 108'-4 are spaced apart from the boundary between the first well region W1 and the second well region W2.

In addition, the dielectric wall structures 126 are formed over the boundary of the first well region W1 and the second well region W2 in the first region 10 and partially cover both the first well region W1 and the second well region W3, as shown in FIGS. 2M-1, 2M-2, and 2M-4 in accordance with some embodiments. The dielectric wall structures 126 may be configured to separate neighboring channel structures 108'-1 and 108'-2, and the structures may be referred as forksheet structures. Since the channel structures 108'-1 and 108'-2 are separated by the dielectric wall structure 126, the distance between the channel structures 108'-1 and 108'-2 may be relatively small. On the other hand, the channel structures 108'-3 and 108'-4 without the dielectric wall structures 126 formed between them may be referred as nanosheet structures for clarity.

In some embodiments, the distance $D_{NS}$ between the channel structures 108'-3 and 108'-4 is greater than the distance $D_{FS}$ between the channel structures 108'-1 and 108'-2 (i.e. the width $W_{126}$ of the dielectric wall structure 126) in the Y direction. In some embodiments, the channel structure 108'-3 and/or channel structure 108'-4 is spaced a distance $DB_{NS}$ apart from the boundary of the first well region W1 and the second well region W2, the channel structure 108'-1 and/or 108'-2 is spaced a distance $DB_{FS}$ apart from the boundary of the first well region W1 and the second well region W2, and the distance $DB_{NS}$ is greater than the distance $DB_{FS}$, as shown in FIG. 2M-2.

The gate structure 168-1 abuts channel structures 108'-1, 108'-2, 108'-5, and 108'-6 to form transistors T1, T2, T5, and T6, respectively, and the gate structures 168-2 abut the channel structures 108'-3 and 108'-4 to form transistors T3 and T4, respectively, in accordance with some embodiments. Meanwhile, the gate structure 168-3 may be a dummy gate structure without an actual electrical function. In some embodiments, a portion 168-3-1 of the gate structure 168-3 surrounds and makes direct contact with the end portions of the channel structures 108'-3, as shown in FIG. 2M-5. Similarly, a portion 168-3-2 of the gate structure 168-3 surrounds and makes direct contact with the end portions of the channel structures 108'-1, as shown in FIG. 2M-6 in accordance with some embodiments. In addition, since the sidewalls of the channel structures 108'-1 and 108'3 are not aligned in the X direction, some portion of the gate structure 168-1 is located over isolation structure 116 in the cross-sectional view shown in FIGS. 2M-5 and the portion of the gate structure 168-2 is located over isolation structure 116 in the cross-sectional view shown in FIG. 2M-6 in accordance with some embodiments.

In some embodiments, the first region 10 of the first well region W1 and the second well region W2 may be seem as a first unit, the second region 20 of the first well region W1 and the second well region W2 may be seem as a second unit, and the first unit and the second unit substantially have the same size. In some embodiments, the amount of the transistors formed in the first unit is greater than the amount of the transistors formed in the second unit. In some embodiments, four transistors T1, T2, T5, and T6 can be formed in the first region 10, while two transistors T3 and T4 are formed in the second unit.

In some embodiments, the width $W_{W1}$ of the first well region W1 is substantially equal to the width $W_{W2}$ of the second well region W2. In some embodiments, the width $W_{108'-1}$ of the channel structures 108'-1 is substantially equal to the width $W_{108'-2}$ of the channel structures 108'-2. In some embodiments, the width $W_{108'-3}$ of the channel structures 108'-3 is substantially equal to the width $W_{108'-4}$ of the channel structures 108'-4.

In some embodiments, the width $W_{W1}$ of the first well region W1 is greater than the width $W_{108'-3}$ of the channel structures 108'-3, the width $W_{108'-3}$ of the channel structures 108'-3 is greater than half of the width $W_{W1}$ of the first well region W1, and half of the width $W_{W1}$ of the first well region W1 is greater than the width $W_{108'-1}$ of the channel structures 108'-1. Similarly, the width $W_{W2}$ of the second well region W2 is greater than the width $W_{108'-4}$ of the channel structures 108'-4, the width $W_{108'-4}$ of the channel structures 108'-4 is greater than half of the width $W_{W2}$ of the second well region W2, and half of the width $W_{W2}$ of the second well region W2 is greater than the width $W_{108'-2}$ of the channel structures 108'-2 in accordance with some embodiments.

In some embodiments, the width $W_{W1}$ of the first well region W1 is greater than the sum of the width $W_{108'-1}$ of the channel structures 108'-1, the width $W_{108'-2}$ of the channel structures 108'-2, and the width $W_{126}$ of the dielectric wall structure 126. In some embodiments, the width $W_{108'-3}$ of the channel structures 108'-3 is greater than two times of the width $W_{108'-1}$ of the channel structures 108'-1. In some embodiments, half of the width $W_{W1}$ of the first well region W1 is greater than the width $W_{108'-1}$ of the channel structures 108'-1.

Since the dielectric wall structures 126 are formed, the channel structures in the forksheet structures may have a greater density, and the size of the device may be decreased. However, during the formation of the forksheet structures (e.g. channel structures 108'-1, 108'-2, 108'-5, and 108'-6), one sides of the fin structures (e.g. the fin structures 104-1, 104-2, 104-5, and 104-6) are attached to the dielectric wall structures 126. Therefore, the first semiconductor material layers 106 of the fin structures need to be removed through the side not attached to the dielectric wall structures 126 (i.e. the processes shown in FIGS. 2K-1, 2K-2, 2K-3, and 2K-4). Accordingly, the channel structures in the forksheet structures may not be too wide, or the removal of the first semiconductor material layers 106 of the fin structures may be challenging.

On the other hand, since the first semiconductor material layers 106 of the fin structures 104-3 and 104-3 may be removed from two sides of the structure, the channel structures 108'-3 and 108'-4 may have a greater width without considering the removal of the first semiconductor material layers 106. Therefore, the resulting transistors T3 and T4 may have improved performance.

Figures 1, 2, 3A:
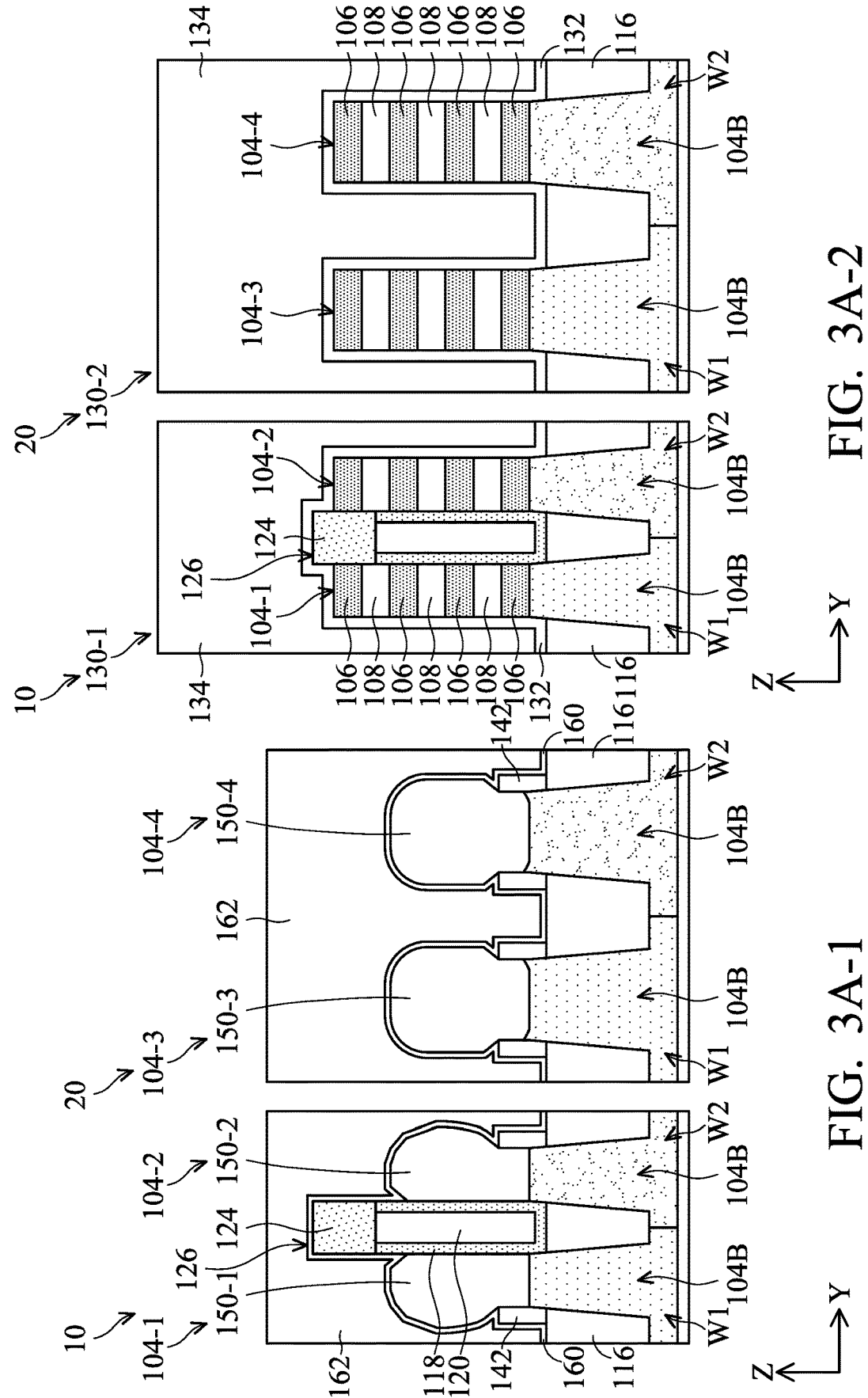
Figures 3, 3A:
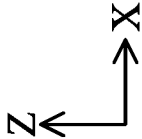
Figures 3, 3A, 4:
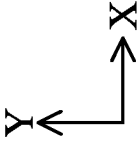
Figures 1, 2, 3B:
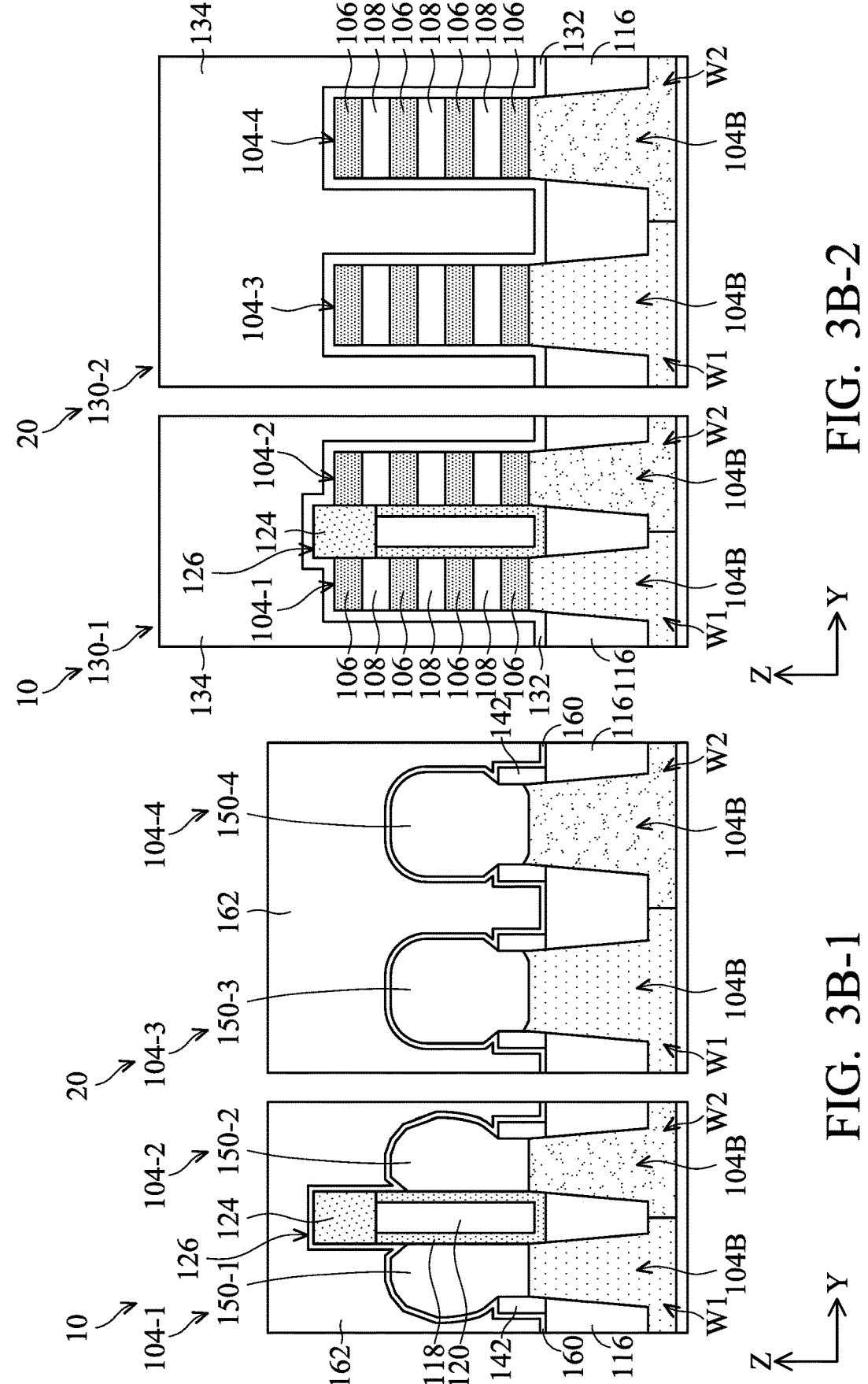
Figures 3, 3B:
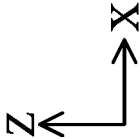
Figures 3, 3B, 4:
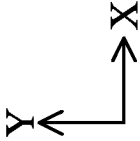
Figures 1, 2, 3C:
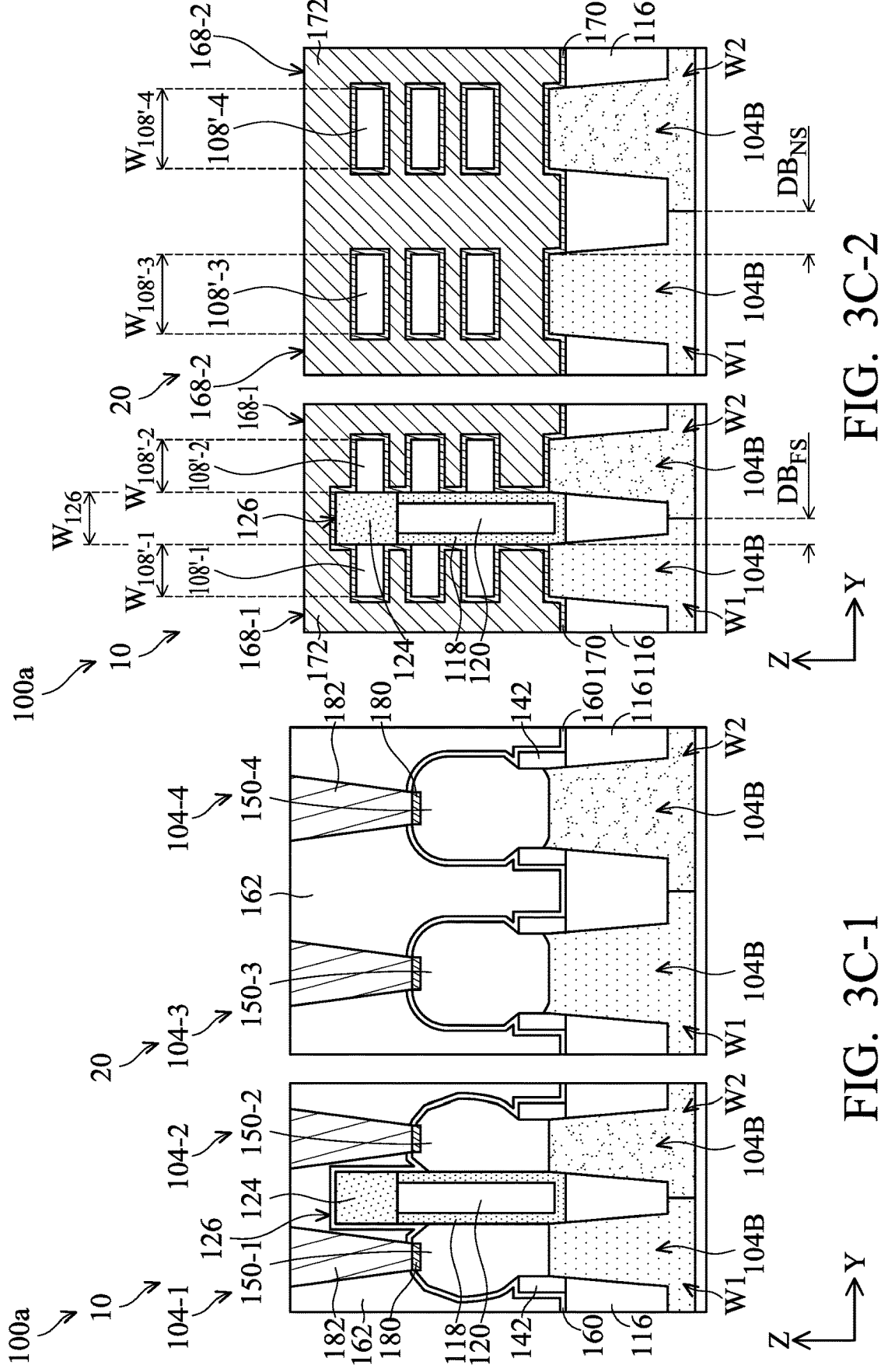
Figures 3, 3C:
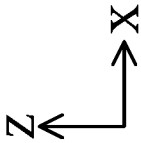
Figures 3, 3C, 4:
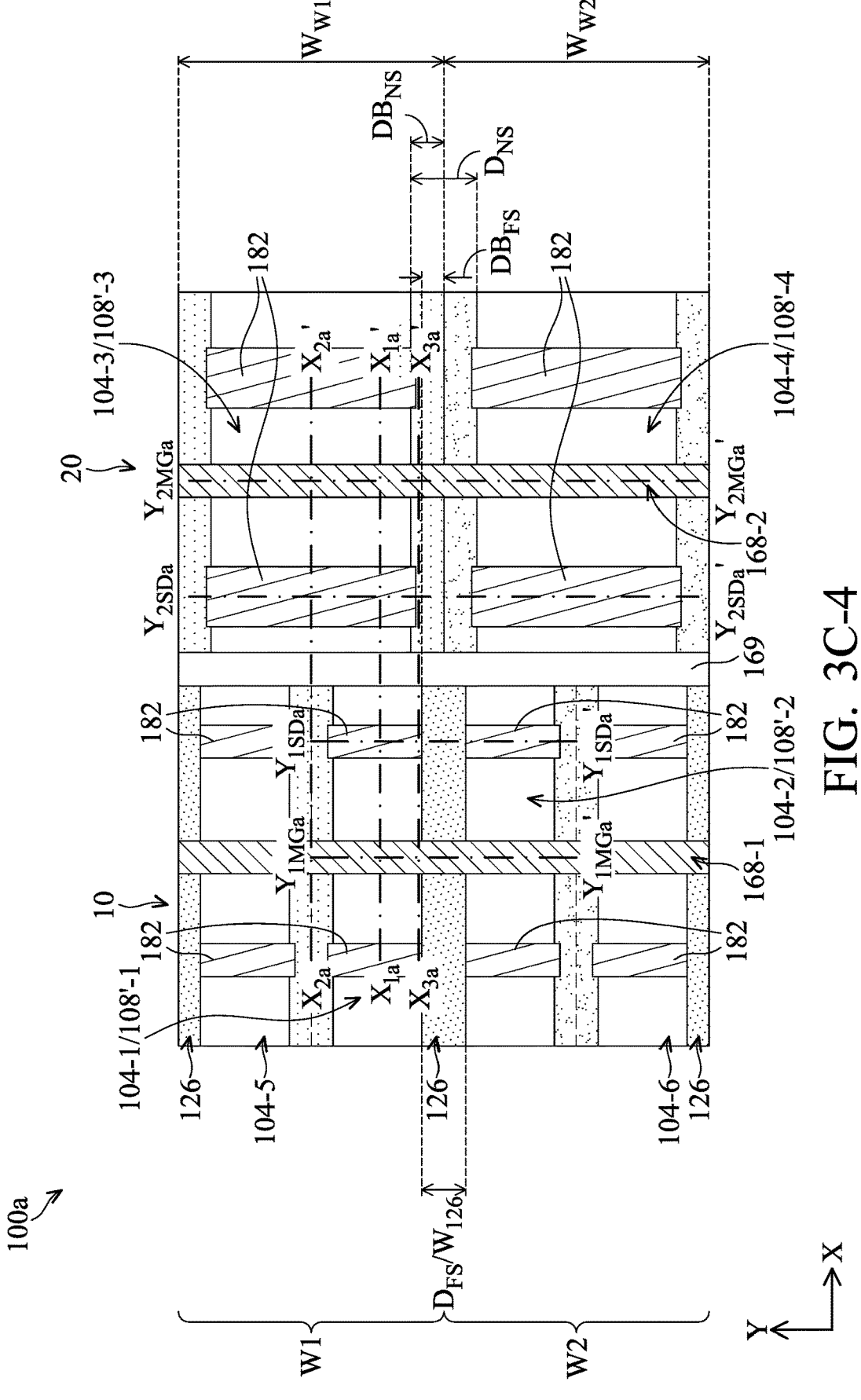

FIGS. 3A-1 to 3C-1, 3A-2 to 3C-2, and 3A-3 to 3C-3 illustrate cross-sectional views of intermediate stages of manufacturing a semiconductor structure 100a in accordance with some embodiments. FIGS. 3A-4 to 3C-4 illustrates the top views of the intermediate stages of manufacturing the semiconductor structure 100a in accordance with some embodiments. More specifically, FIGS. 3A-1 to 3C-1 illustrate the cross-sectional views of the intermediate stages of manufacturing the semiconductor structure 100a shown along lines $Y_{1SDd}$-$Y_{1SDd}'$ (i.e. in the Y direction) and $Y_{2SDa}$-$Y_{2SDa}'$ (i.e. in the Y direction) in FIGS. 3A-4 to 3C-4 in accordance with some embodiments. FIGS. 3A-2 to 3C-2 illustrate the cross-sectional views of the intermediate stages of manufacturing the semiconductor structure 100a shown along lines $Y_{1MGd}$-$Y_{1MGd}'$ (i.e. in the Y direction) and $Y_{2MGa}$-$Y_{2MGa}'$ (i.e. in the Y direction) in FIGS. 3A-4 to 3C-4 in accordance with some embodiments. FIGS. 3A-3 to 3C-3 illustrate the cross-sectional views of the intermediate stages of manufacturing the semiconductor structure 100a shown along lines $X_{1a}$-$X_{1a}'$ (i.e. in the X direction) in FIGS. 3A-4 to 3C-4 in accordance with some embodiments.

The semiconductor structure 100a may be similar to the semiconductor structure 100 described previously, except one of the dummy gate structure (i.e. the dummy gate structure 130-3 shown in FIGS. 2E-1, 2E-2, 2E-3, and 2E-4)

is replaced with a dielectric structure in accordance with some embodiments. Some processes and materials for forming the semiconductor structure 100a may be similar to, or the same as, those for forming the semiconductor structure 100 described previously and are not repeated herein.

More specifically, the processes shown in FIGS. 2A-1 to 2J-1, 2A-2 to 2J-2, and 2A-3 to 2J-3 are performed, and the dummy gate structure 130-3 (as shown in FIGS. 2J-3) is removed to form a gate trench 166a-3, as shown in FIGS. 3A-1, 3A-2, 3A-3, and 3A-4 in accordance with some embodiments. In addition, the first semiconductor material layers 106 and the second semiconductor material layers 108 and some portions of the first well region W1 and the second well region W2 under the dummy gate structure 130-3 are also removed in accordance with some embodiments. As shown in FIG. 3C-3, the inner spacers 148 and portions of the second semiconductor material layers 108 are exposed by the gate trench 166a-3 in accordance with some embodiments. The gate trench 166a-3 may be formed by performing multiple etching processes.

After the gate trench 166a-3 is formed, a dielectric structure 169 is formed in the gate trench 166a-3, as shown in FIGS. 3B-1, 3B-2, 3B-3, and 3B-4 in accordance with some embodiments. The dielectric structure 169 may be formed by depositing a dielectric material in the gate trench 166a-3, and polishing the dielectric material until exposing the dummy gate structures 130-1 and 130-2. The dielectric material may be a low k material, such as $SiO_2$, SiN, SiCN, SiOC, SiOCN, or the like.

Afterwards, the processes shown in FIGS. 2K-1 to 2M-1, 2K-2 to 2M-2, and 2K-3 to 2M-3 are performed to form the semiconductor structure 100a, as shown in FIGS. 3C-1, 3C-2, 3C-3, and 3C-4 in accordance with some embodiments. FIG. 3C-5 illustrates the cross-sectional view of the semiconductor structure 100a shown along line $X_{2a}$-$X_{2a}$' (i.e. in the X direction) in FIG. 3C-4 in accordance with some embodiments. FIG. 3C-6 illustrates the cross-sectional view of the semiconductor structure 100a shown along line $X_{3a}$-$X_{3a}$' (i.e. in the X direction) in FIG. 3C-4 in accordance with some embodiments.

In some embodiments, the bottommost portion of the dielectric structure 169 is lower than the top surfaces of the first well region W1 and the second well region W2. In some embodiments, the bottommost portion of the dielectric structure 169 is higher than the bottom surface of the first well region W1 and the second well region W2 but is lower than the bottom surface of the isolation structure 116, as shown in FIGS. 3C-5 and 3C-6 in accordance with some embodiments. In some other embodiments, the dielectric structure 169 is higher than the bottom surface of the isolation structure 116. In some embodiments, the dielectric structure 169 and the isolation structure 116 are made of different materials.

Since the dielectric structure 169 is formed by replacing the dummy gate structure 130-3, the width W169 of the dielectric structure 169 in the X direction is substantially equal to the widths W168-1 and W168-2 of the gate structures 168-1 and 168-2 in the X direction in accordance with some embodiments. In addition, the top surfaces of the dielectric structure 169 and the gate structures 168-1 and 168-2 are substantially level with each other, while the bottom surface of the dielectric structure 169 is lower than the bottom surfaces of the gate structures 168-1 and 168-2.

Figure 4A:
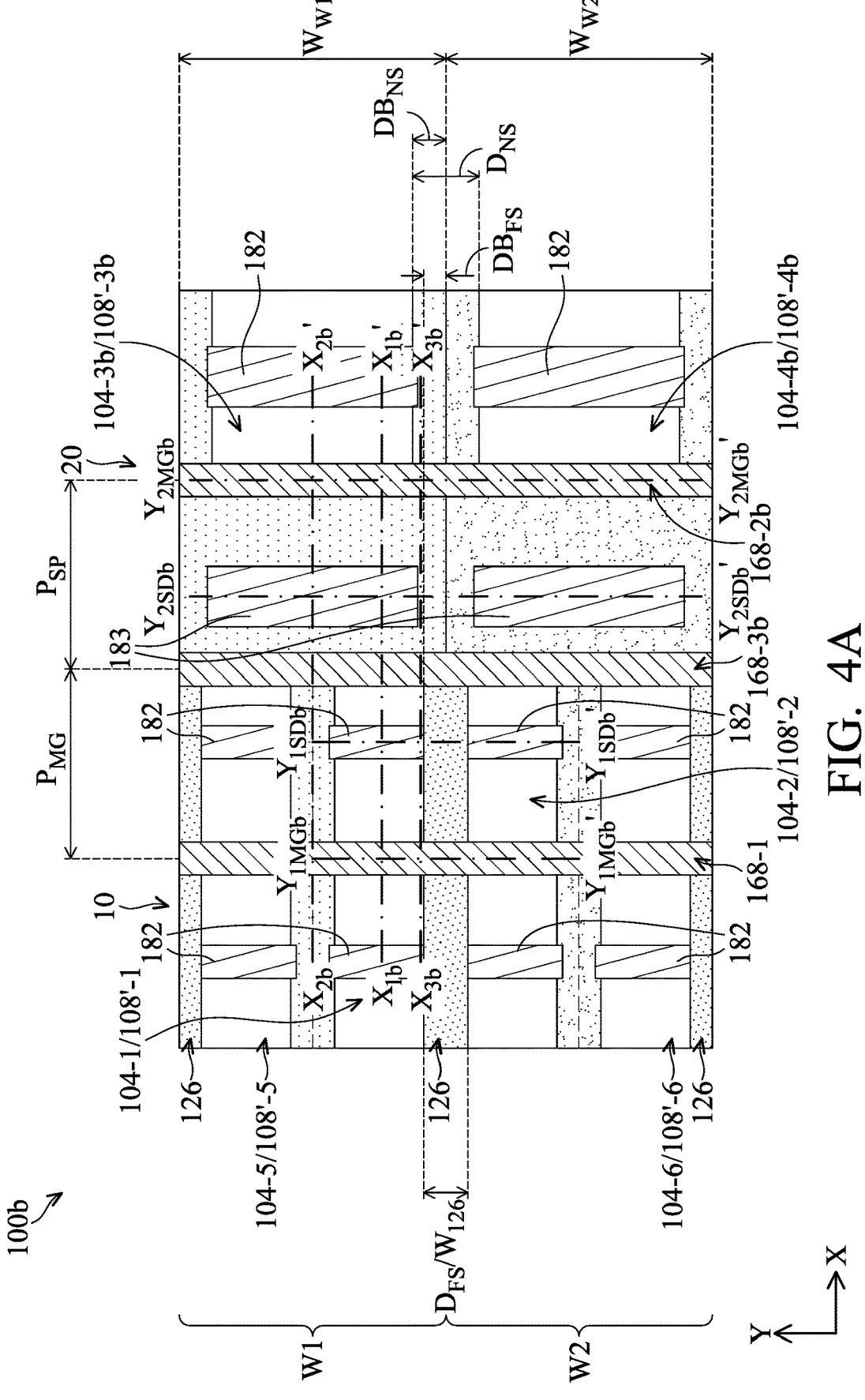
FIG. 4A illustrates a top view of a semiconductor structure in accordance with some embodiments.
Figures 4B, 4C:
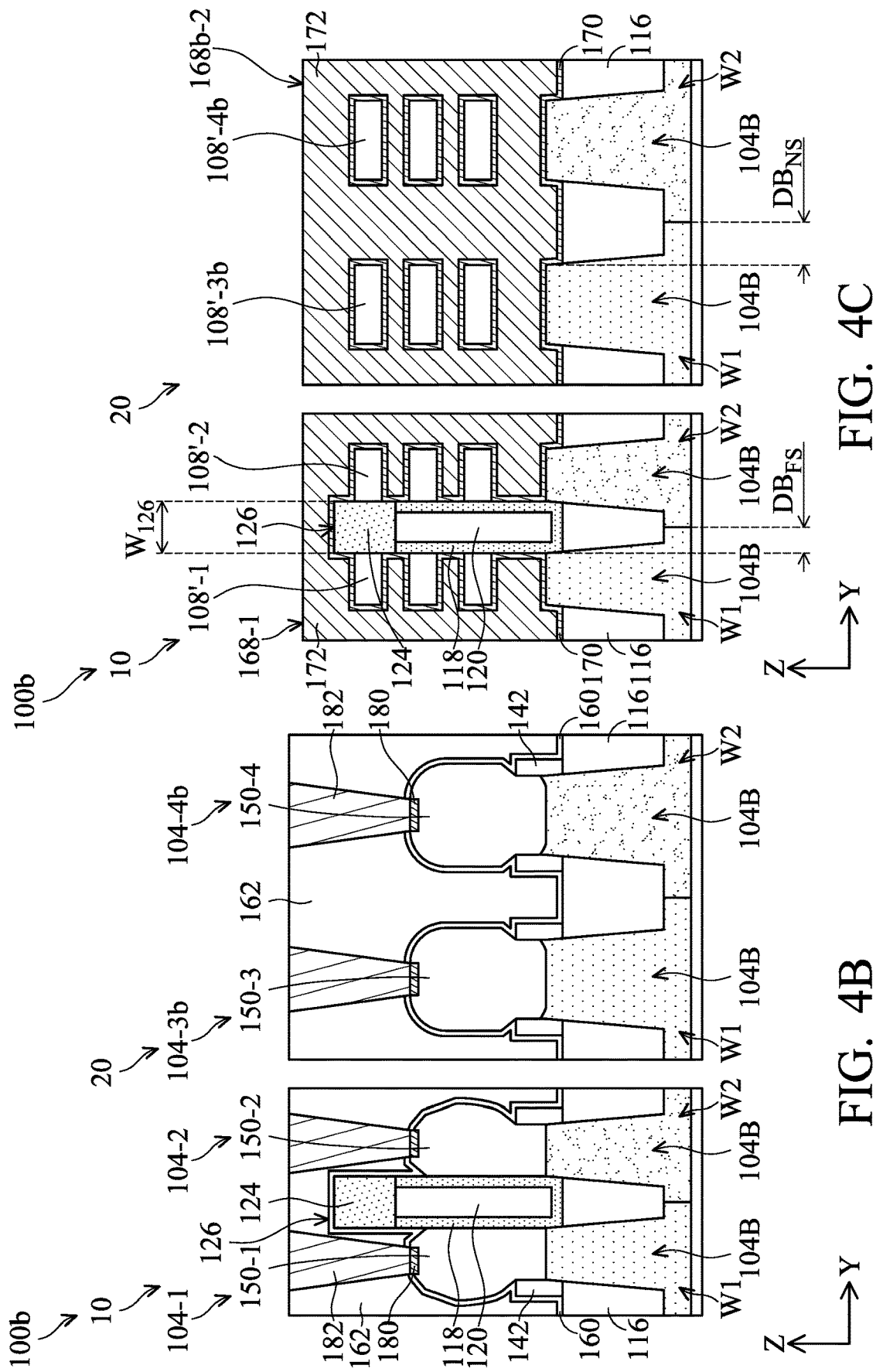
FIG. 4B illustrates a cross-sectional view of the semiconductor structure shown along lines $Y_{1SDb}$-$Y_{1SDb}$' and $Y_{2SDb}$-$Y_{2SDb}$' in FIG. 4A in accordance with some embodiments.
FIG. 4C illustrates a cross-sectional view of the semiconductor structure shown along lines $Y_{1MGb}$-$Y_{1MGb}$' and $Y_{2MGb}$-$Y_{2MGb}$' in FIG. 4A in accordance with some embodiments.
Figure 4D:
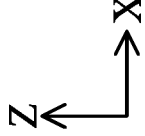
FIG. 4D illustrates a cross-sectional view of the semiconductor structure shown along lines $X_{1b}$-$X_{1b}$' in FIG. 4A in accordance with some embodiments.
Figure 4E:
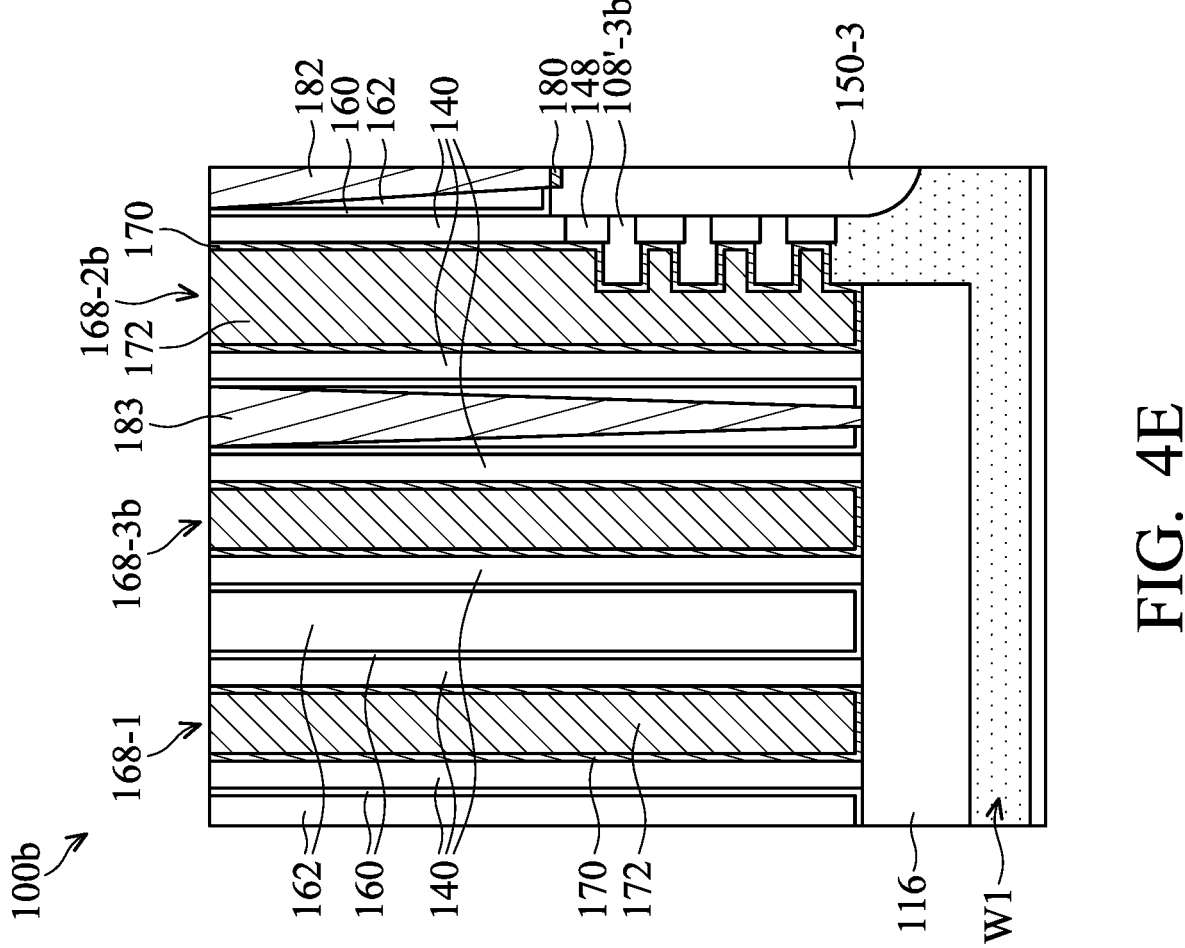
FIG. 4E illustrates a cross-sectional view of the semiconductor structure shown along lines $X_{2b}$-$X_{2b}$' in FIG. 4A in accordance with some embodiments.
Figure 4F:
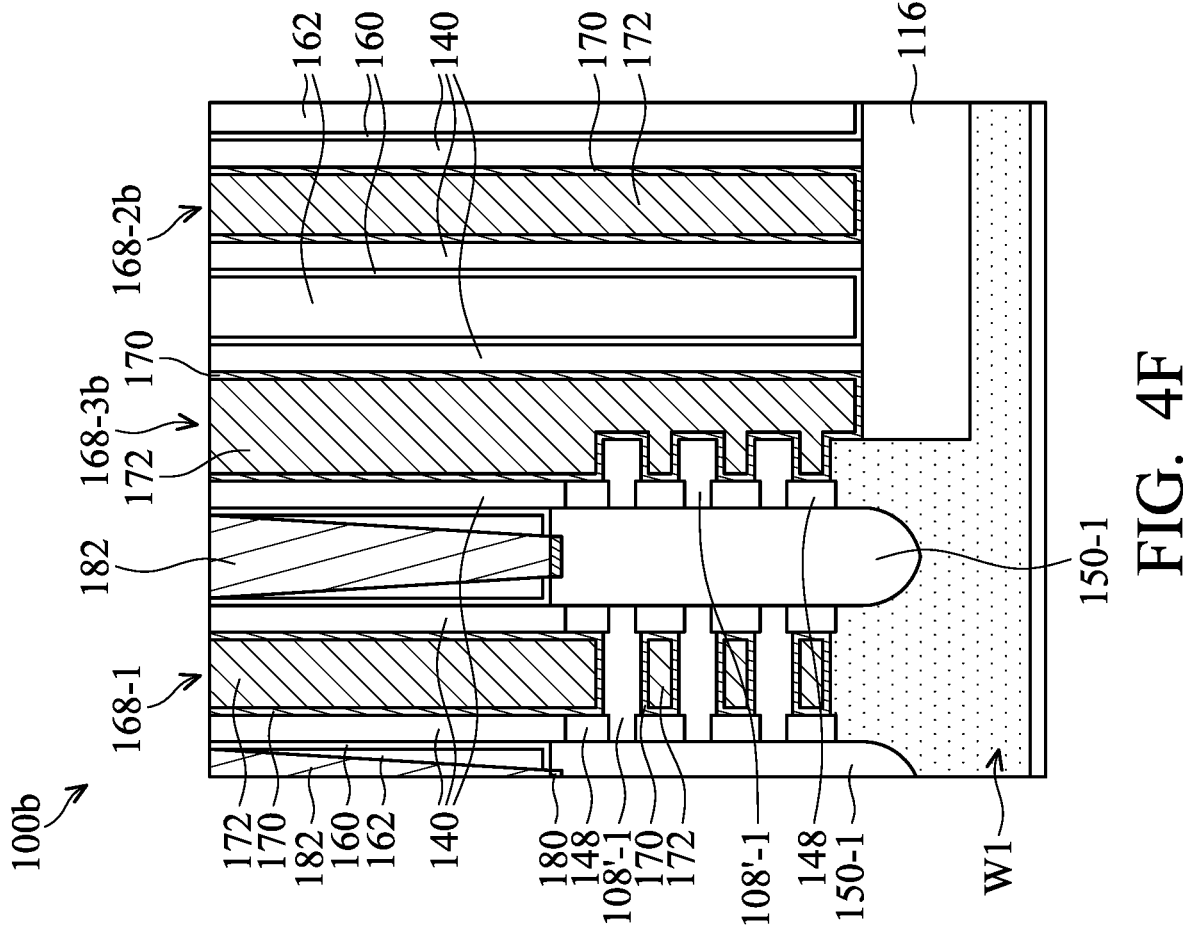
FIG. 4F illustrates a cross-sectional view of the semiconductor structure shown along lines $X_{3b}$-$X_{3b}$' in FIG. 4A in accordance with some embodiments.

FIG. 4A illustrates a top view of a semiconductor structure 100b in accordance with some embodiments. FIG. 4B illustrate the cross-sectional view of the semiconductor structure 100b shown along lines $Y_{1SDb}$-$Y_{1SDb}$' (i.e. in the Y direction) and $Y_{2SDb}$-$Y_{2SDb}$' (i.e. in the Y direction) in FIG. 4A in accordance with some embodiments. FIG. 4C illustrates the cross-sectional view of the semiconductor structure 100b shown along lines $Y_{1MGb}$-$Y_{1MGb}$' (i.e. in the Y direction) and $Y_{2MGb}$-$Y_{2MGb}$' (i.e. in the Y direction) in FIG. 4A in accordance with some embodiments. FIG. 4D illustrate the cross-sectional view of the semiconductor structure 100b shown along lines $X_{1b}$-$X_{1b}$' (i.e. in the X direction) in FIG. 4A in accordance with some embodiments. FIG. 4E illustrate the cross-sectional view of the semiconductor structure 100b shown along lines $X_{2b}$-$X_{2b}$' (i.e. in the X direction) in FIG. 4A in accordance with some embodiments. FIG. 4F illustrate the cross-sectional view of the semiconductor structure 100b shown along lines $X_{3b}$-$X_{3b}$' (i.e. in the X direction) in FIG. 4A in accordance with some embodiments.

The semiconductor structure 100b may be similar to the semiconductor structure 100 described previously, except the channel structures attached to dielectric wall structures (e.g. the forksheet structures) are separated from the channel structures without the dielectric wall structures (e.g. the nanosheet structures) in accordance with some embodiments. Some processes and materials for forming the semiconductor structure 100b may be similar to, or the same as, those for forming the semiconductor structure 100 described previously and are not repeated herein.

More specifically, channel structures 108'-3b and 108'-of fin structures 104-3b and 104-4b are formed in the first well region W1 and the second well region W2 respectively in accordance with some embodiments. The processes and materials for forming the channel structures 108'-3b and 108'-4b (and the fin structures 104-3b and 104-4b) may be similar to, or the same as, those for forming the channel structures 108'-3 and 108'-4 (and the fin structures 104-3 and 104-4) described previously, except the channel structures 108'-3b are spaced apart from the channel structures 108'-1 and the channel structures 108'-4b are spaced a distance $P_{SP}$ apart from the channel structures 108'-2 in the X direction, as shown in FIGS. 4A and 4D in accordance with some embodiments.

In some embodiments, a gate structure 168-2b surrounds the end portions of the channel structures 108'-3b and 108'-4b, and a gate structure 168-3b surrounds the end portions of the channel structures 108'-1 and 108'-2, as shown in FIGS. 4A, 4D, 4E, and 4F in accordance with some embodiments. That is, the channel structures 108'-3b and 108'-4b laterally extends into the gate structure 168-2b but do not pass through the gate structure 168-2b in the top view in accordance with some embodiments. Similarly, the channel structures 108'-1 and 108'-2 laterally extends into the gate structure 168-3b but do not pass through the gate structure 168-3b in the top view in accordance with some embodiments. In some embodiments, the distance $P_{SP}$ between the channel structures 108'-3b and the channel structures 108'-1 is about one to five times of the distance PMG between the central of the gate structure 168-1 and the central of the gate structure 168-3b in the X direction, as shown in FIG. 4A. By keeping the distance $P_{SP}$, the resulting transistors may have improved isolation. The processes and materials for forming the gate structures 168-2b and 168-3b may be similar to, or the same as, those for forming the gate structures 168-2 and 168-3 and are not repeated herein.

In addition, dummy contacts 183 are formed between the gate structures 168-3b and 168-2b, although there are not electrically connected to the channel structures 108'-1, 108'-2, 108'-3b, and 108'-4b in accordance with some embodiments. In some embodiments, the dummy contacts 183 are located between the source/drain contacts 182 in the first region 10 and in the second region 20. The dummy contacts 183 may be formed using the same processes and materials for forming the source/drain contacts 182. In some other embodiments, dummy contacts 183 are not formed.

Figure 5:
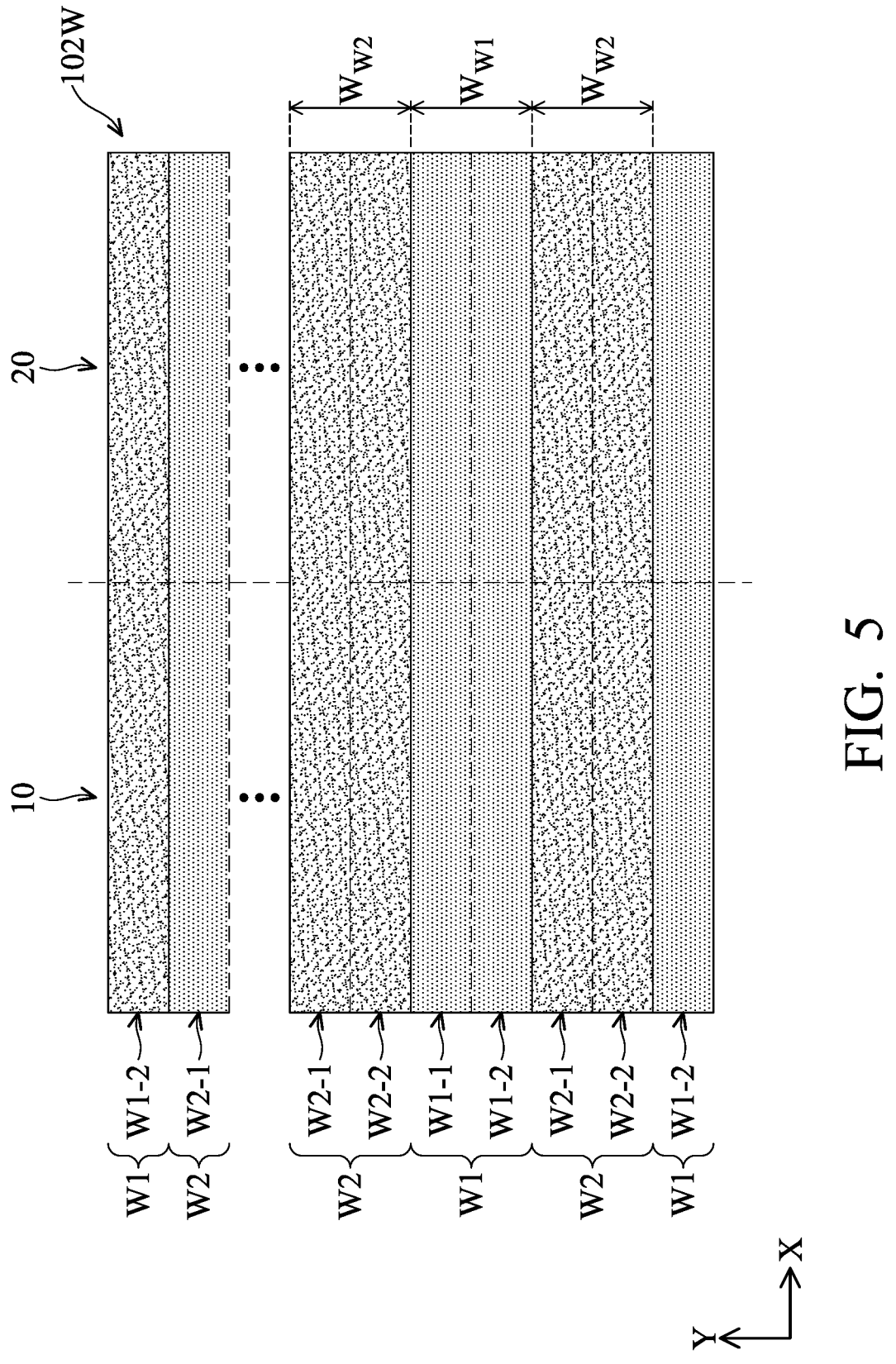

FIG. 5 illustrates a top view of an arrangement of the first well regions W1 and the second well regions W2 of a substrate 102W in accordance with some embodiments. More specifically, the first well regions W1 and the second well region W2 are the first well regions and the second well regions are arranged in an alternating manner in the Y direction in the substrate 102W in accordance with some embodiments. In some embodiments, the width $W_{W1}$ of the first well regions W1 is substantially equal to the width $W_{W2}$ of the second well regions W2. Each of the first well regions W1 may include portions W1-1 and W1-2 having the same width, and each of the second well regions W2 may include portions W2-1 and W2-2 having the same width. The substrate 102W may be the same as the substrate 102 described previously. The forksheet structures and the nanosheet structures may be arranged over the substrate 102W in different ways. For examples, the forksheet structures and the nanosheet structures are arranged over the substrate 102W in both the X direction and the Y direction.

Figure 6A:
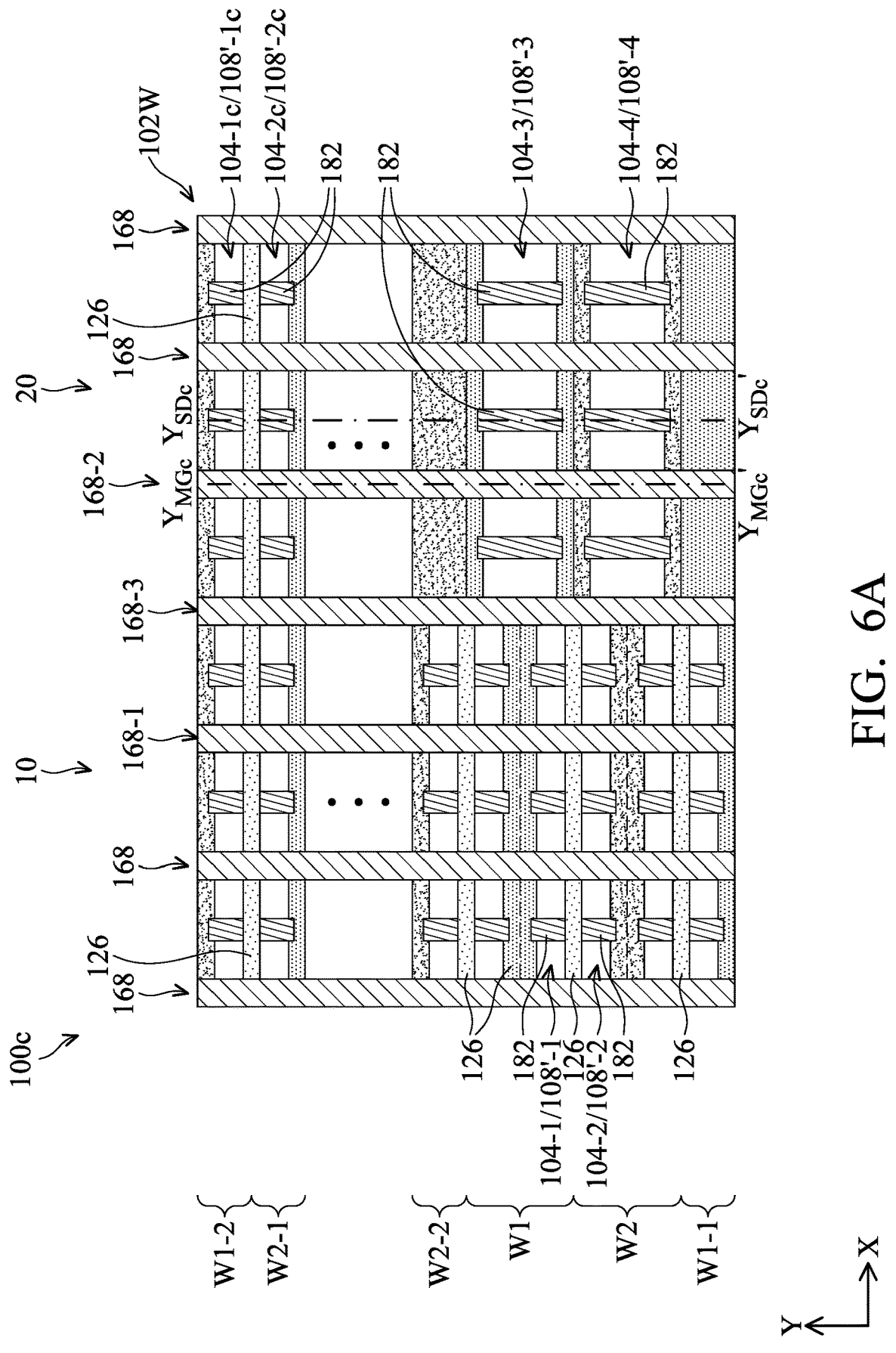
FIG. 6A illustrates a top view of a semiconductor structure formed over the substrate shown in FIG. 5 in accordance with some embodiments.
Figures 6B, 6C:
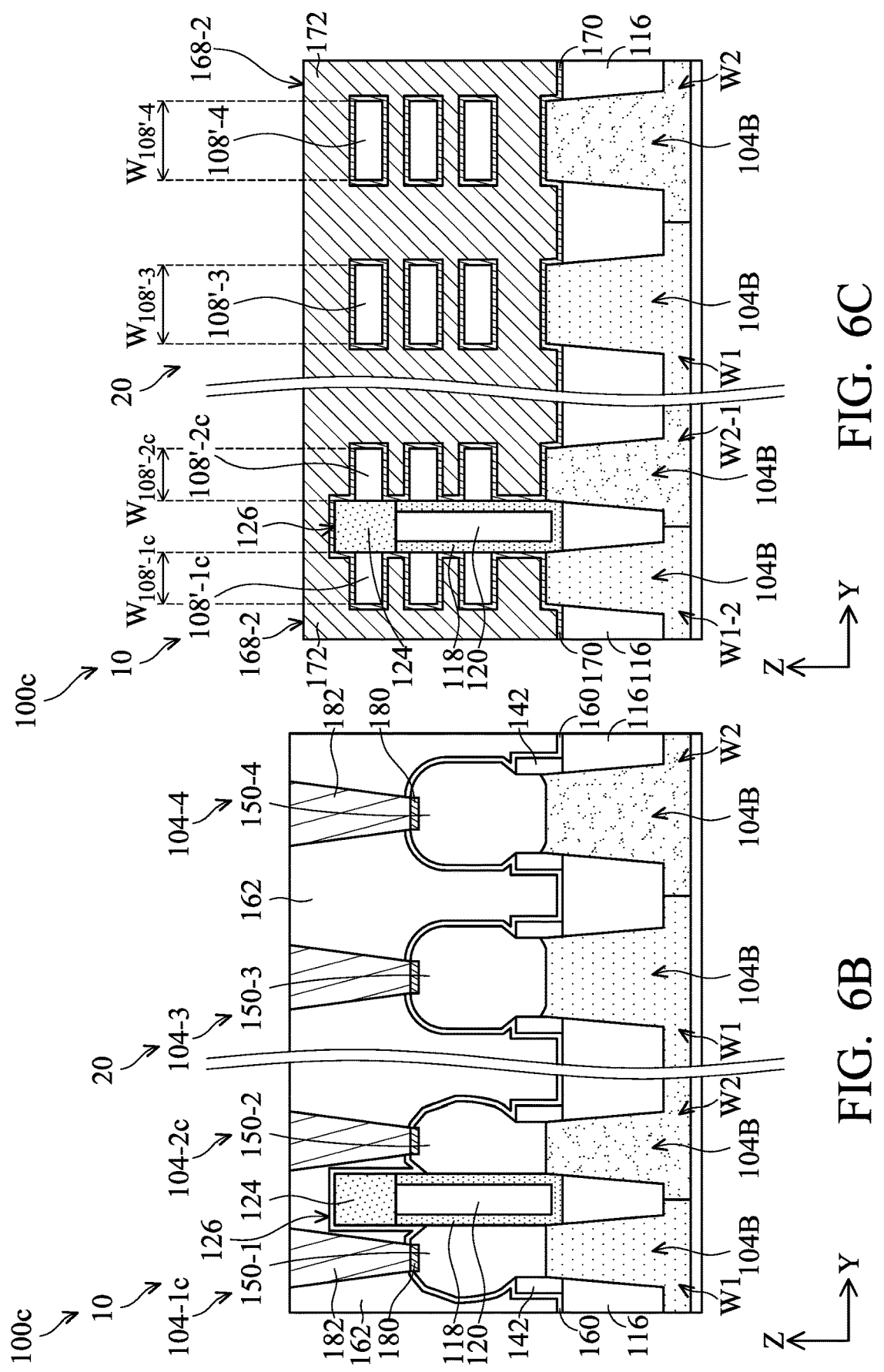
FIG. 6B illustrates a cross-sectional view of the semiconductor structure shown along lines $Y_{SDc}$-$Y_{SDc}$' in FIG. 6A in accordance with some embodiments.
FIG. 6C illustrates a cross-sectional view of the semiconductor structure shown along lines $Y_{MGc}$-$Y_{MGc}$' in FIG. 6A in accordance with some embodiments.

FIG. 6A illustrates a top view of a semiconductor structure 100c formed over the substrate 102W shown in FIG. 5 in accordance with some embodiments. FIG. 6B illustrate the cross-sectional view of the semiconductor structure 100c shown along lines $Y_{SDc}$-$Y_{SDc}'$ (i.e. in the Y direction) in FIG. 6A in accordance with some embodiments. FIG. 6C illustrates the cross-sectional view of the semiconductor structure 100c shown along lines $Y_{MGc}$-$Y_{MGc}'$ (i.e. in the Y direction) in FIG. 6A in accordance with some embodiments. FIG. 6A has been simplified for the sake of clarity to better understand the inventive concepts of the present disclosure. Additional features may be included in the semiconductor structure 100c, and some of the features described below may be replaced, modified, or eliminated. The semiconductor structure 100c may be similar to the semiconductor structure 100 described previously, except the channel structures attached to dielectric wall structures (e.g. the forksheet structures) are further formed in the second region 20 in accordance with some embodiments.

More specifically, channel structures 108'-1c and 108'-2c (i.e. fin structures 104-1c and 104-2c) are formed in the region W1-2 of the first well region W1 and the region W2-1 of the second well region W2 respectively in accordance with some embodiments. As shown in FIGS. 6A and 6C, in a cross-sectional view in the second region 20, the semiconductor structure 100c includes both the channel structures 108'-1c and 108'-2c (e.g. the forksheet structures) and the channel structures 108'-3 and 108'-4 (e.g. the nanosheet structures) in accordance with some embodiments. In some embodiments, the width W108'-3 of the channel structure 108'-3 and the width W108'-4 of the channel structure 108'-4 are greater than the width W108'-1c of the channel structure 108'-1c and the width W108'-2c of the channel structure 108'-2c.

In some embodiments, the edges in the Y direction of the channel structures 108'-1c, 108'-2c, 108'-3, and 108'-4 are substantially aligned with each other. In some embodiments, the edges in the X direction of the channel structures 108'-1c, 108'-2c, 108'-3, and 108'-4 are substantially parallel with each other.

In some embodiments, gate structures 168, including gate structures 168-1, 168-2, and 168-3, are formed abutting the channel structures. In some embodiments, the gate structure

168-2 abuts (e.g. wraps around) the channel structures 108'-1c, 108'-2c, 108'-3, and 108'-4. In some embodiments, the gate structure 168-3 abuts (e.g. wraps around) the channel structures 108'-1, 108'-2, 108'-1c, 108'-2c, 108'-3, and 108'-4.

Processes and materials for forming the semiconductor structure 100c may be similar to, or the same as, those for forming the semiconductor structure 100 described previously and are not repeated herein. For example, the processes and materials for forming the channel structures 108'-1c and 108'-2c, the fin structures 104-1c and 104-2c, and gate structures 168 may be similar to, or the same as, those for forming the channel structures 108'-1 and 108'-2, the fin structures 104-1 and 104-2, and the gate structures 168-1 described previously.

Figure 7:
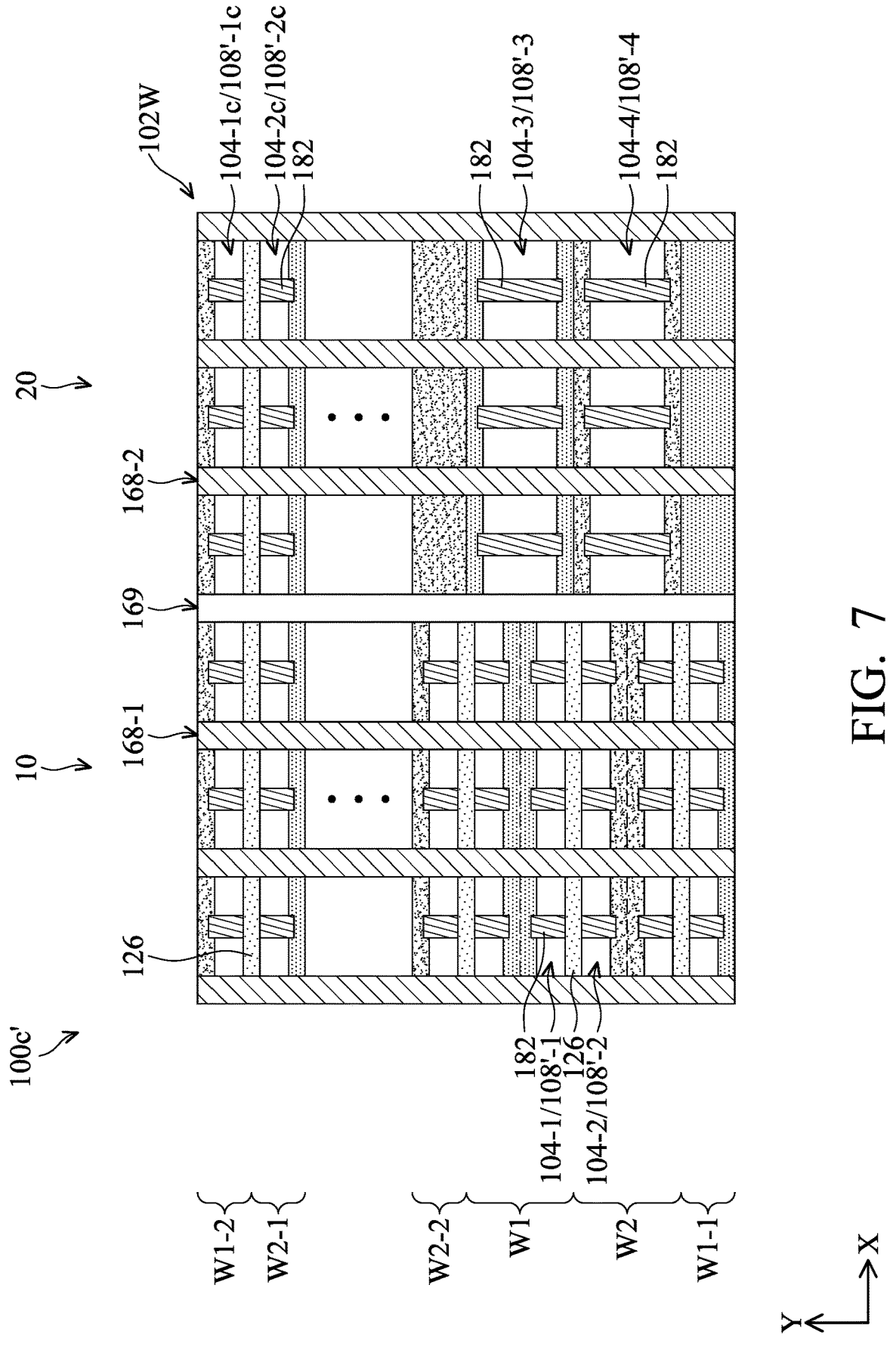
FIG. 7 illustrates a top view of a semiconductor structure formed over the substrate shown in FIG. 5 in accordance with some embodiments.

FIG. 7 illustrates a top view of a semiconductor structure 100c' formed over the substrate 102W shown in FIG. 5 in accordance with some embodiments. The semiconductor structure 100c' may be similar to the semiconductor structure 100c described previously, except the dielectric structure 169 shown in FIGS. 3C-1, 3C-2, 3C-3, 3C-4, 3C-5, and 3C-6 is formed. Processes and materials for forming the semiconductor structure 100c' may be similar to, or the same as, those for forming the semiconductor structures 100a and 100c described previously and are not repeated herein.

Figure 8:
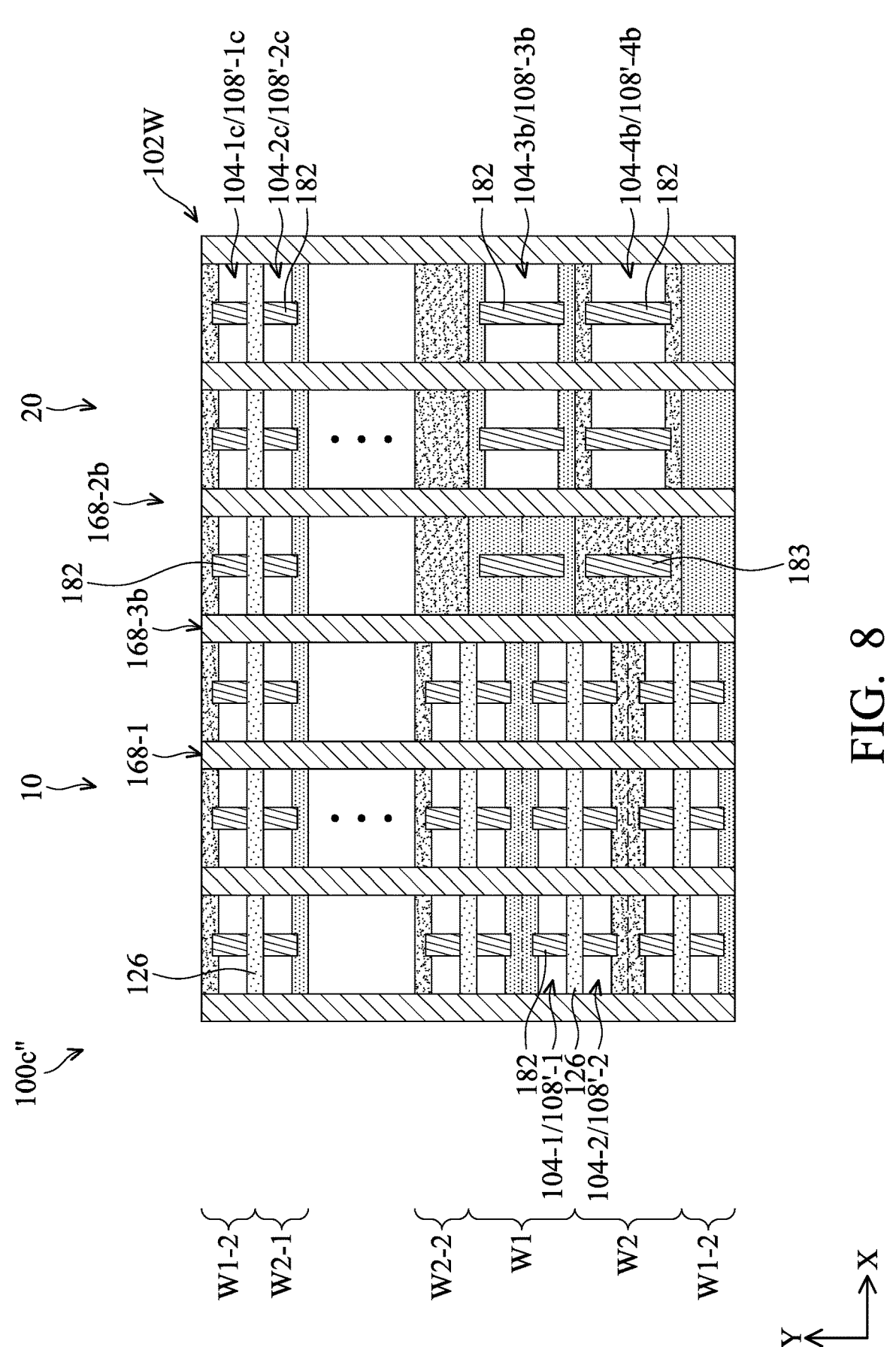
FIG. 8 illustrates a top view of a semiconductor structure formed over the substrate shown in FIG. 5 in accordance with some embodiments.

FIG. 8 illustrates a top view of a semiconductor structure 100c" formed over the substrate 102W shown in FIG. 5 in accordance with some embodiments. The semiconductor structure 100c" may be similar to the semiconductor structure 100c described previously, except the channel structures 108'-3b and 108'-4b and the dummy contacts 183 shown in FIGS. 4A to 4F are formed. Processes and materials for forming the semiconductor structure 100c" may be similar to, or the same as, those for forming the semiconductor structures 100b and 100c described previously and are not repeated herein.

Figure 9A:
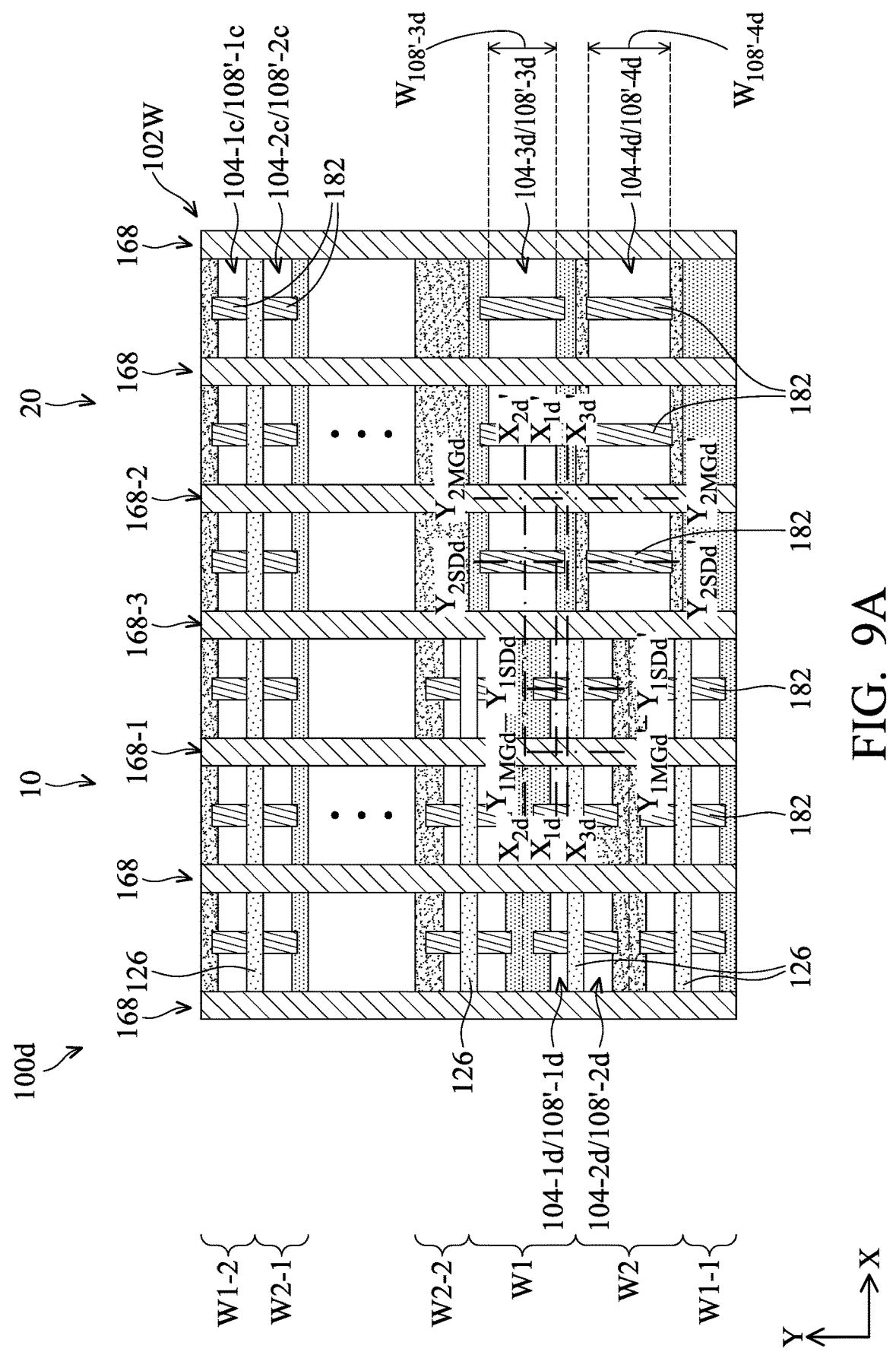
FIG. 9A illustrates a top view of a semiconductor structure formed over the substrate 102W in accordance with some embodiments.
Figures 9B, 9C:
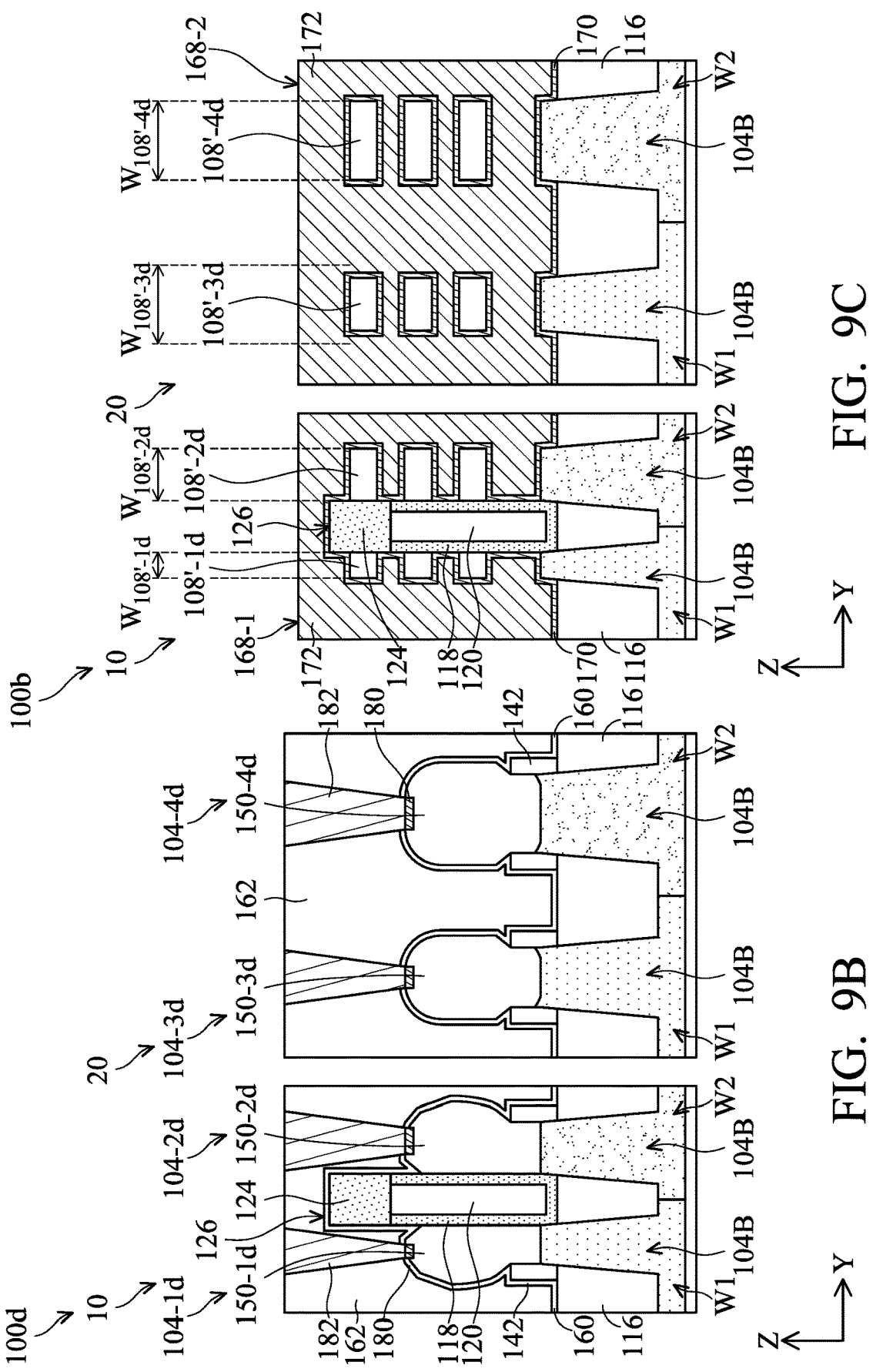
FIG. 9B illustrates a cross-sectional view of the semiconductor structure shown along lines $Y_{1SDd}$-$Y_{1SDd}$' and $Y_{2SDd}$-$Y_{2SDd}$' in FIG. 9A in accordance with some embodiments.
FIG. 9C illustrates a cross-sectional view of the semiconductor structure 100d shown along lines $Y_{1MGd}$-$Y_{1MGd}$' and $Y_{2MGd}$-$Y_{2MGd}$' in FIG. 9A in accordance with some embodiments.
Figure 9D:
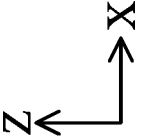
FIG. 9D illustrates a cross-sectional view of the semiconductor structure shown along lines $X_{1d}$-$X_{1d}$' in FIG. 9A in accordance with some embodiments.
Figure 9E:
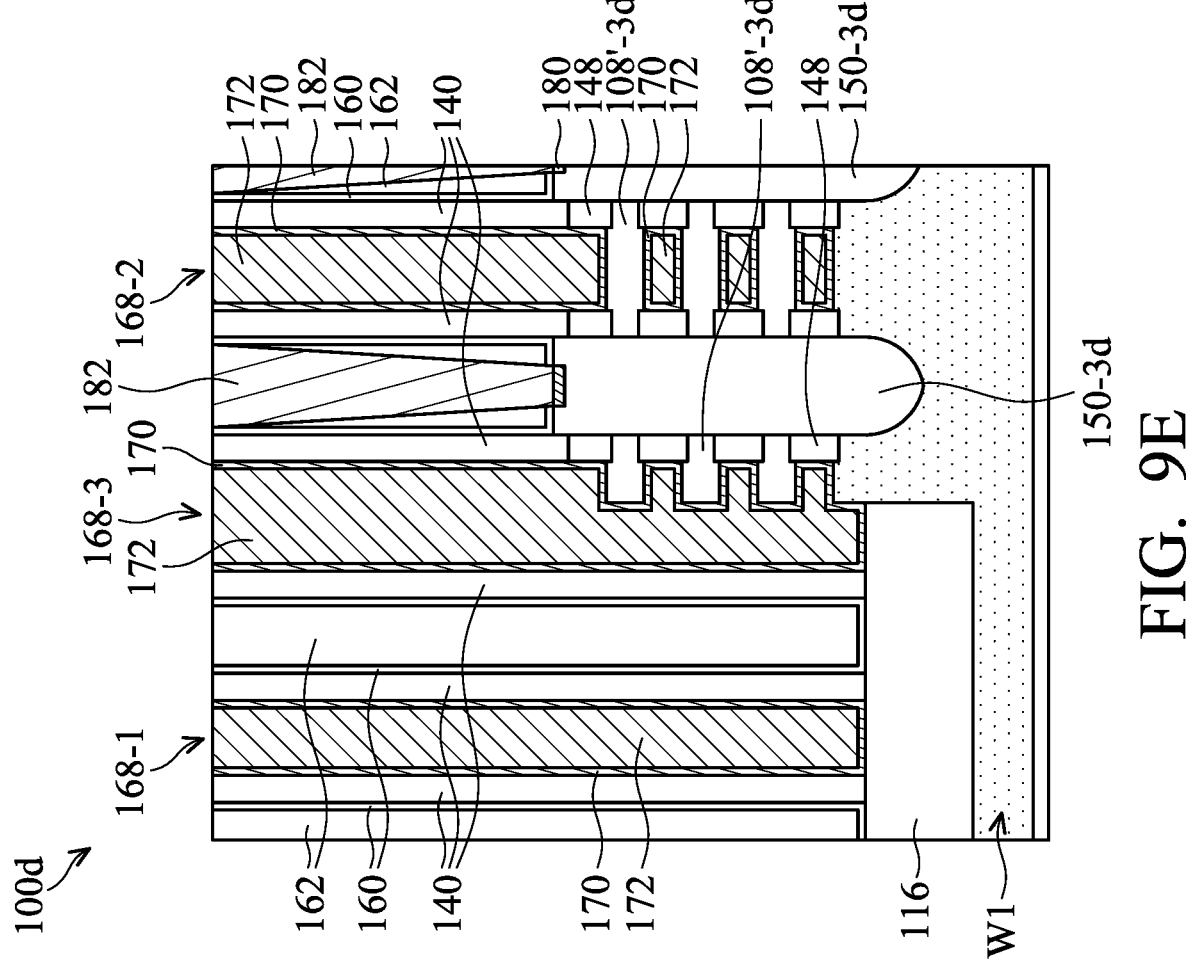
FIG. 9E illustrates a cross-sectional view of the semiconductor structure shown along lines $X_{d2}$-$X_{d2}$' in FIG. 9A in accordance with some embodiments.
Figure 9F:
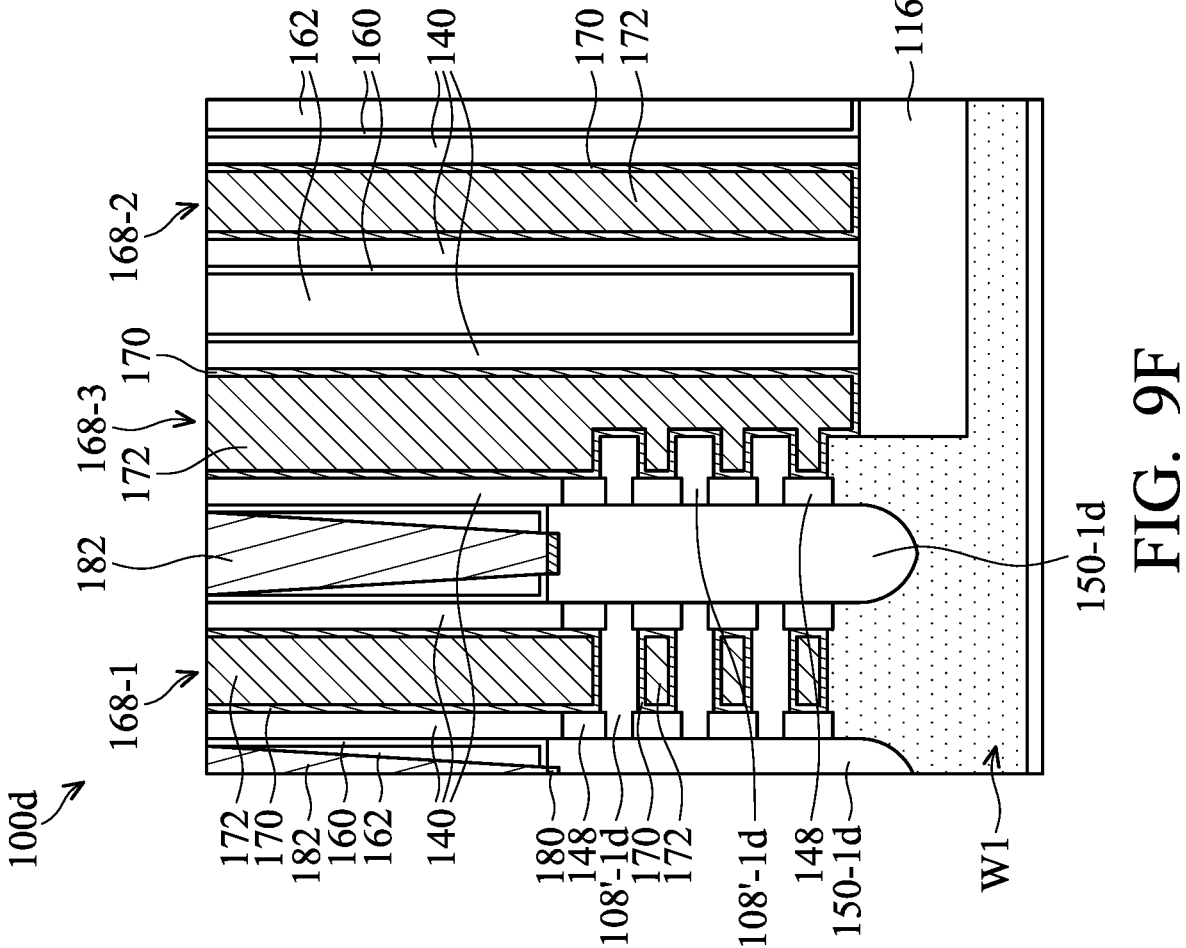
FIG. 9F illustrates a cross-sectional view of the semiconductor structure shown along lines $X_{3d}$-$X_{3d}$' in FIG. 9A in accordance with some embodiments.

FIG. 9A illustrates a top view of a semiconductor structure 100d formed over the substrate 102W shown in FIG. 5 in accordance with some embodiments. FIG. 9B illustrate the cross-sectional view of the semiconductor structure 100d shown along lines $Y_{1SDd}$-$Y_{1SDd}'$ (i.e. in the Y direction) and $Y_{2SDd}$-$Y_{2SDd}'$ (i.e. in the Y direction) in FIG. 9A in accordance with some embodiments. FIG. 9C illustrates the cross-sectional view of the semiconductor structure 100d shown along lines $Y_{1MGd}$-$Y_{1MGd}'$ (i.e. in the Y direction) and $Y_{2MGd}$-$Y_{2MGd}'$ (i.e. in the Y direction) in FIG. 9A in accordance with some embodiments. FIG. 9D illustrate the cross-sectional view of the semiconductor structure 100d shown along lines $X_{1d}$-$X_{1d}'$ (i.e. in the X direction) in FIG. 9A in accordance with some embodiments. FIG. 9E illustrate the cross-sectional view of the semiconductor structure 100d shown along lines $X_{d2}$-$X_{d2}'$ (i.e. in the X direction) in FIG. 9A in accordance with some embodiments. FIG. 9F illustrate the cross-sectional view of the semiconductor structure 100d shown along lines $X_{3d}$-$X_{3d}'$ (i.e. in the X direction) in FIG. 9A in accordance with some embodiments.

The semiconductor structure 100d may be similar to the semiconductor structure 100 described previously, except the channel structures have different widths in Y direction in accordance with some embodiments. More specifically, channel structures 108'-1d are formed over the first well region W1 and the channel structures 108'-2d are formed over the second well region W2, and the channel structures 108'-1d and 108'-2d are attached to opposite sides of the dielectric wall structure 126 to form forksheets structures in accordance with some embodiments. In addition, the channel structures 108'-1d and 108'-2d have different widths in Y direction, as shown in FIGS. 9A and 9C in accordance with some embodiments. In some embodiments, the width $W_{108'-2d}$ of the channel structures 108'-2$d$ is greater than the width $W_{108'-1d}$ of the channel structures 108'-1$d$. Furthermore, source/drain structures 150-2$d$ attached to the channel structures 108'-2$d$ are also wider than source/drain structures 150-1$d$ attached to the channel structures 108'-1$d$. In some embodiments, the width $W_{108'-1d}$ of the channel structures 108'-1$d$ is greater than a quarter of the width $W_{108'-2d}$ of the channel structures 108'-2$d$.

Similarly, channel structures 108'-3$d$ are formed over the first well region W1 and channel structures 108'-4$d$ are formed over the second well region W2, and the channel structures 108'-3$d$ and 108'-4$d$ have different widths in Y direction, as shown in FIGS. 9A and 9C in accordance with some embodiments. In some embodiments, the width $W_{108'-4d}$ of the channel structures 108'-4$d$ is greater than the width $W_{108'-3d}$ of the channel structures 108'-3$d$. In addition, source/drain structures 150-4$d$ attached to the channel structures 108'-4$d$ are also wider than source/drain structures 150-3$d$ attached to the channel structures 108'-3$d$. Furthermore, although the channel structures 108'-3$d$ are narrower than the channel structures 108'-4$d$, the channel structures 108'-3$d$ may still be wider than the channel structures 108'-2$d$, since the size of the forksheet structures may be limited so the first semiconductor material layers may be fully removed. In some embodiments, the width $W_{108'-3d}$ of the channel structures 108'-3$d$ is greater than the width $W_{108'-2d}$ of the channel structures 108'-2$d$.

Processes and materials for forming the semiconductor structure 100$d$ may be similar to, or the same as, those for forming the semiconductor structure 100$c$ described previously and are not repeated herein. For example, processes and materials for forming the fin structures 104-1$d$, 104-2$d$, 104-3$d$, and 104-4$d$, the channel structures 108'-1$d$, 108'-2$d$, 108'-3$d$, and 108'-4$d$, and the source/drain structures 150-1$d$, 150-2$d$, 150-3$d$, and 150-4$d$ are similar to, or the same as, those for forming the fin structures 104-1, 104-2, 104-3, and 104-4, the channel structures 108'-1, 108'-2, 108'-3, and 108'-4, and the source/drain structures 150-1, 150-2, 150-3, and 150-4 described previously and are not repeated herein.

Figure 10:
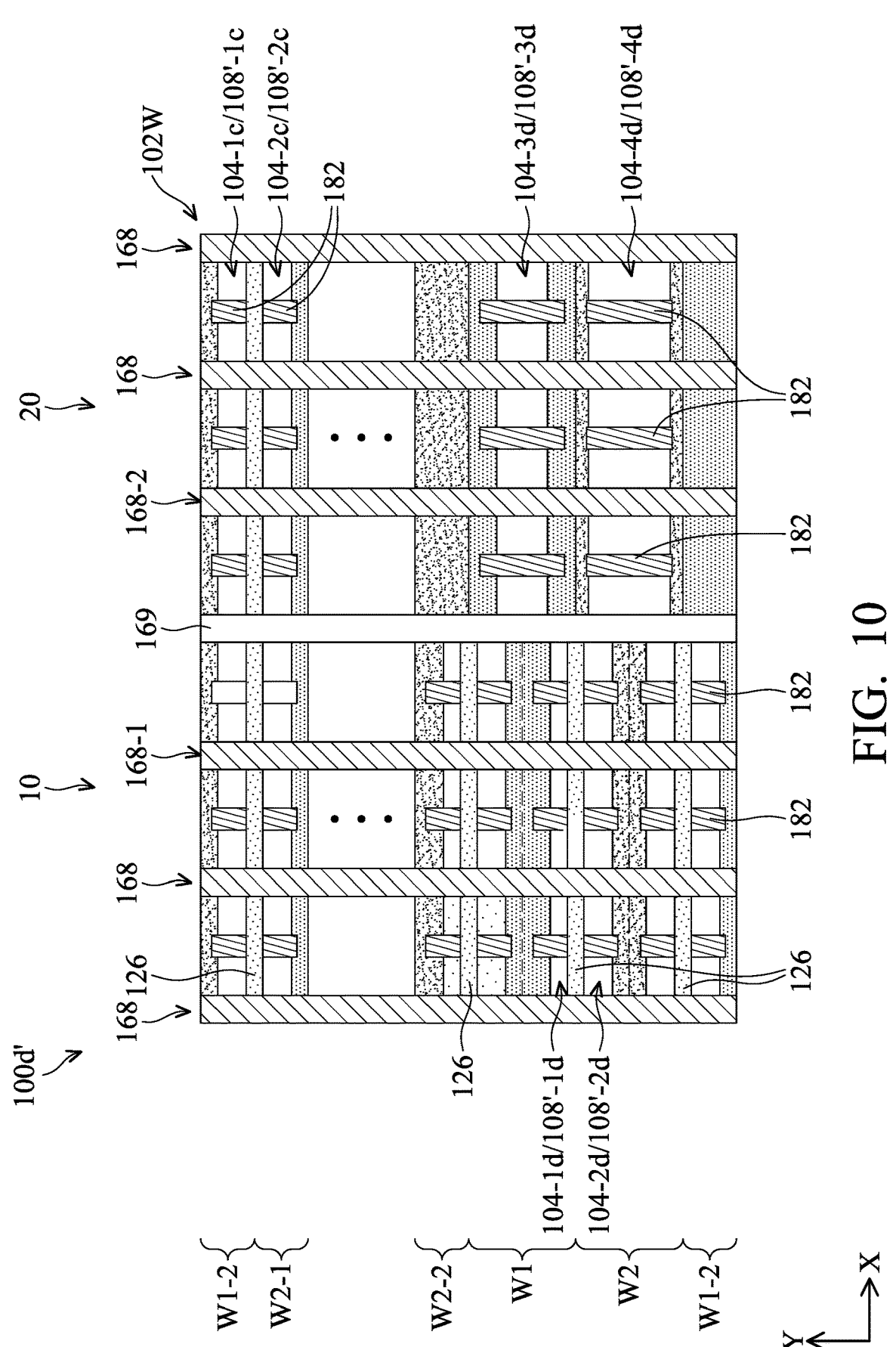
FIG. 10 illustrates a top view of a semiconductor structure formed over the substrate in accordance with some embodiments.

FIG. 10 illustrates a top view of a semiconductor structure 100$d'$ formed over the substrate 102W in accordance with some embodiments. The semiconductor structure 100$d'$ may be similar to the semiconductor structure 100$d$ described previously, except the dielectric structure 169 shown in FIGS. 3C-1, 3C-2, 3C-3, 3C-4, 3C-5, and 3C-6 is formed. Processes and materials for forming the semiconductor structure 100$d'$ may be similar to, or the same as, those for forming the semiconductor structures 100$a$ and 100$d$ described previously and are not repeated herein.

Figure 11:
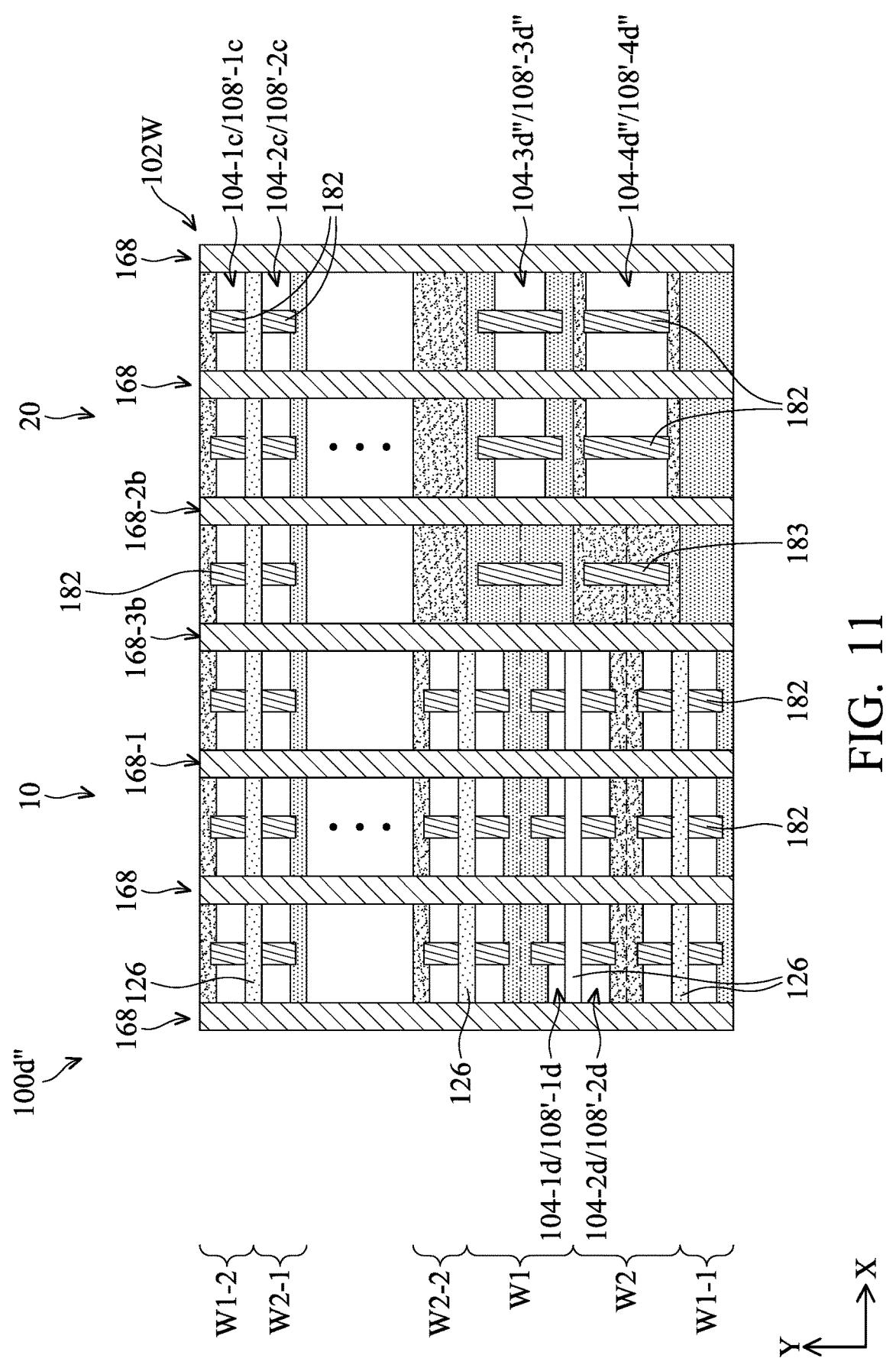
FIG. 11 illustrates a top view of a semiconductor structure formed over the substrate in accordance with some embodiments.

FIG. 11 illustrates a top view of a semiconductor structure 100$d''$ formed over the substrate 102W in accordance with some embodiments. The semiconductor structure 100$d''$ may be similar to the semiconductor structure 100$d$ described previously, except channel structures 108'-3$d''$ and 108'-4$d''$, similar to the channel structures 108'-3$b$ and 108'-4$b$ shown in FIGS. 4A to 4F, are laterally spaced apart from the channel structures 108'-1$d$ and 108'-2. Processes and materials for forming the semiconductor structure 100$d''$ may be similar to, or the same as, those for forming the semiconductor structures 100$b$ and 100$d$ described previously and are not repeated herein. For example, processes and materials for forming the channel structures 108'-3$d''$ and 108'-4$d''$ may be similar to, or the same as, those for forming the channel structures 108'-3$d$ and 108'-4$d$ described previously.

Figure 12A:
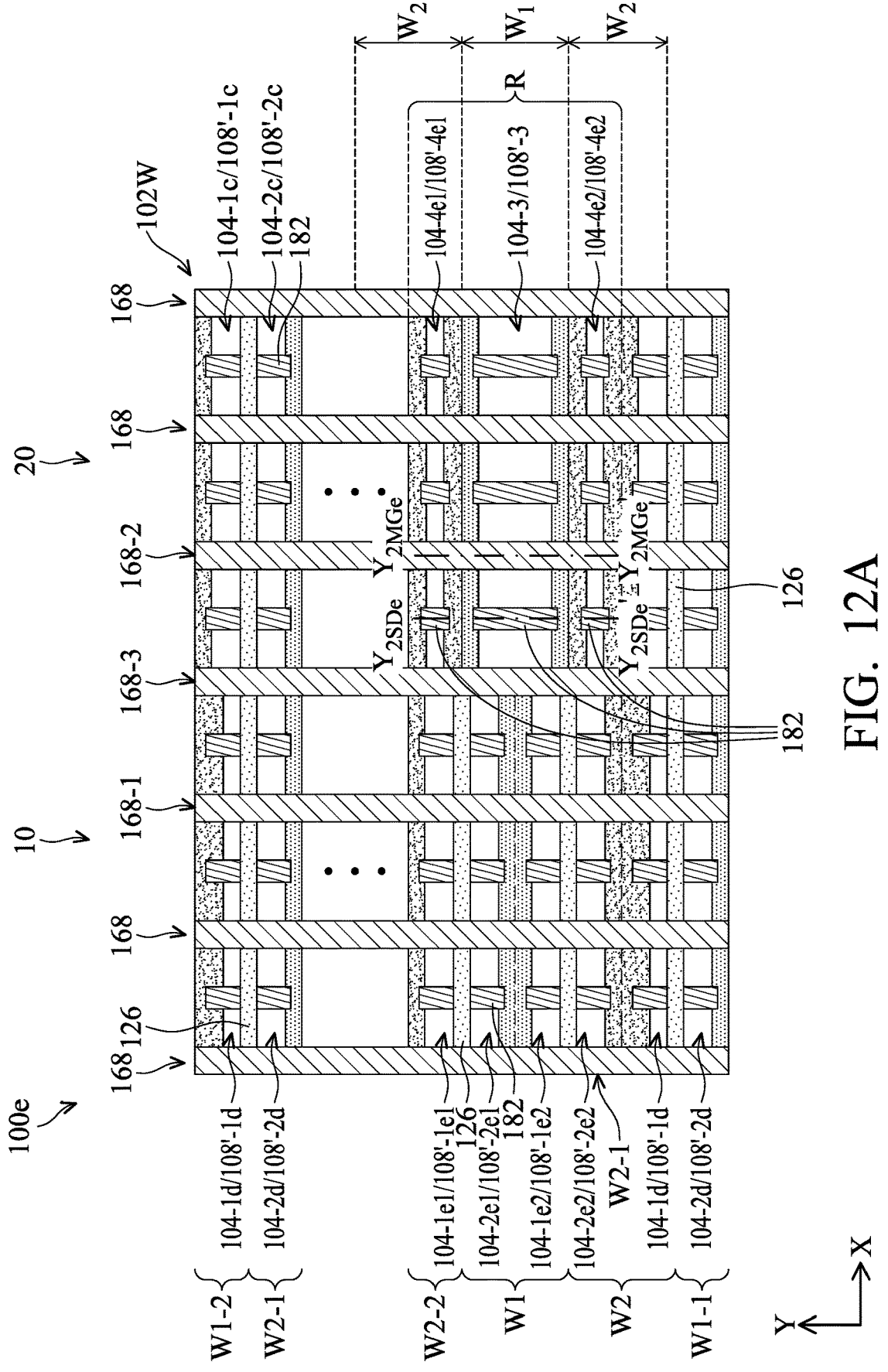
FIG. 12A illustrates a top view of a semiconductor structure formed over the substrate in accordance with some embodiments.
Figures 12B, 12C:
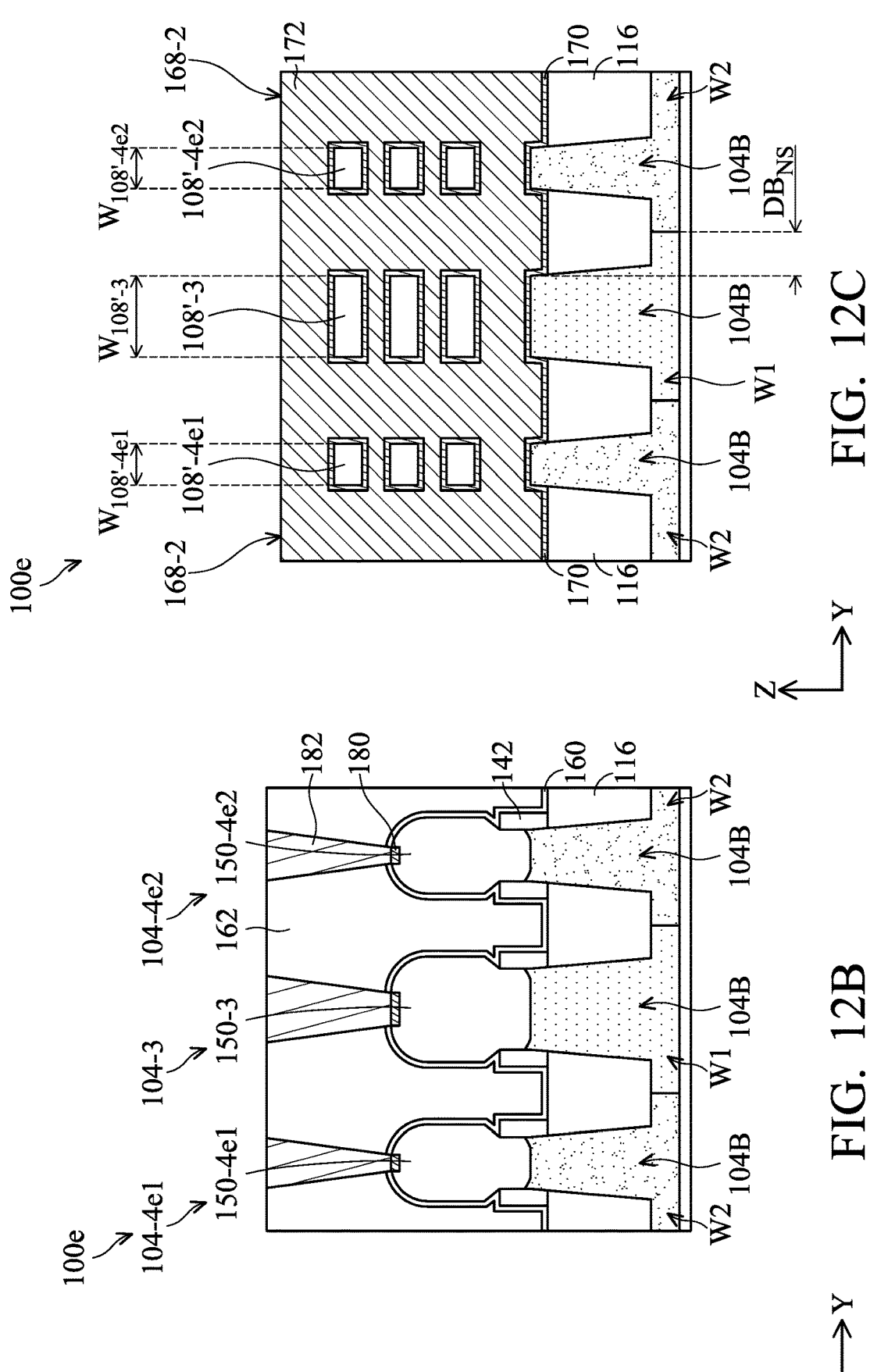
FIG. 12B illustrates a cross-sectional view of the semiconductor structure 100e shown along lines $Y_{2SDe}$-$Y_{2SDe}$' in FIG. 12A in accordance with some embodiments.
FIG. 12C illustrates a cross-sectional view of the semiconductor structure 100e shown along lines $Y_{2MGe}$-$Y_{2MGe}$' in FIG. 12A in accordance with some embodiments.

FIG. 12A illustrates a top view of a semiconductor structure 100$e$ formed over the substrate 102W shown in FIG. 5 in accordance with some embodiments. FIG. 12B illustrate the cross-sectional view of the semiconductor structure 100$e$ shown along lines $Y_{2SDe}$-$Y_{2SDe}'$ (i.e. in the Y direction) in FIG. 12A in accordance with some embodiments. FIG. 12C illustrates the cross-sectional view of the semiconductor structure 100$e$ shown along lines $Y_{2MGe}$-$Y_{2MGe}'$ (i.e. in the Y direction) in FIG. 12A in accordance with some embodiments.

The semiconductor structure 100$e$ may be similar to the semiconductor structure 100$c$ described previously, except the channel structures of the nanosheet structures are arranged in different ways in accordance with some embodiments.

More specifically, channel structures 108'-4$e1$ and 108'-4$e2$ are formed at opposite sides of the channel structures 108'-3 in the Y direction, as shown in FIG. 12A in accordance with some embodiments. In addition, the width $W_{108'-4e1}$ of the channel structures 108'-4$e1$ and the width $W_{108'-4e2}$ of the channel structures 108'-4$e2$ are smaller than half of the width $W_{W2}$ of the second well region W2 in accordance with some embodiments. On the other hand, the width $W_{108'-3}$ of the channel structures 108'-3 is greater than half of the width $W_{W1}$ of the first well region W1 and is smaller than the width $W_{W1}$ of the first well region W1 in accordance with some embodiments. In some embodiments, source/drain structures 150-4$e$-1 attached to the channel structures 108'-4$e$-1 and source/drain structures 150-4$e$-2 attached to the channel structures 108'-4$e$-2 are narrower than the source/drain structures 150-3, as shown in FIG. 12B in accordance with some embodiments.

The semiconductor structure 100$e$ may include a region R as shown in FIG. 12A. The region R may include two regions W2-2 of the second well regions W2 and the first well region W1 is sandwiched between the two regions W2-2 in the Y direction. The width of the region R may be substantially the same as the sum of the width $W_{W1}$ of one first well region W1 and the width $W_{W2}$ of one second well region W2. In some embodiments, in the first region 10 of the region R1, four channel structures, including channel structures 108'-1$e1$, 108'-2$e1$, 108'-1$e2$, and 108'-2$e2$, are formed. On the other hand, in the second region 20 of the region T1, three channel structures, including the channel structures 108'-4$e1$, 108'-3, and 108'-4$e2$, are formed. In some embodiments, a sidewall surface of the channel structures 108'-1$e1$ is substantially aligned with a sidewall surface of the channel structures 108'-4$e1$. In some embodiments, a sidewall surface of the channel structures 108'-2$e2$ is substantially aligned with a sidewall surface of the channel structures 108'-4$e2$.

Processes and materials for forming the semiconductor structure 100$e$ may be similar to, or the same as, those for forming the semiconductor structures 100$c$ and/or 100$d$ described previously and are not repeated herein. For examples, the processes and materials for forming the channel structures 108'-1$e1$ and 108'-1$e2$, the channel structures 108'-2$e1$ and 108'-2$e2$, the channel structures 108'-4$e1$ and 108'-4$e2$, the fin structures 104-1$e1$ and 104-1$e2$, the fin structures 104-2$e1$ and 104-2$e2$, the fin structures 104-4$e1$ and 104-4$e2$, and the source/drain structures 105-4$e1$ and 104-4$e2$ may be similar to, or the same as, those for forming the channel structures 108'-1, the channel structures 108'-2, the channel structures 108'-4, the fin structures 104-1, the fin structures 104-2, the fin structures 104-4, and the source/drain structures 105-4 described previously.

Figure 13:
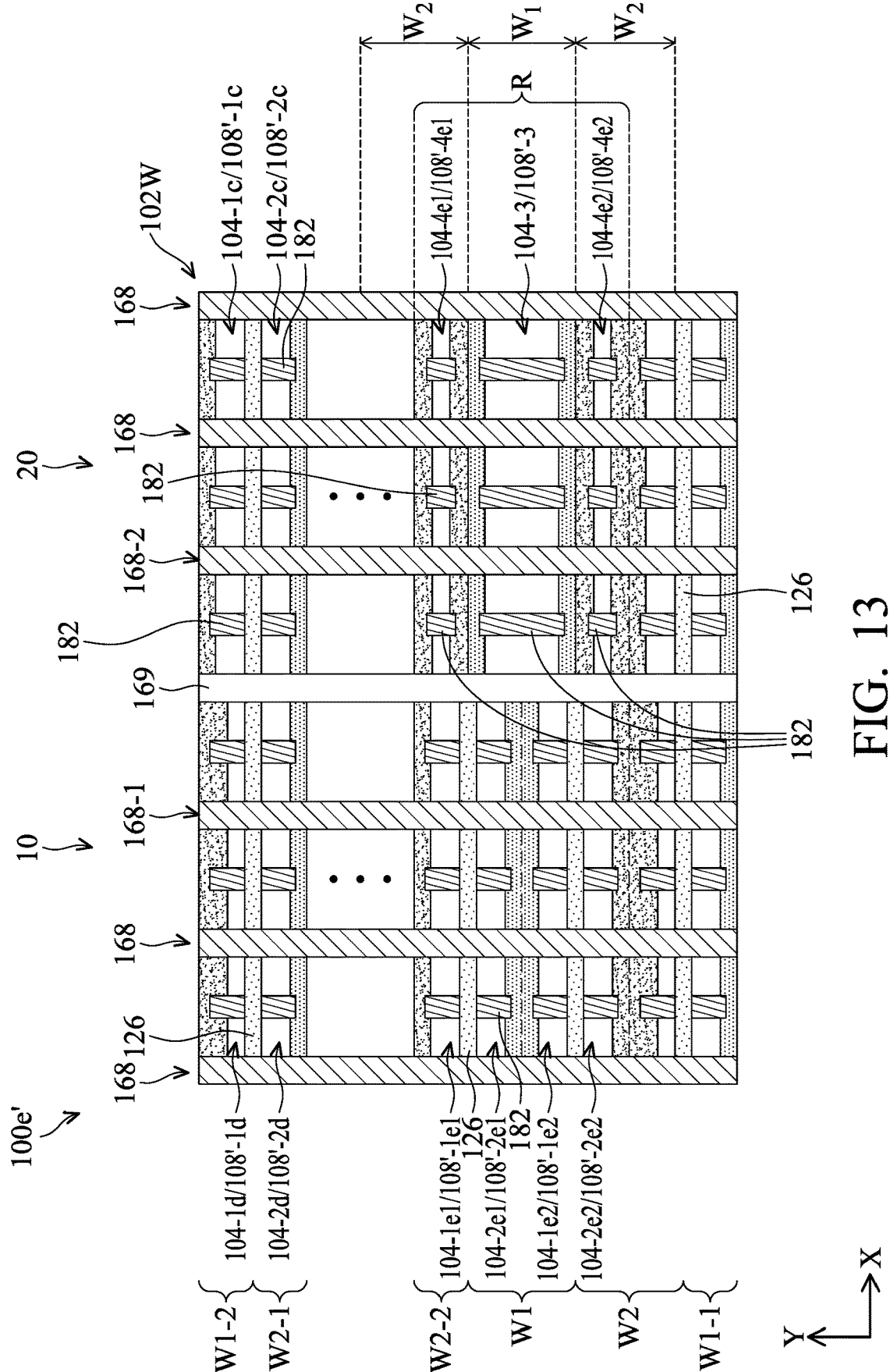
FIG. 13 illustrates a top view of a semiconductor structure formed over the substrate in accordance with some embodiments.

FIG. 13 illustrates a top view of a semiconductor structure 100e' formed over the substrate 102W in accordance with some embodiments. The semiconductor structure 100e' may be similar to the semiconductor structure 100e described previously, except the dielectric structure 169 shown in FIGS. 3C-1, 3C-2, 3C-3, 3C-4, 3C-5, and 3C-6 is formed. Processes and materials for forming the semiconductor structure 100e' may be similar to, or the same as, those for forming the semiconductor structures 100a and 100e described previously and are not repeated herein.

Figure 14:
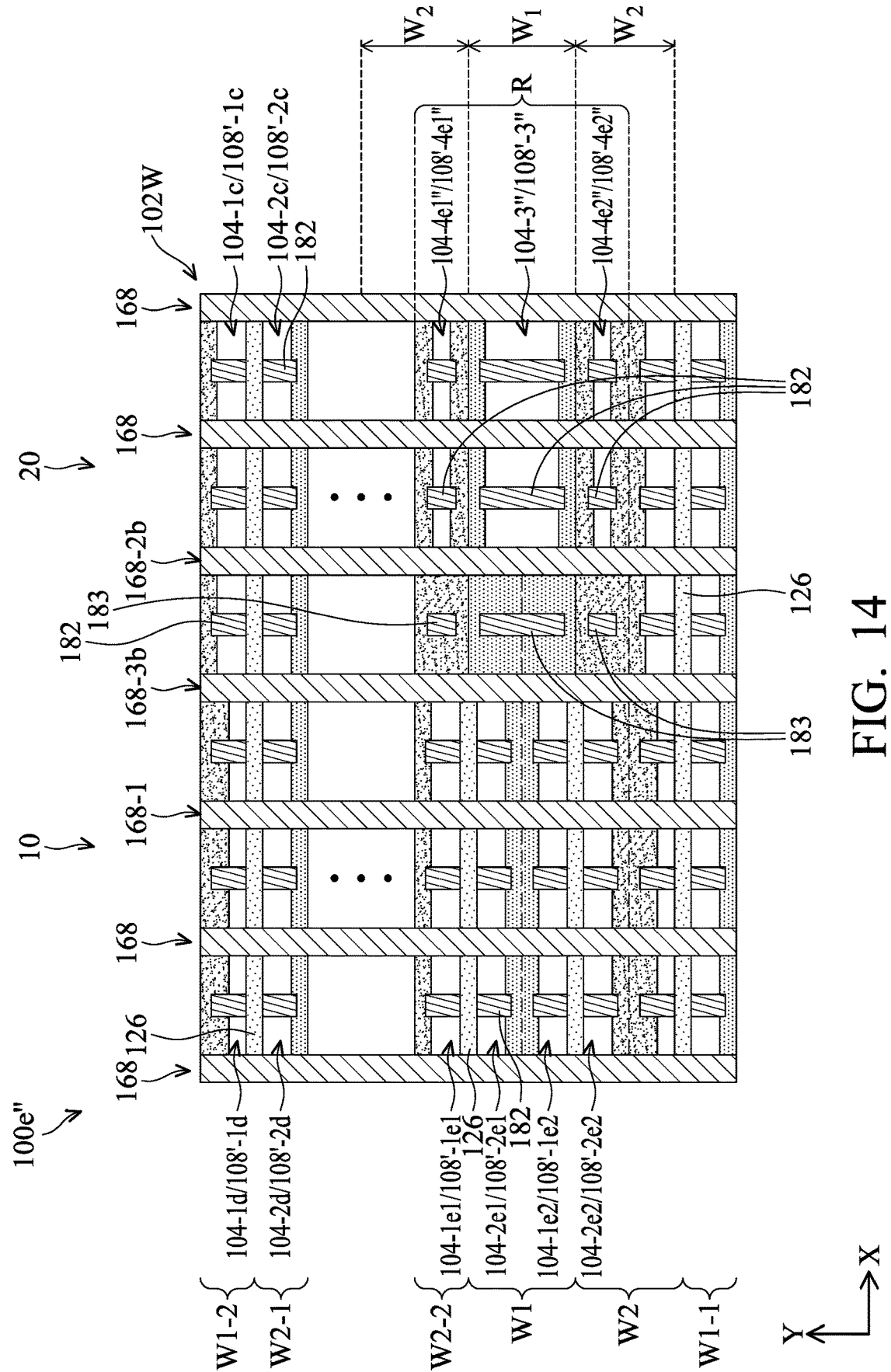
FIG. 14 illustrates a top view of a semiconductor structure formed over the substrate in accordance with some embodiments.

FIG. 14 illustrates a top view of a semiconductor structure 100e" formed over the substrate 102W in accordance with some embodiments. The semiconductor structure 100e" may be similar to the semiconductor structure 100e described previously, except channel structures 108'-4e1", 108'-3d, and 108'-4e2", similar to the channel structures 108'-3b and 108'-4b shown in FIGS. 4A to 4F, are laterally spaced apart from the channel structures 108'-1e1, 108'-2e1, 108'-1e2, and 108'-2e2. Processes and materials for forming the semiconductor structure 100e" may be similar to, or the same as, those for forming the semiconductor structures 100b and 100e described previously and are not repeated herein. For example, processes and materials for forming the channel structures 108'-4e1", 108'-3", and 108'-4e2" may be similar to, or the same as, those for forming the channel structures 108'-4e1, 108'-3, and 108'-4e2 described previously.

Figure 15A:
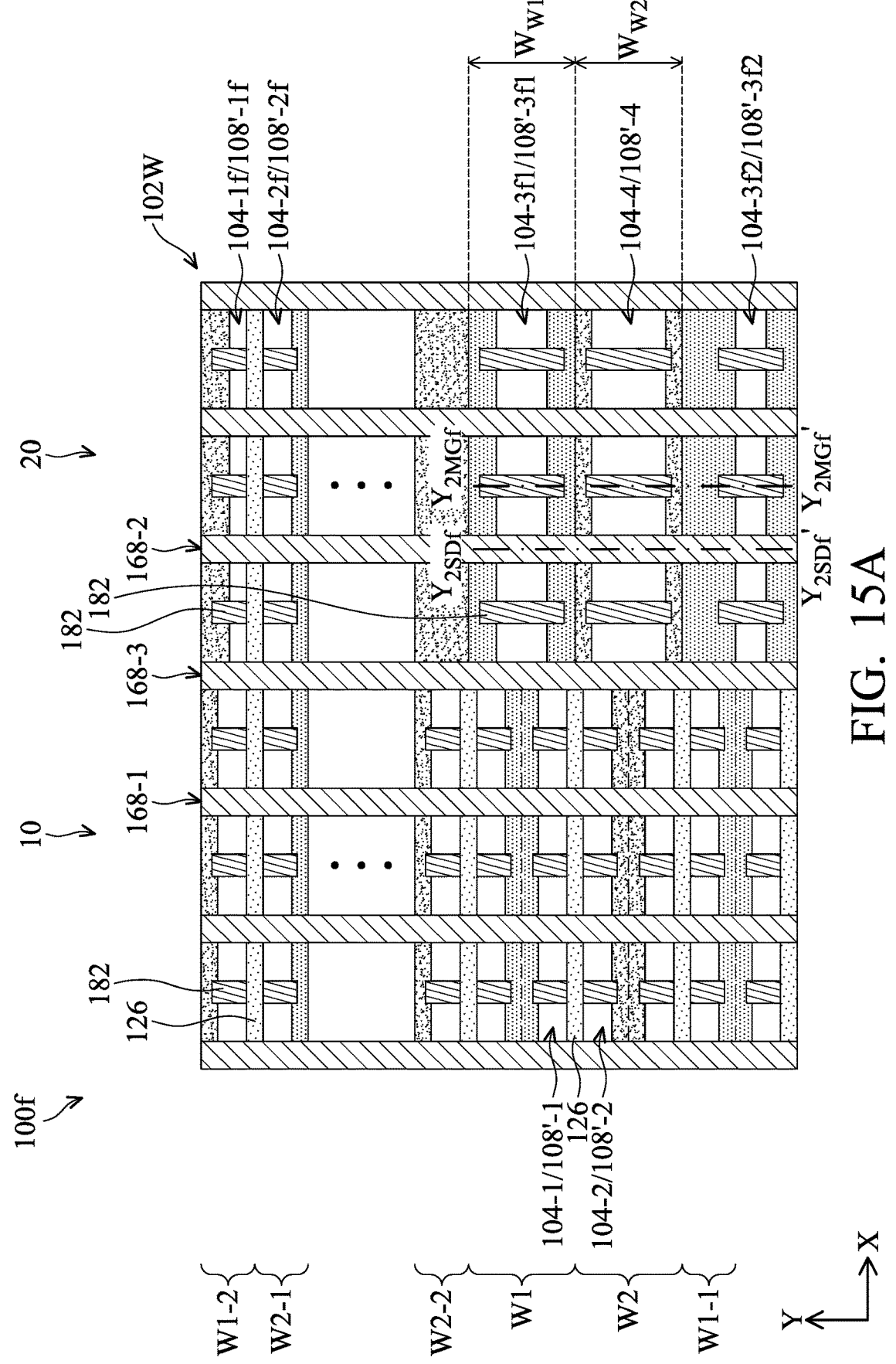
FIG. 15A illustrates a top view of a semiconductor structure formed over the substrate in accordance with some embodiments.
Figures 15B, 15C:
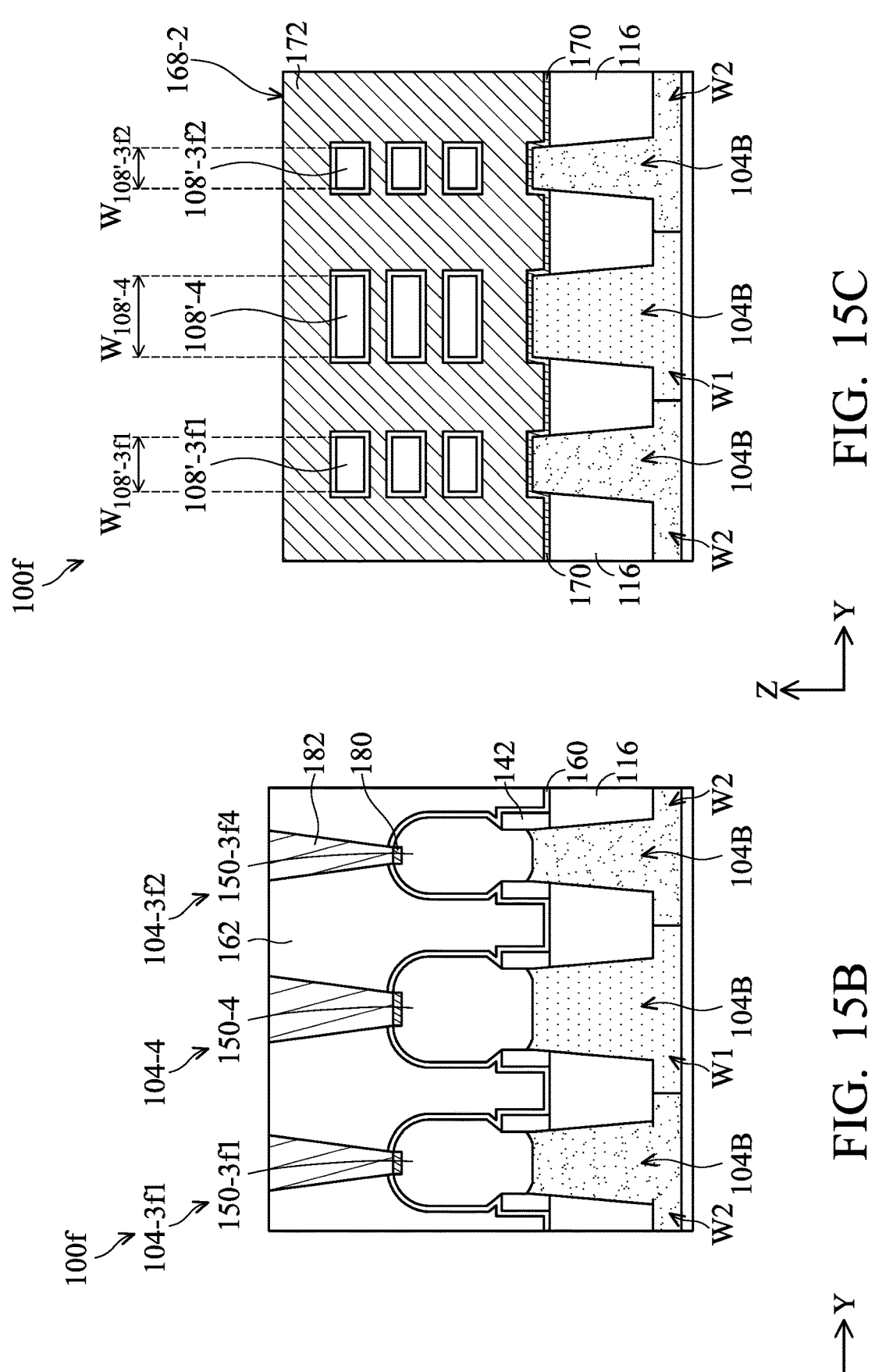
FIG. 15B illustrates a cross-sectional view of the semiconductor structure shown along lines $Y_{2SDf}$-$Y_{2SDf}$' in FIG. 15A in accordance with some embodiments.
FIG. 15C illustrates a cross-sectional view of the semiconductor structure shown along lines $Y_{2MGf}$-$Y_{2MGf}$' in FIG. 15A in accordance with some embodiments.

FIG. 15A illustrates a top view of a semiconductor structure 100f formed over the substrate 102W in accordance with some embodiments. FIG. 15B illustrates the cross-sectional view of the semiconductor structure 100f shown along lines $Y_{2SDf}$-$Y_{2SDf}'$ (i.e. in the Y direction) in FIG. 15A in accordance with some embodiments. FIG. 15C illustrates the cross-sectional view of the semiconductor structure 100f shown along lines $Y_{2MGf}$-$Y_{2MGf}'$ (i.e. in the Y direction) in FIG. 15A in accordance with some embodiments.

The semiconductor structure 100f may be similar to the semiconductor structure 100c described previously, except the channel structures of the nanosheet structures have different widths in accordance with some embodiments. More specifically, channel structures 108'-3f1 and 108'-3f2 are formed at opposite sides of the channel structures 108'-4 in the Y direction, as shown in FIG. 15A in accordance with some embodiments. In addition, the width $W_{108'-3f1}$ of the channel structures 108'-3f1, the width $W_{108'-3f2}$ of the channel structures 108'-3f2, and the width $W_{108'-4}$ of the channel structures 108'-4 are different from each other in accordance with some embodiments. In some embodiments, the width $W_{108'-4}$ of the channel structures 108'-4 is greater than the width $W_{108'-3f1}$ of the channel structures 108'-3f1, and the width $W_{108'-3f1}$ of the channel structures 108'-3f1 is greater than the width $W_{108'-3f2}$ of the channel structures 108'-3f2 in the Y direction. In some embodiments, the width $W_{108'-3f2}$ of the channel structures 108'-3f2 is greater than both half of the width $W_{W1}$ of the first well region W1 and half of the width $W_{W2}$ of the second well region W2.

In some embodiments, the distance between the channel structures 108'-3f1 and the channel structures 108'-4 is smaller than the distance between the channel structures 108'-3f2 and the channel structures 108'-4. In some embodiments, the source/drain structures 150-4 attached to the channel structures 108'-4 is wider than source/drain structures 150-3f1 attached to the channel structures 108'-3f1, and the source/drain structures 150-3f1 attached to the channel structures 108'-3f1 is wider than source/drain structures 150-3f2 attached to the channel structures 108'-3f2.

Processes and materials for forming the semiconductor structure 100f may be similar to, or the same as, those for forming the semiconductor structure 100c described previously and are not repeated herein. For example, processes and materials for forming the channel structures 108'-3f1 and 108'-3f2, fin structures 104-3f1 and 104-3f2, the source/drain structures 105-3f1 and 105-3f2 may be similar to, or the same as, those for forming the channel structures 108'-3, the fin structures 104-3, the source/drain structures 105-3 described previously.

Figure 16:
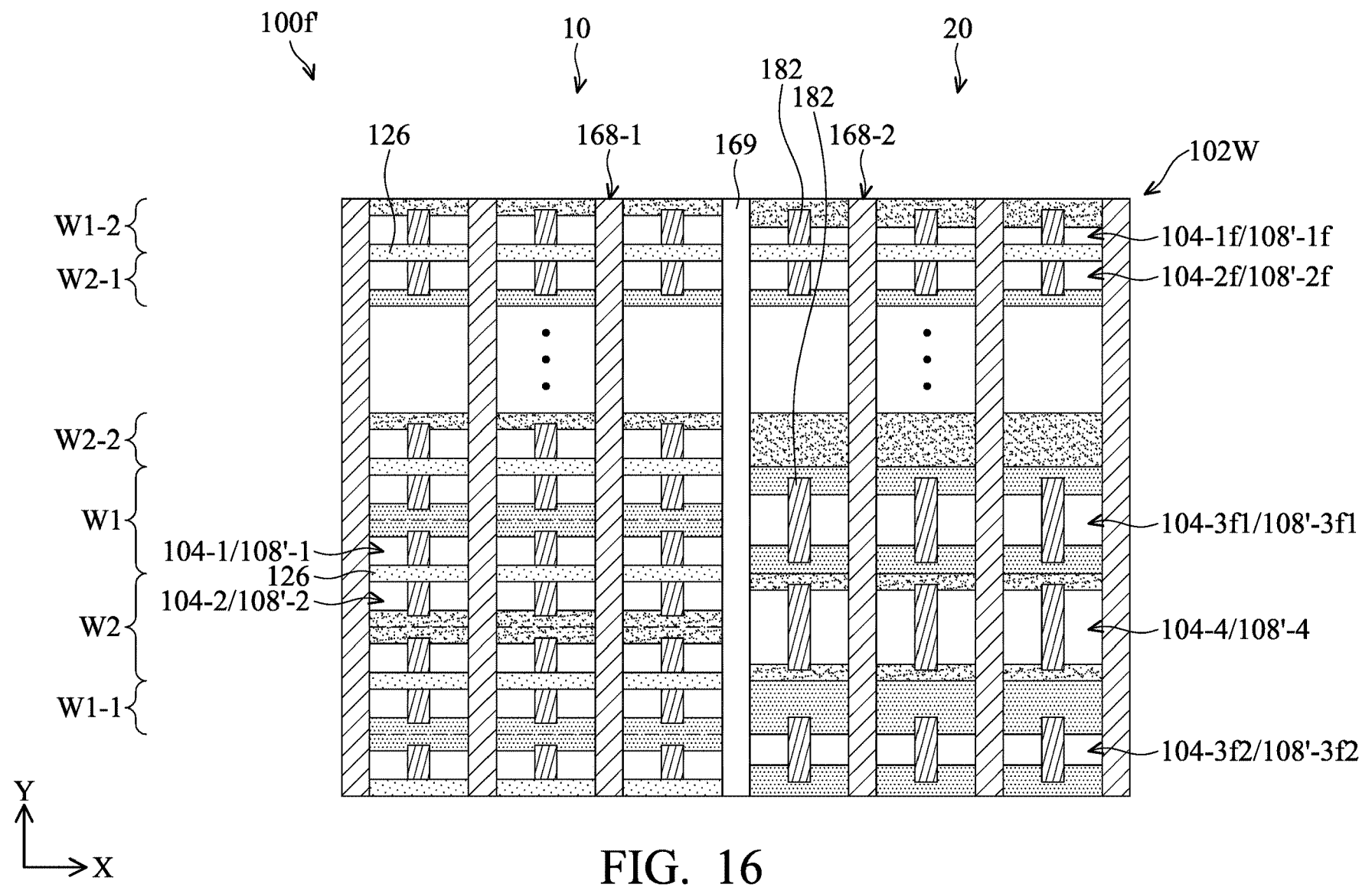

FIG. 16 illustrates a top view of a semiconductor structure 100f' formed over the substrate 102W in accordance with some embodiments. The semiconductor structure 100f' may be similar to the semiconductor structure 100f described previously, except the dielectric structure 169 shown in FIGS. 3C-1, 3C-2, 3C-3, 3C-4, 3C-5, and 3C-6 is formed. Processes and materials for forming the semiconductor structure 100f' may be similar to, or the same as, those for forming the semiconductor structures 100a and 100f described previously and are not repeated herein.

Figure 17:
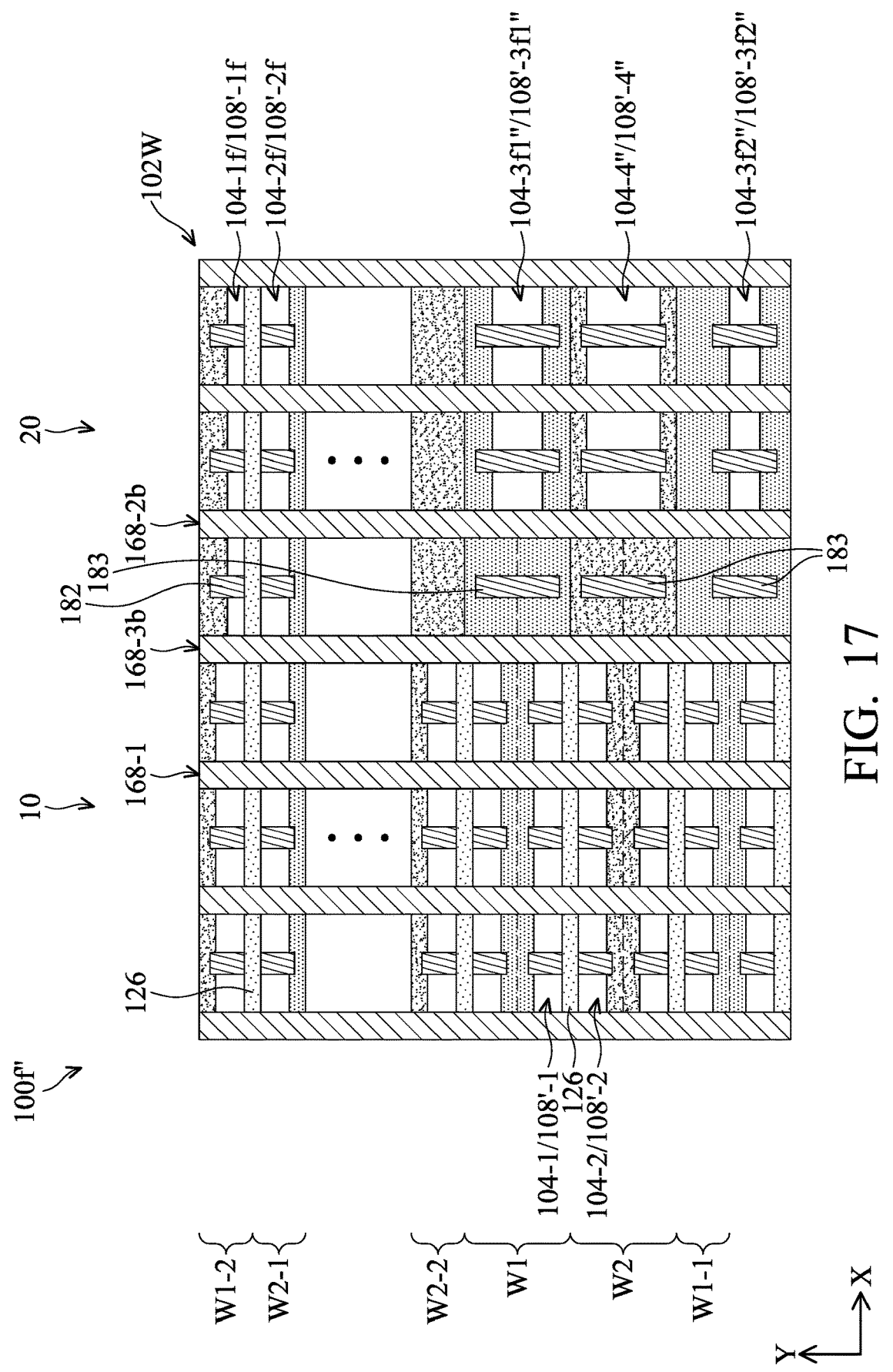
FIG. 17 illustrates a top view of a semiconductor structure formed over the substrate in accordance with some embodiments.

FIG. 17 illustrates a top view of a semiconductor structure 100f" formed over the substrate 102W in accordance with some embodiments. The semiconductor structure 100f" may be similar to the semiconductor structure 100f described previously, except channel structures 108'-3f1", 108'-4", and 108'-3f2", similar to the channel structures 108'-3b and 108'-4b shown in FIGS. 4A to 4F, are laterally spaced apart from the channel structures 108'-1 and 108'-2. Processes and materials for forming the semiconductor structure 100f" may be similar to, or the same as, those for forming the semiconductor structures 100b and 100f described previously and are not repeated herein. For example, processes and materials for forming the channel structures 108'-3f1", 108'-4", and 108'-3f2" may be similar to, or the same as, those for forming the channel structures 108'-3f1, 108'-4, and 108'-3f2 described previously.

As described above, a semiconductor structure may include various transistors with different types of the channel structures. More specifically, the semiconductor structure may include both forksheet structures (e.g. channel structures 108'-1 and 108'-2) and nanosheet structures (e.g. channel structures 108'-3 and 108'-4).

In some embodiments, dielectric wall structures (e.g. the dielectric wall structures 126) may be formed between two active devices (e.g. the transistors T1, T2, T5, and T6) to form forksheet structures, so that the device area may be reduced. However, during the formation of the forksheet structures, the removal of the first semiconductor material layers (e.g. the first semiconductor material layers 106) may become more challenging since one side of the fin structure is attached to the dielectric wall structures (e.g. the processes shown in FIGS. 2K-1 to 2K-4). Therefore, the width of the channel structures may be limited.

On the other hand, nanosheet structures are also formed in the semiconductor structure. Although the distance between the nanosheet structure may need to be greater than the forksheet structures due to device isolation, the channel structures (e.g. the channel structures 108'-3 and 108'-4) of the nanosheet structures may have a greater widths. Therefore, the performance of the device (e.g. the transistors T3 and T4) may be improved.

Since the semiconductor structures (e.g. the semiconductor structures 100, 100a to 100f, 100c' to 100f', 100c" to 100f") described above include both the forksheet structures and the nanosheet structures, the device size and the power consumption may be reduced due to the formation of the forksheet structures and the performance may be improved by having nanosheet structures with greater widths.

In addition, it should be noted that same elements in FIGS. 1A to 17 may be designated by the same numerals and may include materials that are the same or similar and may be formed by processes that are the same or similar; therefore such redundant details are omitted in the interests of brevity. In addition, although FIGS. 1A to 17 are described in relation to the method, it will be appreciated that the structures disclosed in FIGS. 1A to 17 are not limited to the method but may stand alone as structures independent of the method. Similarly, the methods shown in FIGS. 1A to 17 are not limited to the disclosed structures but may stand alone independent of the structures. Furthermore, the channel structures (e.g. the nanostructures) described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in a different order and/or concurrently with other acts or events apart from those illustrated and/or described above. In addition, not all illustrated acts may be required to implement one or more aspects or embodiments of the description above. Furthermore, one or more of the acts depicted above may be carried out as one or more separate acts and/or phases.

Furthermore, the terms "approximately," "substantially," "substantial" and "about" used above account for small variations and may be varied in different technologies and be within the deviation range understood by the skilled in the art. For example, when used in conjunction with an event or circumstance, the terms can refer to instances in which the event or circumstance occurs precisely as well as instances in which the event or circumstance occurs in a close approximation.

Embodiments for forming semiconductor structures may be provided. The semiconductor structures may include first channel structures, second channel structures, and a dielectric wall structure attached to the first channel structures. The first channel structure may be narrower than the second channel structures and may have a smaller device size. On the other hand, the second channel structures may have a greater device size but an improved performance.

In some embodiments, a semiconductor structure is provided. The semiconductor structure includes a first well region formed in a substrate and longitudinally oriented along a first direction and a second well region formed in the substrate and adjoining the first well region in a second direction being substantially orthogonal to the first direction. The semiconductor structure also includes a dielectric wall structure formed over the boundary between the first well region and the second well region and longitudinally oriented along the first direction and first channel structures vertically suspended over a first region of the first well region and laterally attached to a first sidewall surface of the dielectric wall structure. The semiconductor structure also includes a first gate structure wrapping around the first channel structures over the first region of the first well region and longitudinally oriented along the second direction. In addition, the first gate structure partially covers the first sidewall surface of the dielectric wall structure. The semiconductor structure also includes second channel structures vertically suspended over a second region of the first well region and a second gate structure wrapping around the second channel structures over the second region of the first well region and longitudinally oriented along the second direction. In addition, a dimension of the first channel structures in the second direction is smaller than a dimension of the second channel structures in the second direction.

In some embodiments, a semiconductor structure is provided. The semiconductor structure includes first well regions and second well regions formed over a substrate. In addition, the first well regions and the second well regions are alternatively arranged in a Y direction. The semiconductor structure also includes a first dielectric wall structure longitudinally oriented along an X direction and partially overlapping the first well region and the second well region. The semiconductor structure also includes first channel structures, second channel structures, third channel structures, and fourth channel structures sequentially arranged in the Y direction. In addition, the first channel structures and the second channel structures are attached to opposite sides of the first dielectric wall structure. The semiconductor structure also includes a first gate structure abutting the first channel structures, the second channel structures, the third channel structures, the fourth channel structures, and the first dielectric wall structure. In addition, the first channel structures and the third channel structures are formed over the first well regions, the second channel structures and the fourth channel structures are formed over the second well regions, and the third channel structures are wider than the second channel structures in a cross-sectional view along the Y direction.

In some embodiments, a method for manufacturing a semiconductor structure is provided. The method for manufacturing the semiconductor structure includes forming a first well region and a second well region in a substrate and stacking first semiconductor material layers and second semiconductor material layers to form a semiconductor stack over the first well region and the second well region. The method for manufacturing the semiconductor structure also includes patterning the semiconductor stack to form a first fin structure, a second fin structure, a third fin structure, and a fourth fin structure in a first region of the first well region, a first region of the second well region, a second region of the first well region, and a second region of the second well region respectively. In addition, the first fin structure, the second fin structure, the third fin structure, and the fourth fin structure are substantially parallel to each other and are longitudinally oriented along a first direction, and the third fin structure is wider than the first fin structure in a second direction. The second direction is different from the first direction. The method for manufacturing the semiconductor structure also includes forming a dielectric wall structure sandwiched between the first fin structure and the second fin structure and over the boundary between the first well region and the second well region and removing the first semiconductor material layers of the first fin structure and the second fin structure to form first channel structures and second channel structures exposed by a first gate trench. In addition, sidewalls of the dielectric wall structure partially exposed by the first gate trench. The method for manufacturing the semiconductor structure also includes removing the first semiconductor material layers of the third fin structure and the fourth fin structure to form third channel structures and fourth channel structures exposed by a second gate trench and forming a first gate structure in the first gate trench and a second gate structure in a second gate trench. In addition, a distance between the third channel structures and the fourth channel structures is greater than the width of the dielectric wall structure in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first well region in a substrate and longitudinally oriented along a first direction;
a second well region in the substrate and adjoining the first well region in a second direction different than the first direction;
a dielectric wall structure formed over a boundary between the first well region and the second well region and longitudinally oriented along the first direction;
first channel structures vertically suspended over a first region of the first well region and laterally attached to a first sidewall surface of the dielectric wall structure;
a first gate structure wrapping around the first channel structures over the first region of the first well region and longitudinally oriented along the second direction;
second channel structures vertically suspended over a second region of the first well region; and
a second gate structure wrapping around the second channel structures over the second region of the first well region and longitudinally oriented along the second direction,
wherein a dimension of the first channel structures in the second direction is smaller than a dimension of the second channel structures in the second direction.

2. The semiconductor structure as claimed in claim 1, wherein the second channel structures are spaced apart from the boundary between the first well region and the second well region.

3. The semiconductor structure as claimed in claim 1, comprising:
a third gate structure between the first gate structure and the second gate structure and longitudinally oriented along the second direction, wherein the third gate structure is in contact with the first channel structures and the second channel structures.

4. The semiconductor structure as claimed in claim 1, comprising:
a dielectric structure between the first gate structure and the second gate structure and longitudinally oriented along the second direction, wherein a top surface of the dielectric structure is substantially level with a top surface of the first gate structure, and a bottom surface of the dielectric structure is lower than a top surface of the first well region.

5. The semiconductor structure as claimed in claim 1, comprising:
third channel structures attached to a second sidewall surface of the dielectric wall structure over a first region of the second well region,
wherein the first gate structure partially covers the second sidewall surface of the dielectric wall structure.

6. The semiconductor structure as claimed in claim 5, wherein a dimension of the third channel structures in the second direction is different from the dimension of the first channel structures in the second direction.

7. The semiconductor structure as claimed in claim 5, comprising:
fourth channel structures over a second region of the second well region, wherein the fourth channel structures are spaced apart from the boundary between the first well region and the second well region in the second direction.

8. The semiconductor structure as claimed in claim 7, wherein a dimension of the fourth channel structures in the second direction is greater than both the dimension of the first channel structures in the second direction and the dimension of the second channel structures in the second direction.

9. The semiconductor structure as claimed in claim 1, wherein the first channel structures and the second channel structures are spaced apart from each other in the first direction.

10. A semiconductor structure, comprising:
first well regions and second well regions formed over a substrate, wherein the first well regions and the second well regions are arranged in an alternating manner in a first direction;
a first dielectric wall structure longitudinally oriented along a second direction and partially overlapping the first well region and the second well region;
first channel structures, second channel structures, third channel structures, and fourth channel structures sequentially arranged in the first direction, wherein the first channel structures and the second channel structures are attached to opposite sides of the first dielectric wall structure; and
a first gate structure abutting the first channel structures, the second channel structures, the third channel structures, the fourth channel structures, and the first dielectric wall structure,
wherein the first channel structures and the third channel structures are over the first well regions, the second channel structures and the fourth channel structures are over the second well regions, and the third channel structures are wider than the second channel structures in a cross-sectional view along the first direction.

11. The semiconductor structure as claimed in claim 10, wherein the third channel structures are wider than the fourth channel structures in the cross-sectional view along the first direction.

12. The semiconductor structure as claimed in claim 10, comprising:
fifth channel structures formed over the second well regions between the second channel structures and the third channel structures, wherein a width of the fifth channel structures is smaller than half of a width of one of the second well regions.

13. The semiconductor structure as claimed in claim 10, comprising:
a second dielectric wall structure partially overlapping the first well regions and the second well regions; and
fifth channel structures and sixth channel structures attached to opposite sides of the second dielectric wall structure,
wherein the third channel structures and the fifth channel structures are in a same one of the first well regions, and the fourth channel structures and the sixth channel structures are in a same one of the second well regions.

14. The semiconductor structure as claimed in claim 13, comprising:

a second gate structure abutting the fifth channel structures and the sixth channel structures, wherein the second gate structure is substantially parallel to the first gate structure.

15. The semiconductor structure as claimed in claim 14, comprising:

a dielectric structure between the fifth channel structures and the third channel structures, wherein the dielectric structure is substantially parallel to the first gate structure and the second gate structure.

16. A semiconductor structure, comprising:

a first well region;

a second well region;

a first fin structure in a first region of the first well region, the first fin structure comprising first channel structures spaced apart from each other;

a second fin structure in a first region of the second well region, the second fin structure comprising second channel structures spaced apart from each other;

a third fin structure in a second region of the first well region, the third fin structure comprising third channel structures spaced apart from each other;

a fourth fin structure in a second region of the second well region, the fourth fin structure comprising fourth channel structures spaced apart from each other, wherein the first fin structure, the second fin structure, the third fin structure, and the fourth fin structure are substantially parallel to each other and longitudinally oriented along a first direction, and the third fin structure is wider than the first fin structure in a second direction different than the first direction;

a dielectric wall structure between the first fin structure and the second fin structure and over a boundary between the first well region and the second well region;

a first gate structure abutting the first channel structures and the second channel structures; and a second gate structure abutting the third channel structures and the fourth channel structures;

wherein a distance between the third channel structures and the fourth channel structures is greater than a width of the dielectric wall structure in the second direction.

17. The semiconductor structure of claim 16, comprising:

a dielectric structure between the first gate structure and the second gate structure.

18. The semiconductor structure of claim 16, comprising:

first source/drain structures attached to the first channel structures; and third source/drain structures attached to the third channel structures, wherein the third source/drain structures are wider than the first source/drain structures in the second direction.

19. The semiconductor structure of claim 18, comprising:

a first source/drain contact over the first source/drain structures;

a second source/drain contact over the third source/drain structures; and a dummy contact between the first source/drain contact and the second source/drain contact, wherein the dummy contact is electrically isolated from the first channel structures, the second channel structures, the third channel structures, and the fourth channel structures.

20. The semiconductor structure of claim 19, comprising:

an isolation structure adjacent the first well region and having an upper surface below an upper surface of the first well region;

wherein the dummy contact extends from a level of an upper surface of the first source/drain contact to the upper surface of the isolation structure.

* * * * *